(12) United States Patent
Goto et al.

(10) Patent No.: US 8,771,454 B2
(45) Date of Patent: Jul. 8, 2014

(54) POLARIZING FILM, OPTICAL FILM LAMINATE INCLUDING POLARIZING FILM, AND METHOD FOR MANUFACTURING THE SAME

(75) Inventors: Shusaku Goto, Ibaraki (JP); Takeharu Kitagawa, Ibaraki (JP); Minoru Miyatake, Ibaraki (JP); Tomohiro Mori, Ibaraki (JP); Takashi Kamijo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 62 days.

(21) Appl. No.: 13/225,333

(22) Filed: Sep. 2, 2011

(65) Prior Publication Data

US 2012/0058321 A1    Mar. 8, 2012

(30) Foreign Application Priority Data

Sep. 3, 2010   (JP) .................................. 2010-197413
Mar. 23, 2011  (JP) .................................. 2011-064786

(51) Int. Cl.
| B29C 65/00 | (2006.01) |
| B32B 7/02 | (2006.01) |
| B32B 3/00 | (2006.01) |
| B29D 11/00 | (2006.01) |

(52) U.S. Cl.
CPC ............. *B29C 65/00* (2013.01); *B29D 11/00* (2013.01)
USPC ............. 156/229; 264/1.7; 264/2.7; 428/213; 428/336

(58) Field of Classification Search
USPC .............. 156/229; 428/213, 336; 264/1.7, 2.7
IPC ...... B29C 65/00; B32B 7/02,3/00; B29D 11/00
See application file for complete search history.

(56) References Cited

U.S. PATENT DOCUMENTS 4,659,523 A * 4/1987 Rogers et al. ................. 264/1.35
4,895,769 A * 1/1990 Land et al. ..................... 428/483

(Continued)

FOREIGN PATENT DOCUMENTS

| JP | 8-12296 | 2/1996 |
| JP | 10288709 | 10/1998 |

(Continued)

OTHER PUBLICATIONS

Human Translation of JP 10-288709 A, Oct. 1998.*

(Continued)

*Primary Examiner* — Michael Orlando
(74) *Attorney, Agent, or Firm* — Lowe Hauptman & Ham, LLP

(57) ABSTRACT

An optical film laminate includes a substrate including a crystallizable ester type thermoplastic resin in the form of a continuous web; and a polarizing film including a polyvinyl alcohol type resin layer formed on the substrate, said polarizing film including a dichroic material impregnated therein in a molecularly oriented state, wherein the polarizing film is formed by providing a laminate including the polyvinyl alcohol type resin layer formed on a substrate including a crystallizable ester type thermoplastic resin in an amorphous state and subjecting the laminate to a 2-stage stretching process including a preliminary in-air stretching and an in-boric-acid-solution stretching under a temperature maintaining the amorphous state of the substrate, such that the polyvinyl alcohol type resin layer is stretched to a thickness of 10 μm or less, the polarizing film having optical properties based on the formulae $P>-(10^{0.929T-42.4}-1) \times 100$ (where T<42.3) and $P \geq 99.9$ (where T≥42.3).

29 Claims, 26 Drawing Sheets

(56) References Cited

U.S. PATENT DOCUMENTS

| | | | |
|---|---|---|---|
| 2006/0177606 A1 * | 8/2006 | Lo et al. | 428/1.31 |
| 2008/0286455 A1 | 11/2008 | Hamamoto | |
| 2009/0323185 A1 * | 12/2009 | Goto et al. | 359/500 |
| 2010/0053510 A1 | 3/2010 | Bitou et al. | |

FOREIGN PATENT DOCUMENTS

| | | | |
|---|---|---|---|
| JP | 10288709 A * | 10/1998 | |
| JP | 2000338329 A * | 12/2000 | |
| JP | 2001-343521 | 12/2001 | |
| JP | 2001343521 | 12/2001 | |
| JP | 2001343521 A * | 12/2001 | |
| JP | 2003043257 | 2/2003 | |
| JP | 2003043257 A * | 2/2003 | |
| JP | 2004020629 | 1/2004 | |
| JP | 2004020629 A * | 1/2004 | |
| JP | 2005-266325 | 9/2005 | |
| JP | 2005266325 A * | 9/2005 | |
| JP | 2007226035 | 9/2007 | |
| JP | 4279944 | 6/2009 | |
| JP | 2010091815 | 4/2010 | |
| KR | 20090091743 | 8/2009 | |
| WO | 2011/125958 | 10/2011 | |

OTHER PUBLICATIONS

Partial European Search Report for 11180035 dated Nov. 17, 2011.
H.W. Siesler; Rheo-Optical Fourier-Transform Infared Spectroscopy; Advanced Polymeric Science; 1984; pp. 9-15.
Korean Office Action for 10-2011-0088861 dated Oct. 25, 2012.
European Office Action for 11 180 035.5 dated Oct. 24, 2012.

* cited by examiner

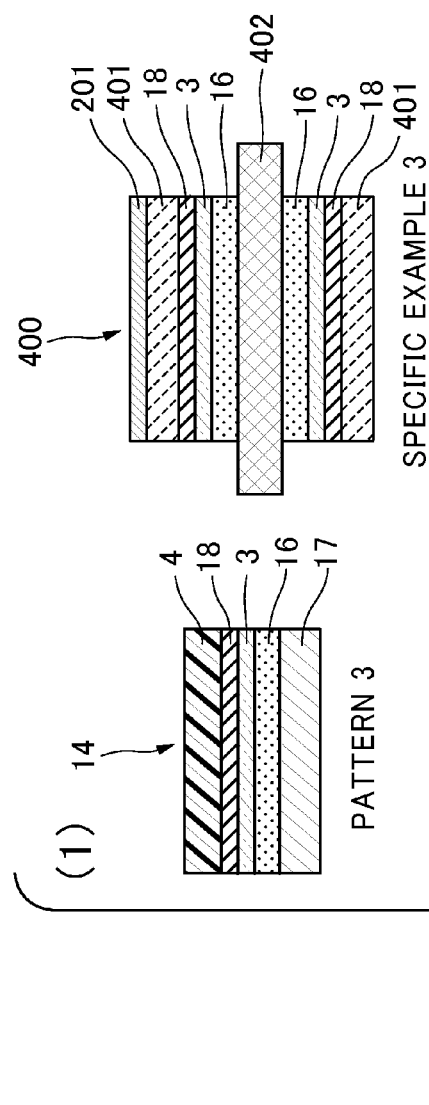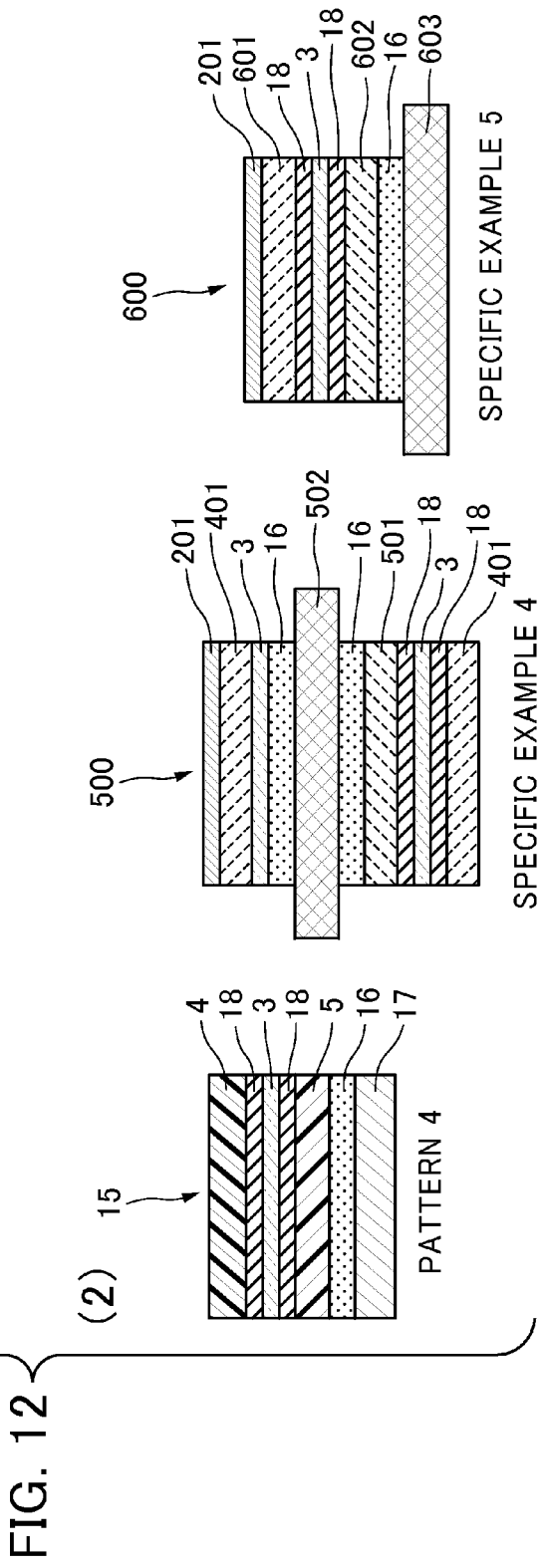
FIG. 12

POLARIZING PROPERTY OF POLARIZING FILM

FIG. 26

| EXAMPLE NO. | VARIATION | THERMOPLASTIC RESIN SUBSTRATE | THICKNESS OF PVA (μm) | IN-AIR STRETCHING TEMPERATURE (°C) | IN-AIR STRETCHING RATIO | METHOD | WIDTH AFTER/BEFORE STRETCHING (%) | THICKNESS OF PVA (μm) | FIRST INSOLUBILIZATION | IODIDE CONCENTRATION IN DYEING PROCESS (wt%) | SECOND INSOLUBILIZATION | IN-BORIC ACID SOLUTION STRETCHING TEMPERATURE (°C) | IN-BORIC ACID SOLUTION STRETCHING RATIO | TOTAL STRETCHING RATIO | THICKNESS OF POLARIZER (μm) |
|---|---|---|---|---|---|---|---|---|---|---|---|---|---|---|---|
| 1 | INSOLUBILIZATION PROCESS | A-PET | 7 | 115 | 1.8 | END-FREE | 65 | 5 | W/O | 0.3 | W/O | 65 | 3.3 | 5.94 | 3 |
| 2 | | A-PET | 7 | 115 | 1.8 | END-FREE | 65 | 5 | W/O | 0.3 | WITH | 75 | 3.3 | 5.94 | 3 |
| 3 | REFERENCE | A-PET | 7 | 115 | 1.8 | END-FREE | 65 | 5 | WITH | 0.12-0.25 | W/O | 65 | 3.3 | 5.94 | 3 |
| 4 | | A-PET | 7 | 115 | 1.8 | END-FREE | 65 | 5 | WITH | 0.12-0.25 | WITH | 75 | 3.3 | 5.94 | 3 |
| 5 | THICKNESS | A-PET | 12 | 115 | 1.8 | END-FREE | 65 | 9 | WITH | 0.12-0.25 | WITH | 75 | 3.3 | 5.94 | 5 |
| 6 | ELEVATED TEMPERATURE IN-AIR STRETCHING RATIO | A-PET | 7 | 115 | 1.5 | END-FREE | 75 | 6 | WITH | 0.12-0.25 | WITH | 75 | 4.0 | 6.0 | 3 |
| 7 | | A-PET | 7 | 115 | 2.5 | END-FREE | 55 | 4 | WITH | 0.12-0.25 | WITH | 75 | 2.4 | 6.0 | 3 |
| 8 | ELEVATED TEMPERATURE IN-AIR STRETCHING TEMPERATURE | A-PET | 7 | 95 | 1.8 | END-FREE | 75 | 5 | WITH | 0.12-0.25 | WITH | 75 | 3.3 | 5.94 | 3 |
| 9 | | A-PET | 7 | 105 | 1.8 | END-FREE | 70 | 5 | WITH | 0.12-0.25 | WITH | 75 | 3.3 | 5.94 | 3 |
| 10 | TOTAL STRETCHING RATIO | A-PET | 7 | 115 | 1.8 | END-FREE | 65 | 5 | WITH | 0.12-0.25 | WITH | 75 | 2.8 | 5.04 | 3 |
| 11 | | A-PET | 7 | 115 | 1.8 | END-FREE | 65 | 5 | WITH | 0.12-0.25 | WITH | 75 | 3.1 | 5.58 | 3 |
| 12 | | A-PET | 7 | 115 | 1.8 | END-FREE | 65 | 5 | WITH | 0.12-0.25 | WITH | 75 | 3.6 | 6.48 | 3 |
| 13 | END-FIXED ELEVATED TEMPERATURE IN-AIR STRETCHING RATIO | A-PET | 7 | 115 | 1.8 | END-FIXED | 100 | 4 | WITH | 0.12-0.25 | WITH | 75 | 3.3 | 5.94 | 2 |
| 14 | | A-PET | 7 | 115 | 1.8 | END-FIXED | 100 | 4 | WITH | 0.12-0.25 | WITH | 75 | 3.9 | 7.02 | 2 |
| 15 | | A-PET | 7 | 115 | 1.8 | END-FIXED | 100 | 4 | WITH | 0.12-0.25 | WITH | 75 | 4.4 | 7.92 | 2 |

POLARIZING FILM, OPTICAL FILM LAMINATE INCLUDING POLARIZING FILM, AND METHOD FOR MANUFACTURING THE SAME

CROSS REFERENCE TO RELATED APPLICATION

This application claims the priority of Japanese Patent Application No. 2010-197413 filed on Sep. 3, 2010, and Japanese Patent Application No. 2011-064786 filed on Mar. 23, 2011 in the JPO (Japan Patent Office), the disclosure of which is incorporated herein in their entirety by reference.

TECHNICAL FIELD

The present invention relates to a polarizing film, an optical film laminate including a polarizing film, and a method for manufacturing the same. More specifically, the present invention relates to an optical film laminate including a polarizing film having a thickness of 10 μm or less and comprising a polyvinyl alcohol type resin having a dichroic material impregnated therein in a molecularly oriented state, and a method for manufacturing such optical film laminate.

BACKGROUND ART

A well-known method for manufacturing a polarizing film or a so-called polarizer (hereinafter, referred as "a polarizing film") comprises steps of subjecting a film of polyvinyl alcohol resin type material (hereinafter, referred as "PVA type resin") to dyeing and stretching processes to thereby provide a stretched film having a dichroic material impregnated therein with a molecularly oriented state.

However, it is not possible to manufacture a polarizing film having a thickness of 10 μm or less through a conventional method using a general mono-layer of PVA type resin. The reason for such difficulty is that the thickness of the mono-layer resin used in the method has to be 30 μm or less. As described later, PVA type resin is hydrophilic. The single resin layer comprised of a PVA type resin having a thickness of 30 μm or less is difficult to be processed through the dyeing and/or stretching process without being subjected to any risk of the layer being partially dissolved or broken. Specifically, there remains an unsolved technical problem of manufacturing a polarizing film having, for example, a thickness of 10 μm or less and having a uniform thickness and stable optical property.

Thus, a method for producing a polarizing film using a thermoplastic resin substrate has been proposed as shown by a schematic diagram in FIG. 24. The method for manufacturing a polarizing film using a thermoplastic resin substrate is noticeable in that it allows for making the film thinner, and thus allows for more uniform thin film compared with the method for manufacturing the polarizing film using a mono-layer PVA type resin. Nevertheless, the polarizing film having a thickness of 10 μm or less has not been in practical use. Specific examples hithertofore proposed will be described later In the case of a polarizing film which is to be adhesively attached to each of the opposite surfaces of a liquid-crystal cell for use in a liquid-crystal display apparatus, according to the method for manufacturing a polarizing film with a mono-layer of the PVA type resin as disclosed in Japanese Patent Application Publication JP2005-266325A (the Patent Document 1), the polarizing film is manufactured, for example, by transporting a PVA type resin mono-layer of a thickness of 60 to 80 μm through a transporting apparatus comprising a plurality sets of rolls driven at different peripheral speeds, and immersing the PVA type resin mono-layer in a dyeing solution to have a dichroic material impregnated therein, while stretching the mono-layer comprising the PVA type resin in the dichroic material solution at around 60° C. This is the polarizing film manufactured from a mono-layer having a thickness of 20 to 30 μm. Presently, the polarizing film manufactured using the method has optical properties of a single layer transmittance of 42% or higher and a polarization rate of 99.95% or higher, and is used for a large-sized screen television.

However, since the PVA type resin is hydrophilic, a polarizing film is sensitive to change of temperature and humidity and is apt to produce changes in dimensions such as expansion or shrinkage due to changes in environmental conditions possibly resulting in cracks. In order to suppress expansion and shrinkage and to minimize effects of temperature and/or humidity, it has been a usual practice in a polarizing film for use with a television to provide a film of triacetylcellulose (TAC) having a thickness of 40 to 80 μm laminated on each of the opposite surfaces of the polarizing film as a protection film.

It should however be noted that, in the case of a mono-layer polarizing film, since there is a certain limit in reducing the thickness of the polarizing film, it is still difficult to completely restrict the expansion or shrinkage, so that, when an optical film laminate including such polarizing film is adhesively attached to a component such as an adjacent optical film or a liquid-crystal cell through a layer of a bonding or adhesive agent, a stress is induced in such component by the expansion or shrinkage of the polarizing film. Such stress may cause a distortion in the displayed image in a liquid-crystal display apparatus. Since the image distortion is caused by an optical elasticity or deformation of the component induced by a stress produced under the shrinkage in the polarizing film, the material to be used for such component must be limited to be of a low optical elasticity and/or of low birefringent property in order to reduce the image distortion. In addition, since the stress produced under the shrinkage of the polarizing film may possibly cause the optical film laminate to be detached from the liquid-crystal cell, it is required to use an adhesive agent of a higher adhesive power. However, using such adhesive agent of high adhesive power makes re-working operation difficult. The above is the technical problem inherent to a use of a mono-layer polarizing film.

Under such circumstances, there is a need for a manufacture of polarizing films, which can be used in place of the method using a mono-layer polarizing film in which difficulties have been encountered in an effort for producing polarizing films of a decreased thickness. However, if a PVA type resin mono-layer film having a thickness smaller than 50 μm is passed through a transporting apparatus including a plurality sets of rolls driven at different peripheral speeds and stretched in a dye solution around a temperature of 60° C. to produce a polarizing film having a thickness of 10 μm or less, the PVA type resin mono-layer comprised of a hydrophilic polymer composition may be at least partially dissolved in the solution as the thickness is decreased by stretching, or may be broken because of being unable to withstand the stretching stress.

Because of such problems, the methods disclosed in the Patent Documents 2 to 5 have been proposed as new manufacturing methods of polarizing films. In those methods, a polarizing film is manufactured by forming a layer of a PVA type resin on a thermoplastic resin substrate of a certain thickness and stretching thus formed PVA type resin layer together with the thermoplastic resin substrate. Specifically, the methods correspond to reference test samples 1, 2 or 3. Describing in more detail, the method corresponding to the reference test samples 1 or 2 includes steps of providing a laminate comprising a thermoplastic resin substrate and a PVA type resin layer and subjecting the laminate to stretching in air typically at a stretching temperature of 60 to 110° C. using, for example, a stretching apparatus arranged in an oven. Then, the PVA type resin layer having molecular orientation produced through the stretching is subjected to a dyeing process to have a dichroic material impregnated therein. According to the method corresponding to the reference test sample 3, the PVA type resin layer in the laminate comprising the thermoplastic resin substrate and the PVA type resin layer is first dyed to have a dichroic material impregnated therein. Then, the laminate comprising the PVA type resin layer having the dichroic material impregnated therein is stretched in air typically at a stretching temperature of 60 to 110° C. The above process is the method of manufacturing the polarizing film having the dichroic material in a molecularly oriented state as disclosed in the Patent Documents 2 to 5. These are the methods which have hitherto been proposed for manufacturing a polarizing film using a thermoplastic resin substrate. FIG. 25 shows results of verifying test performed by the inventors for determining optical properties accomplished in the polarizing film disclosed in the Patent Document 2 to 5.

The polarizing film produced by the aforementioned manufacturing process is promising from viewpoint of reducing the thickness of a large size display element, eliminating distortions in displayed images and reducing industrial waste. However, up to now, the polarizing film manufactured by the aforementioned process has not been practically used. The reason for this is considered as that the polarizing film has a lower degree of optical properties in terms of the polarizing property, as shown in FIG. 25 illustrating the optical properties of the reference test samples 1 to 3, and thus, there is still unsolved technical problem in an effort for producing a polarizing film with a sufficiently high optical property.

The prior art documents referred to in the above and following descriptions are listed below.

Patent Document 1: Japanese Laid-Open Patent Publication JP2005-266325A
Patent Document 2: Japanese Patent 4279944B
Patent Document 3: Japanese Laid-Open Patent Publication JP2001-343521A
Patent Document 4: Japanese Patent Publication JP8-12296B
Patent Document 5: U.S. Pat. No. 4,659,523
Non-Patent Document 1: H, W. Siesler, Adv. Polym. Sci., 65, 1 (1984)

DISCLOSURE OF THE INVENTION

Problem to be Solved by the Invention

The process of steadily manufacturing polarizing film using a thermoplastic resin substrate has been discussed with reference to the Patent Documents 2 to 5. It should however be noted that in these methods, it has not as yet been possible to obtain polarizing films having a uniform thickness of 10 µm or less, for example, and meeting requirements for optical properties of contrast ratio of 1000:1 or more and maximum luminance of 500 cd/m$^2$ or more which are required for display elements of liquid-crystal display televisions.

This technical problem is simple and because of such simplicity it is not easy to solve as will be described in the followings. According to anyone of the proposed conventional manufacturing methods, stretching of a laminate comprising a thermoplastic resin substrate and a PVA type resin layer formed thereon has been carried out in an environment of high-temperature air. A primary reason for such stretching in air under a high temperature environment is that the thermoplastic resin substrate and the PVA type resin layer formed thereon cannot be stretched at a temperature below respective glass transition temperatures (Tg). For reference, the Tg of PVA type resin is 75 to 80° C. The Tg of polyethylene terephthalate (PET) which is an ester type thermoplastic resin is 80° C.

Thus, a laminate comprising a thermoplastic resin substrate and a PVA type resin layer has to be stretched under an elevated temperature higher than those glass transition temperatures. As a matter of fact, the molecular orientation of a PVA type resin is enhanced by stretching. Polarizing property of a polarizing film comprising a PVA type resin depends on the molecular orientation of the PVA type resin having a dichroic material such as iodine impregnated therein. The polarizing property of the polarizing film comprising the PVA type resin is improved with increase in the molecular orientation of the PVA type resin.

However, a crystallizable resin, regardless whether it is an olefin or an ester, has generally a tendency of its molecules being oriented with an increase in temperature and with a stretching, resulting in an enhanced crystallization. Such crystallization causes various changes in physical properties of a resin. A typical example is that the resin actually becomes unstretchable due to crystallization. For example, in the case of a crystallizable resin, even in the case of an amorphous PET, crystallization rate abruptly increases at 120° C. and it becomes unstretchable at 130° C. General material properties of thermoplastic resins are described later.

The present invention aims at providing an optical film laminate including a polarizing film having superior optical properties having a thickness of 10 µm or less and comprises polyvinyl alcohol type resin having a dichroic material impregnated therein in a molecularly oriented state, and a method for manufacturing the same.

Means for Solving the Problem

The inventors of the present invention have made extensive efforts in obtaining a polarizing film of a reduced thickness and improving optical properties of such polarizing film. As the results, the inventors have been successful in obtaining an optical film laminate including a polarizing film having a thickness of 10 µm or less and comprising a PVA type resin having a dichroic material impregnated therein, and a method for manufacturing the same. A thin polarizing film can be produced by stretching a crystallizable ester type thermoplastic resin substrate together with a PVA type resin type layer formed thereon.

According to researches and analysis by the inventors, it is not possible to find any case where a crystallizable PET is used as a thermoplastic resin substrate, and a laminate comprising a PVA type resin layer formed on the crystallizable PET substrate is stretched in end-free uniaxial stretching and a stretching ratio of 5.0 or more. The present inventors have challenged the above process to realize the present invention.

Reference is now to be made to FIG. 18. FIG. 18 is a schematic diagram, based on experiments, showing the relationship between a stretching temperature and a realizable stretching ratio for each of a crystallizable PET and a PVA type resin. The solid line in FIG. 18 shows changes in the practically realizable stretching ratio of a crystallizable PET in accordance with changes in the stretching temperature. The glass-transition temperature (Tg) of the crystallizable PET is 80° C. in this instance and it cannot be stretched at a temperature below the Tg. FIG. 19 is a schematic diagram showing changes in the crystallization rate of crystallizable PET in accordance with changes in the stretching temperature in the temperature range between the glass-transition temperature (Tg) and melting point (Tm) of the PET. It is understood from FIG. 19 that the crystallizable PET in amorphous state at 80 to 120° C. rapidly crystallizes at around 120° C. As is clear from FIG. 18, the realizable stretching ratio of the crystallizable PET in end-free uniaxial in-air stretching is limited to 5.5, and the applicable stretching temperature is limited to a temperature range of 80 to 120° C. where the crystallizable PET is in the amorphous state.

Reference test samples 1 to 3 are experimental examples of products obtained by the end-free uniaxial in-air stretching. Each of the reference test samples 1 to 3 comprises a polarizing film having a thickness of 3.3 μm, formed by subjecting a laminate comprising a 7 μm-thick PVA layer formed on a 200 μm-thick crystallizable PET substrate to an end-free uniaxial in-air stretching. Stretching temperature has been changed in the reference test samples such that the reference test sample 1 is 110° C., the reference test sample 2 is 100° C. and the reference test sample 3 is 90° C. It should be noted that the limit of realizable stretching ratio of the reference test sample 1 is 4.0, and those for the reference test samples 2 and 3 are both 4.5. Stretching beyond those realizable stretching ratios was not possible because the laminate itself was finally broken. It should however be noted that, in the above results, it is not possible to deny that the restriction has partly been influenced by the realizable stretching ratio of the PVA type resin layer formed on the crystallizable PET.

Reference is now made to the broken line in FIG. 18. This diagram shows the realizable stretching ratio of a PVA type resin. The glass-transition temperature (Tg) of a PVA type resin is 75 to 80° C. and a mono-layer of a PVA type resin cannot be stretched at a temperature below this temperature. As is clear from FIG. 18, the realizable stretching ratio of the mono-layer of a PVA type resin in the end-free uniaxial in-air stretching is limited to 5.0. Thus, the present inventors have arrived at a conclusion that, from the relationship between the stretching temperature and the realizable stretching ratio of each of a crystallizable PET and a PVA type resin, the realizable stretching ratio under the end-free uniaxial in-air stretching of the laminate comprising a PVA type resin layer formed on a crystallizable PET is limited to 4.0 to 5.0 at a stretching temperature in the range of 90 to 110° C.

In respective ones of the reference test samples 1 to 3, a dyed laminate has been produced by stretching the laminate at a stretching ratio of 4.0 to 4.5 to have a thin PVA type resin layer having molecularly oriented PVA type resin with iodine impregnated therein. Specifically, the stretched laminate was immersed in a dyeing solution containing iodine and potassium iodide at a temperature of 30° C. for an appropriate time period to have iodine impregnated in the PVA type resin layer in the stretched laminate, such that the single layer transmittance of the PVA type resin layer finally constituting the polarizing film becomes 40 to 44%. In addition, by adjusting the amount of iodine impregnated in the thin PVA type resin layer, various polarizing films have been produced with different single layer transmittance and polarization rate. FIG. 25 shows optical properties of the reference test samples 1 to 3. PVA type resin molecules in the PVA type resin layer formed on the crystallizable PET substrate are oriented to a certain degree by the in-air stretching. On the other hand, it is presumed that the in-air stretching may facilitate crystallization of the PVA type resin molecules preventing orientation of non-crystallized portion of molecules.

In view of such observations, the present inventors have developed, prior to the present invention, a polarizing film shown in the comparative test sample and the method for manufacturing the same. The development is based on a surprising finding of plasticizing function of water wherein a laminate comprising a PVA type resin layer formed on a PET substrate can be stretched even under a stretching temperature below the glass-transition temperature (Tg). According to the method, it was confirmed that a laminate comprising a PVA type resin layer formed on a PET substrate might be stretched to a stretching ratio of 5.0. It is presumed that the limit of the stretching ratio of 5.0 is caused by the restriction due to the property of the PET substrate. This is the one corresponding to the Example 1 disclosed in the assignee's application PCT/JP2010/001460.

Reference is now made to FIG. 20 which is a diagram simply showing the relationship between the stretching ratio obtained by an in-air stretching, and a total stretching ratio which has been created based on the research results of the present inventors. The horizontal axis of the diagram designates the stretching ratio obtained by the end-free uniaxial in-air stretching at a stretching temperature of 110° C. The vertical axis of the diagram designates the total stretching ratio obtained by a 2-stage stretching including the end-free uniaxial in-air stretching, the total stretching ratio having been calculated based on the original length before the in-air stretching which has been taken as one, and being equivalent to the ratio of magnification of the final length with respect to the original length. For example, in the case where the stretching ratio under the end-free uniaxial in-air stretching at a stretching temperature of 110° C. is 2.0 and stretching ratio under the second stage stretching is 3.0, the resultant total stretching ratio will be 2.0×3.0=6.0. The second stage stretching after the in-air stretching may be carried out as an end-free uniaxial stretching in boric acid solution at a stretching temperature of 65° C.

Stretching a laminate immersed in a boric acid solution is hereinafter referred as "in-boric-acid-solution stretching". The total stretching ratio is a value representing a product of the stretching ratio obtained by the in-air stretching and the stretching ratio obtained by the in-boric acid solution. The total stretching ratio is hereinafter referred as "a total stretching ratio".

The inventors have obtained the result as shown in FIG. 20 by the combination of the 2 types of stretching.

The solid line in FIG. 20 shows a realizable stretching ratio using a crystallizable PET. The total stretching ratio of the crystallizable PET is limited to 5.0 when the crystallizable PET is directly stretched by the in-boric acid solution stretching without the in-air stretching (i.e. when the in-air stretching ratio is 1.0). It indicates that the crystallizable PET will break if stretched beyond this value, but the ratio is merely the minimum stretching ratio of the crystallizable PET, and the diagram shows that the larger the stretching ratio of the preliminary in-air stretching, the larger the total stretching ratio of the crystallizable PET, and the realizable stretching ratio may be beyond 10.0.

On the other hand, the broken line in FIG. 20 shows the realizable stretching ratio in PVA. The stretching ratio of the PVA type resin is at the maximum 7.0 when the PVA type resin is directly stretched by the in-boric-acid-solution stretching without the in-air stretching (i.e. when the in-air stretching ratio is 1.0). However, the larger the stretching ratio of in-air stretching, the smaller the total stretching ratio of the PVA type resin. As will be understood from FIG. 20, the total stretching ratio of the PVA type resin may fall below 6.0 when the stretching ratio obtained by a preliminary in-air stretching is 3.0. The PVA type resin will break if it is attempted to increase the total stretching ratio of the PVA type resin up to 6.0. In the case of a laminate comprising a PVA type resin layer formed on a crystallizable PET substrate, the reason for the limitation on the attainable stretching ratio in the laminate is dependent on the amount of the stretching ratio under the preliminary in-air stretching, in such a way that the stretching ratio is restricted due to the limit on the crystallizable PET substrate in a range wherein the stretching ratio under the preliminary in-air stretching is low whereas the stretching ratio is restricted due to the limit on the PVA type resin layer in a range wherein the preliminary in-air stretching is high.

Reference is now made to the diagram in FIG. 21. FIG. 21 is a schematic diagram showing the relationship between the stretching temperature in the in-air stretching and the total stretching ratio obtainable by carrying out both the in-air stretching and the in-boric acid solution stretching, for a crystallizable PET and a PVA type resin, the relationship being determined based on experiments. The horizontal axis shows the temperature when the preliminary in-air stretching is carried out to attain the stretching ratio of 2.0. The vertical axis shows the realizable total stretching ratio obtained by applying a further stretching in the in-boric acid solution having a temperature of 65° C. to the laminate including the crystallizable PET which has been subjected to the preliminary in-air stretching to attain the stretching ratio of 2.0 and the PVA type resin layer formed thereon.

It is noted that there is a difference between the realizable stretching ratio of the crystallizable PET shown in the schematic diagram of FIG. 18 and that shown in the schematic diagram of FIG. 21. The realizable stretching ratio of the crystallizable PET obtained by the in-air stretching alone has a peak value of 5.5 at the temperature of 100° C., and the ratio of about 3.5 is realizable even at 120° C. On the other hand, the crystallizable PET subjected to the preliminary in-air stretching under the elevated temperature environment to attain the stretching ratio of 2.0 has a peak value at a temperature of 100 to 110° C., when the in-boric acid stretching is combined with the preliminary stretching. The realizable stretching ratio is 8.5. This indicates that the realizable stretching ratio of the in-boric acid stretching is 4.0 (i.e, 2.0×4.0=8.0) or more. In addition, it is noted that the crystallizable PET which has been preliminarily subjected to the stretching to attain the stretching ratio of 2.0 is no longer stretchable at 120° C. due to an promoted crystallization in the boric-acid solution, and the same crystallizable PET cannot be stretched under the stretching temperature of 65° C.

As will be described later, the present invention has been created by combining 2 stretching processes, the in-air stretching and the in-boric-acid-solution stretching, which is not merely a combination of 2 stretching processes, but it is to be noted that the invention could be accomplished based on the surprising findings that the following two technical problems could be simultaneously solved by the combination.

There exist two technical problems that have conventionally been considered impossible to solve. The first technical problem is that the stretching ratio and the stretching temperature which are governing factors for improving molecular orientation of a PVA type resin are largely restricted by the thermoplastic resin substrate having a PVA type resin layer formed thereon. The second technical problem is that, even if the restriction for the stretching ratio and the stretching temperature are cleared, crystallization and stretchability of a crystallizable resin such as a PVA type resin and a PET are physical properties which are not compatible with each other, so that the amount of stretching of the PVA type resin can be restricted by its crystallization.

The first technical problem will further be discussed in the followings. In manufacturing a polarizing film using a thermoplastic resin substrate, there is a restriction induced by the properties of the PVA type resin in that the stretching temperature should be above the glass-transition temperature (Tg) of the PVA type resin (75 to 80° C.) and the realizable stretching ratio is limited to be 4.5 to 5.0. If a crystallizable PET is used as the thermoplastic resin substrate, the stretching temperature is further restricted to 80 to 120° C. It has been considered that a polarizing film, produced through the in-air stretching of the aforementioned type laminate for thinning down the PVA type resin layer formed on a crystallizable PET included in the laminate, cannot be free from such restriction.

To address this, the present inventors have previously proposed an in-boric-acid-solution stretching process that can take place of the in-air stretching, and that is based on finding of a plasticizing function of water. It should however be noted that, even with the in-boric-acid solution stretching at a stretching temperature of 60 to 85° C., it has been difficult to overcome the restrictions induced by a crystallizable PET of which realizable stretching ratio is 5.0. Thus, the first technical problem is that, improvement of orientation of PVA type resin molecules is restricted as above which in turn restricts optical properties of a thin polarizing film.

The solution to the first technical problem can be explained with reference to schematic diagrams shown in FIG. 22. There are shown two diagrams in FIG. 22, wherein one shows molecular orientation of the crystallizable PET used as the thermoplastic resin substrate and the other shows the extent of crystallization of the PET. The horizontal axis in each of the diagrams represents the total stretching ratio attained through the in-air stretching and in-boric-acid-solution stretching. The broken lines in FIG. 22 show the stretching ratio which can be realized through the in-boric-acid-solution stretching alone. The molecular orientation of the cystallizable PET becomes maximum at around the stretching ratio of 4.0. The extent of crystallization abruptly increases at the total stretching ratio of between 4.0 and 5.0.

Thus, it has been noted that the stretching ratio of the in-boric-acid-solution stretching is limited to 5.0. At this point, the molecular orientation reaches the upper limit and the required tension for the stretching abruptly increases. On the other hand, the solid lines in FIG. 22 show the results of the 2-stage stretching wherein PET is subjected to an end-free uniaxial preliminary in-air stretching to attain a stretching ratio of 2.0 at a stretching temperature of 110° C., and then subjected to an in-boric-acid-solution stretching at a stretching temperature of 65° C. The extent of crystallization of the crystallizable PET did not show any abrupt increase, as opposed to the results obtained with the in-boric-acid-solution stretching alone. As the result, the total realizable stretching ratio has been improved up to 7.0 where the orientation reached the upper limit and the required tension for stretching has abruptly increased. As is clear from FIG. 21, this result owes to adopting the end-free uniaxial in-air stretching for the first stage stretching. When an end-fixed uniaxial in-air stretching is adopted as described later, the realizable total stretching ratio can be increased to 8.5.

By solving the first technical problem, it has become possible to eliminate restrictions in the stretching ratio which has been experienced due to the property of the crystallizable PET substrate, and to improve molecular orientation of the PVA type resin by increasing the total stretching ratio. Thus, the optical properties of the polarizing film can be significantly improved. It should further be noted that the improvement of the optical properties had been more than those described above. Further improvements have been accomplished by solving the second technical problem.

The second technical problem can be described as follows. One of the characteristic features of PVA type resins and crystallizable resins such as a PET is that, in these resins, molecules tend to be oriented by heating and stretching resulting in a progress of crystallization. Stretching of a PVA type resin is limited by crystallization of the resin that is crystallizable in nature. Crystallization and stretchability are two opposing physical properties, and it has been considered that progress of crystallization in a PVA type resin tends to prevent its molecules from being orientated. It is possible to describe a manner of solving the second technical problem with reference to FIG. 23. The solid line and the broken line in FIG. 23 show the relationship between the extent of crystallization and the orientation function of a PVA type resin calculated based on the results of two experiments.

The solid line in FIG. 23 shows the relationship between the extent of crystallization and the orientation function of the PVA type resin in samples prepared as follows. Five samples were prepared by forming laminates provided under the same condition, each laminate comprising a PVA type resin layer formed on a crystallizable PET substrate. Stretched laminates each comprising a PVA type resin layer were produced by subjecting thus prepared five laminates each comprising a PVA type layer to an in-air stretching at the same stretching ratio of 1.8, with different stretching temperatures of 80° C., 95° C., 105° C., 110° C. and 115° C., respectively. Then, measurements have been made on respective ones of the PVA type resin layers in the stretched laminates to determine and analyze the extent of crystallization and the orientation function. Details of the measuring and analyzing processes will be described later.

The broken line in FIG. 23 shows, as the solid line does, the relationship between the extent of crystallization and the orientation function of each of the PVA type resin layers in samples prepared as follows. Five samples were prepared by forming laminates provided under the same condition, each laminate comprising a PVA type resin layer formed on a crystallizable PET substrate. Stretched laminates each comprising a PVA type resin layer were produced by subjecting thus prepared five laminates each comprising a PVA type layer to an in-air stretching at the same stretching temperature of 110° C. with different stretching ratio of 1.5, 1.8, 2.0, 2.2 and 2.5, respectively. Then, measurements have been made on respective ones of the PVA type resin layers in the stretched laminates to determine and analyze the extent of crystallization and the orientation function with processes which will be described later.

With the solid line in FIG. 23, it has been confirmed that the molecular orientation of the PVA type resin is improved with increase of the stretching temperature in the in-air stretching of the PVA type resin layer included in the stretched laminate. In addition, with the broken line in FIG. 23, it has been confirmed that the molecular orientation of the PVA type resin is improved with increase of the stretching ratio under the in-air stretching of the PVA type resin layer included in the stretched laminate. Improving the molecular orientation or enhancing the extent of crystallization of the PVA type resin before the second stage in-boric acid solution stretching is effective to improve the resulting molecular orientation of the PVA type resin after the in-boric acid solution stretching. Further, it can be noticed in the T-P diagrams for the later described examples that, as the result of the improvement of the molecular orientation of the PVA type resin, it is also possible to improve the molecular orientation of poly-iodide ion.

The inventors could obtain an unexpected, remarkable results that, by increasing the stretching temperature or the stretching ratio during the first stage in-air stretching, the orientation of PVA type resin molecules in the PVA type resin layer produced after the second stage in-boric acid solution stretching could be further enhanced.

It has been confirmed that the first technical problem can solved by the preliminary or auxiliary stretching of the laminate comprising a PVA type resin layer formed on the crystallizable PET substrate with the first stage in-air stretching, which allows for stretching the PVA type resin layer with a higher stretching ratio to thereby provide sufficient improvement of molecular orientation of PVA without encountering any restriction on the stretching ratio of a crystallizable PET substrate during the second stage in-boric-acid-solution stretching.

It is to be further noted that the solution to the second technical problem provided unexpected result that by adopting a higher stretching temperature for the preliminary or auxiliary stretching of the laminate comprising the PVA type resin layer during the first stage in-air stretching, or by attaining a higher stretching ratio during the preliminary or auxiliary stretching, it is possible to attain a further improvement in the orientation of the PVA molecules in the PVA type resin layer through the second stage in-boric-acid-solution stretching. In either of the cases, the first stage in-air stretching can be classified as a preliminary or auxiliary in-air stretching with respect to the second stage in-boric-acid-solution stretching.

Hereinafter, the first stage "in-air stretching" is referred as the "preliminary in-air stretching" with respect to the second stage "in-boric-acid-solution stretching" which has been already defined.

A mechanism for solving particularly the second technical problem by performing the preliminary in-air stretching may be explained as follows. As shown in FIG. 23, the molecular orientation in the PVA type resin can be enhanced by the preliminary in-air stretching with an increase in the stretching temperature or the stretching ratio during the preliminary in-air stretching. It is assumed that the reason for this result is that the extent of crystallization of the PVA type resin is enhanced with the increase of the stretching temperature or the stretching ratio of the PVA type resin, so that the PVA type resin is stretched while points of crosslink are being partially formed. As a result, the molecular orientation in the PVA type resin is enhanced. It is assumed that by accomplishing such enhanced molecular orientation in the PVA type resin with the preliminary in-air stretching prior to the in-boric-acid-solution stretching, it is possible to facilitate cross-linking of the boric acid with the PVA type resin when the PVA type resin is immersed in the boric acid solution so that the PVA type resin is stretched with the boric acid serving as junction points. As the result, the molecular orientation in the PVA type resin is enhanced even after the in-boric-acid-solution stretching.

The followings set forth modes of embodiments of the present invention.

According to a first aspect, the present invention relates to a polarizing film in the form of a continuous web, the polarizing film comprising a PVA type resin having dichroic material impregnated therein in a molecularly oriented state, wherein the polarizing film is formed by providing a laminate comprising a PVA type resin layer formed on a substrate comprising a crystallizable ester type thermoplastic resin in an amorphous state and subjecting the laminate to a 2-stage stretching process comprising a preliminary in-air stretching and an in-boric-acid-solution stretching under a temperature maintaining the amorphous state of the substrate, such that the PVA type resin layer is stretched to a thickness of 10 μm or less, the polarizing film having optical properties which satisfy conditions represented by the formulae:

$$P>-(10^{0.929T-42.4}-1)\times 100 \text{ (where } T<42.3\text{); and}$$

$$P\geq 99.9 \text{ (where } T\geq 42.3\text{)}$$

where: T represents a single layer transmittance, and P represents a polarization rate. The dichroic material may either be iodine or a mixture of iodine and an organic dye.

Any polarizing film that has an optical property value in the range of the above formulae wherein the single layer transmittance T and the polarization rate P, is principally considered as meeting performance requirements for use in a display for a liquid-crystal television using a large sized display element. Specifically, the performance requirements are equivalent to a contrast ratio of 1000:1 or higher, and, a maximum luminance of 500 cd/m² or higher. Hereinafter, the performance requirements will simply be referred as "required performance." As another application, the polarizing film can be used in an optically functional film laminate which is to be located at the viewing side of an organic electroluminescence (EL) display panel.

In an application where the polarizing films are used with liquid-crystal cells, the polarizing property of either one of the polarizing films on a back light side or a viewing side should be at least in the above range. If a polarizing film with the polarization rate (P) of 99.9% or less is used for either one of polarizing films attached to the back light side or the viewing side, it will become impossible to attain the polarizing property as a whole in a liquid crystal display device even if a polarizing film with the highest possible polarizing property is used for the other of the polarizing films.

According to the first aspect of the present invention, there is provided an optically functional film laminate comprising a continuous web of the aforementioned polarizing film having one surface adhesively attached with an optically functional and the other surface provided with an adhesive agent layer, a separator being releasably attached with the polarizing film through the adhesive agent layer. In this case, the optically functional film may be comprised of a triacetylcellulose (TAC) film.

According to the first aspect of the present invention, there may also be provided an optically functional film laminate comprising a continuous web of the aforementioned polarizing film having one surface adhesively attached with a first optically functional film and the other surface adhesively attached with a second optically functional film, a separator being releasably attached to the second optically functional film through an adhesive agent layer. In this case, the first optically functional film may be comprised of a TAC film and the second optically functional film is comprised of a biaxial phase difference film having refraction indices along three orthogonal axes having relation of nx>nz>ny.

In addition, the first optically functional film may be provided with an acrylic resin film and the second optically functional film may be a λ/4 phase difference film, the phase difference film being then placed with respect to the polarizing film such that the absorption axis of the polarizing film crosses the slow axis of the λ/4 phase difference film at an angle of 45±1 degrees.

According to a second aspect, the present invention relates to an optical film laminate comprising a substrate including a crystallizable ester type thermoplastic resin in the form of a continuous web; and a polarizing film including a PVA type resin formed on the substrate, said polarizing film including a dichroic material impregnated therein in a molecularly oriented state, wherein the polarizing film is formed by providing a laminate comprising the PVA type resin layer formed on a substrate comprising a crystallizable ester type thermoplastic resin in an amorphous state and subjecting the laminate to a 2-stage stretching process comprising a preliminary in-air stretching and an in-boric-acid-solution stretching under a temperature maintaining the amorphous state of the substrate, such that the PVA type resin layer is stretched to a thickness of 10 μm or less, the polarizing film having optical properties which satisfy conditions represented by the formulae:

$$P>-(10^{0.929T-42.4}-1)\times 100 \text{ (where } T<42.3\text{); and}$$

$$P\geq 99.9 \text{ (where } T\geq 42.3\text{)}$$

where T represents a single layer transmittance and P a polarization rate.

According to the second aspect of the present invention, it is preferable that the substrate has a thickness which is at least 6 times as large as that of the PVA type resin layer as formed on the substrate, and more preferably at least 7 times. By having the thickness of the substrate of at least 6 times that of the PVA type resin layer, it is possible to suppress any possible problems such as breakage during transportation in manufacturing process induced by insufficient film strength, and formation of curling or deterioration of transferability when used as one of the polarizing films on a backlight side or a viewing side of a liquid-crystal display.

Reference is now made to FIG. 1. FIG. 1 shows a diagram which is prepared for the purpose of investigating if there may be any problem which may be caused by the relationship between the thickness of the substrate and that of the coating (the thickness of the polarizing film) of the PVA type resin layer. As shown in FIG. 1, with the ratio of the thicknesses of the substrate to that of the PVA type resin layer of around 5.0, it is concerned that a problem may arise during transportation. On the other hand, a concern may arise with the polarizing film having a thickness of 10 μm or more in that the anti-crack property may be lowered.

According to the second aspect of the present invention, the thickness of the polarizing film is preferably 10 μm or less. Refer to FIG. 2. If the thickness of the polarizing film is 3 to 10 μm or less, the polarizing properties of the polarizing film with thicknesses of 3 μm, 8 μm and 10 μm do not have significant differences as shown in T-P graphs in the FIG. 2 showing the polarizing properties of the polarizing film, and it is possible to confirm that the polarizing film has the optical properties which satisfy the above inequality. The FIG. 2 shows that the polarizing film which has a thickness of 10 μm or less obtains the optical property satisfying the required performance without concerning the anti-crack property problem.

According to the second aspect of the present invention, it is also preferable that the substrate may be comprised of a transparent resin such that it serves as an optically functional film protecting a surface of the polarizing film. In addition, the dichroic material may be comprised of either iodine, or a mixture of iodine and an organic dye.

With respect to the terms "preliminary in-air stretching" and "in-boric-acid-solution stretching" already defined, describing specifically, the term "a preliminary in-air stretching" refers to, without limitation, "a process of stretching a laminate in air at an elevated temperature" during the first stage using a heating device such as an oven. In addition, the term "in-boric-acid-solution stretching" refers to, for example, without limitation, "a process of stretching a laminate while impregnating the laminate in boric acid solution" during the second stage.

According to the second aspect of the present invention, there is provided an optical film laminate comprising a polarizing film formed on a substrate, the polarizing film having a separator releasably attached through an adhesive agent layer to a surface opposite to the surface where the substrate is attached. In this case, since the substrate serves as a protection film for the polarizing film, the resin substrate should be transparent.

According to the second aspect, there may further be provided an optically functional film laminate comprising a polarizing film formed on a substrate, the polarizing film having an optically functional film adhesively attached thereto at a surface opposite to the surface where the substrate is attached, an adhesive agent layer being formed on the optically functional film, a separator being releasably attached to the optically functional film through the adhesive agent layer. In this case, the optically functional film may be a biaxial phase difference film having refraction indices along three orthogonal axes having relation of nx>ny>nz.

According to a third aspect, the present invention relates to a stretched laminate comprising a stretched intermediate consisting of a molecularly oriented polyvinyl alcohol type resin for manufacturing an optical film laminate, said stretched laminate comprising:

a substrate comprising a crystallizable ester type thermoplastic resin in the form of a continuous web; and a polarizing film having a thickness of 10 µm or less, said polarizing film comprising a polyvinyl alcohol type resin formed on the substrate having a dichroic material impregnated therein in a molecularly oriented state, wherein the polarizing film has optical properties satisfying conditions represented by formulae:

$$P > -(10^{0.929T-42.4}-1) \times 100 \text{ (where } T<42.3\text{); and}$$

$$P \geq 99.9 \text{ (where } T \geq 42.3\text{)}$$

where T represents a single layer transmittance and P a polarization rate, and wherein said substrate comprising the a crystallizable ester type thermoplastic resin is comprised of a crystallizable polyethylene terephthalate which is in an amorphous state and subjected to a preliminarily in-air stretching under a temperature range maintaining the amorphous state thereof, and said polyvinyl alcohol type resin has an extent of crystallization in a range between 28% to 35% and an orientation function in a range between 0.15 and 0.35. As in the case of the second aspect, it is preferable that the substrate has a thickness which is at least 6 times and more preferably at least 7 times as large as that of the PVA type resin layer. In addition, it is preferable that the substrate is of a transparent resin which can provide an optically functional film for protecting the surface of the polarizing film to which the substrate is attached.

According to the fourth aspect of the present invention, there is provided a method for manufacturing an optical film laminate including a substrate comprising a crystallizable ester type thermoplastic resin in the form of a continuous web, and a polarizing film comprising polyvinyl alcohol type resin formed on the substrate and having a dichroic material impregnated therein in a molecularly oriented state, comprising steps of:

subjecting a laminate comprising the substrate comprised of a crystallizable ester type thermoplastic resin in an amorphous state and a polyvinyl alcohol type resin layer formed on the substrate to a preliminary in-air stretching under a temperature under which the amorphous state of the substrate can be maintained to form a stretched laminate including a stretched intermediate comprised of a molecularly oriented polyvinyl alcohol type resin;

impregnating a dichroic material in the stretched laminate to form a dyed laminate including a dyed intermediate comprising the polyvinyl alcohol type resin layer having the dichroic material impregnated therein in a molecularly oriented state; and stretching the dyed laminate in a boric acid solution to form the optical film laminate including the polarizing film comprising the polyvinyl alcohol type resin having the dichroic material impregnated therein in a molecularly oriented state and having a thickness of 10 µm or less.

According to the forth aspect of the present invention, the method may be adapted for manufacturing an optical film laminate, wherein the polarizing film included in the optically functional film has optical properties which satisfy conditions represented by the formulae:

$$P > -(10^{0.929T-42.4}-1) \times 100 \text{ (where } T<42.3\text{); and}$$

$$P \geq 99.9 \text{ (where } T \geq 42.3\text{)}$$

where T represents a single layer transmittance and P a polarization rate.

According to the forth aspect of the present invention, the method may further include a step of forming the PVA type resin layer on the substrate by coating and drying the PVA type resin on the substrate.

According to the forth aspect of the present invention, it is preferable that the stretching ratio of the preliminary in-air stretching is 3.5 or less, and the stretching temperature of the preliminary in-air stretching is higher than the glass transition temperature. In addition, it is preferable that the stretching temperature of the preliminary in-air stretching is 80° C. to 120° C.

According to the forth aspect of the invention, a dyed laminate comprising a PVA type resin layer having iodide impregnated therein in a molecularly oriented state may be manufactured by, without limitation, immersing the stretched laminate comprising the PVA type resin layer having an oriented molecular structure created by the preliminary in-air stretching in a dyeing solution comprised of the dichroic material such as iodide. In addition, it is preferable that the dyeing solution of iodine contains water as a solvent and iodine with a concentration in a range of 0.12 to 0.30 wt %.

According to the forth aspect of the invention, it is preferable that the stretched laminate manufactured from the preliminary in-air stretching is preliminary insolubilized before immersing the laminate in the dyeing solution. Specifically, it is preferable that the process is performed by immersing the stretched laminate for 30 seconds in a boric acid solution under a solution temperature of no higher than 40° C. to insolubilize the PVA type resin layer having PVA molecules impregnated therein in a molecularly oriented state included in the stretched laminate. The boric acid solution used in this process contains 3 parts in weight of boric acid with respect to 100 parts in weight of water.

The technical problem for the insolubilization process with respect to the stretched laminate is to prevent the PVA type resin layer included in the stretched laminate from dissolving at least in the dyeing process. When this is the first insolubilization, the second insolubilization may be provided by the process of insolubilizing the dyed laminate before subjecting the dyed laminate to in-boric-acid-solution stretching. Specifically, as in the first insolubilization, the second insolubilization is a process of insolubilizing the PVA type resin layer having PVA molecules oriented therein included in the dyed laminate by immersing the dyed laminate for 30 seconds in the boric acid solution at a temperature not more than 40° C.

According to the forth aspect of the invention, it is preferable that the stretching ratio of 5.0 or more is attained for the dyed laminate obtained by the preliminary in-air stretching and the in-boric-acid-solution stretching, and the solution temperature of the boric acid solution is 60° C. or more. In addition, when the preliminary in-air stretching is performed in an end-free uniaxial stretching, it is preferable that the total stretching ratio of 5.0 or more and 7.5 or less is realized for the PVA type resin layer finally formed on the substrate, and when the preliminary in-air stretching is performed in an end-fixed uniaxial stretching, it is preferable that the total stretching ratio of 5.0 or more and 8.5 or less is realized for the PVA type resin layer finally formed on the substrate.

In the forth aspect of the invention, there may be further comprised a process of cleaning the optical film laminate including the polarizing film having a thickness of 10 μm or less and comprising the PVA type resin having the dichroic material impregnated therein in the molecularly oriented state with a solution containing iodide salt having a solution temperature not more than 40° C. In addition, it is possible to further comprise a process of drying the cleaned optical film laminate at a temperature of 50° C. or more to 100° C. or less.

In the forth aspect of the invention, there may be further comprised a process of attaching a separator film through an adhesive agent to a surface of the polarizing film opposite to the surface which is attached to the substrate included in the dried optical film laminate. Alternatively, there may be further comprised a process of attaching an optically functional film through a bonding agent to a surface of the polarizing film opposite to the surface which is attached to the substrate included in the dried optical film laminate. In addition, there may be further comprised a process of attaching the separator film through the adhesive agent to the other surface of the attached optically functional film. In this case, it is preferable that the optically functional film is a biaxial phase difference film having refraction indices along three orthogonal axes having relation of nx>ny>nz.

BRIEF DESCRIPTION OF THE DRAWINGS

FIG. 12 shows examples of optically functional film laminate wherein the polarizing film is laminated/transferred;

FIG. 26 is a list showing the manufacturing conditions of the polarizing films or the optical film laminates comprising the polarizing films in accordance with the examples 1 to 15;

BEST MODE FOR CARRYING OUT THE INVENTION

Figure 1:
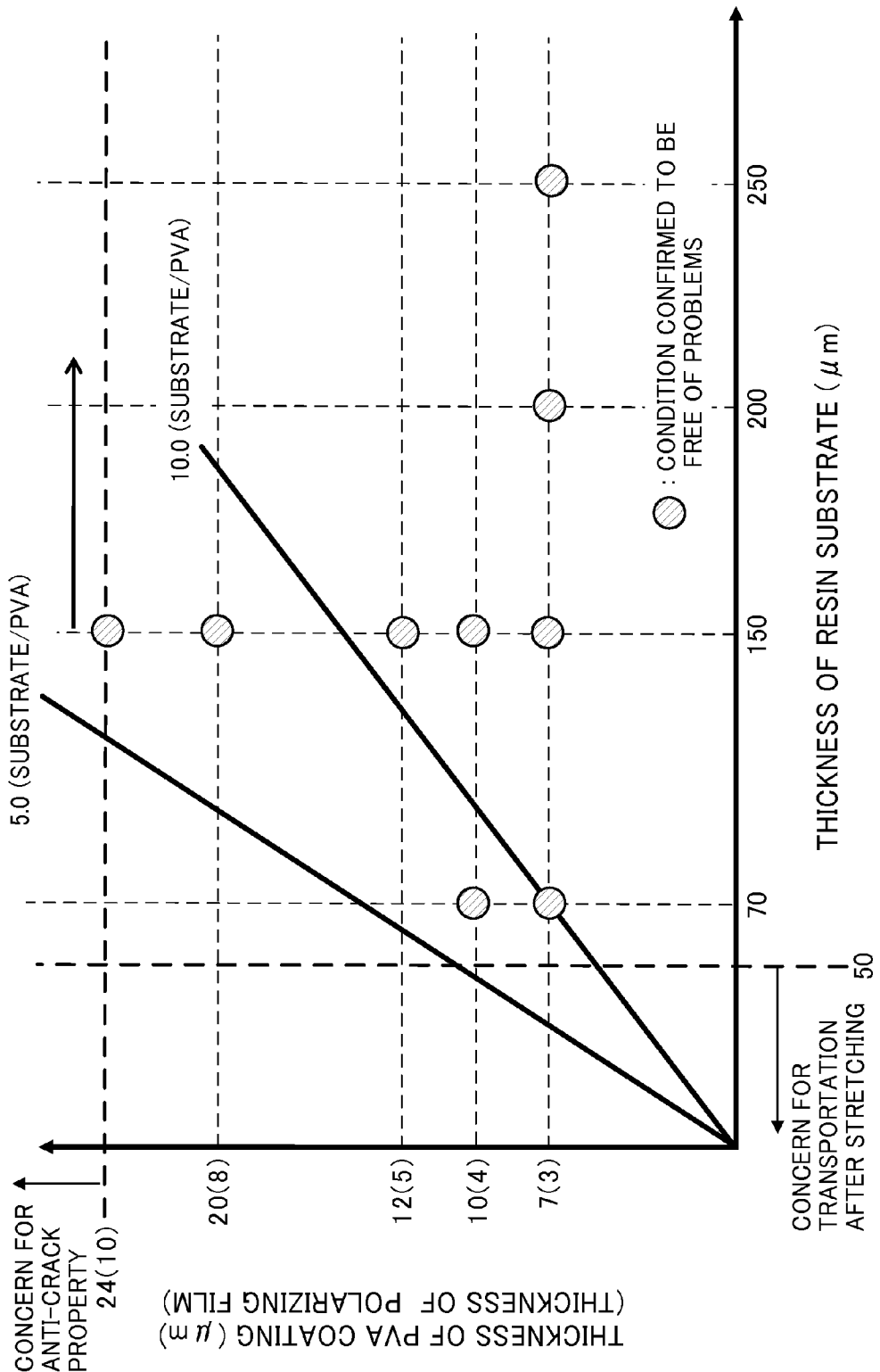
FIG. 1 is a diagram showing an appropriate thickness of the resin substrate with respect to the thickness of the PVA type resin layer (or the thickness of the polarizing film)
Figure 2:
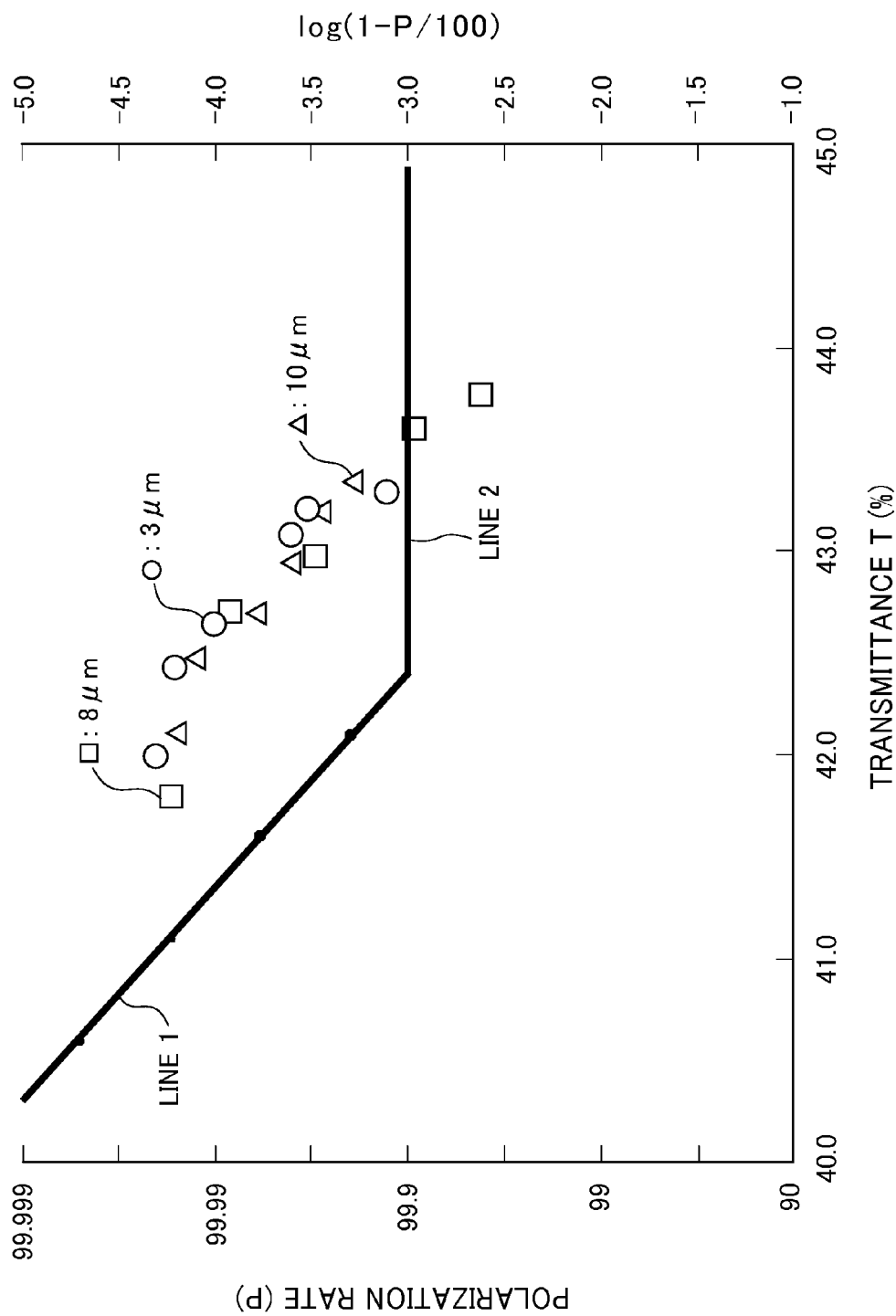
FIG. 2 is a comparative diagram of the polarizing property of the polarizing film with thicknesses of 3 μm, 8 μm and 10 μm.

Descriptions will now be made on optical properties represented by material properties of the thermoplastic resin substrate used in the present invention and the polarizing property of the polarizing film as background technologies of the present invention.

General material properties of thermoplastic resins used in the present invention will now be described in the followings.

Thermoplastic resins are roughly classified into two categories, one being those which are in a crystallized state having regularly oriented polymer molecules and the other being those in an amorphous or non-crystallized state having polymer molecules which not regularly oriented or only in part regularly oriented. The former is referred as in a crystallized state and the latter in an amorphous or non-crystallized state. Correspondingly, a thermoplastic resin having a nature of forming a crystallized state is referred as a crystallizable resin, and that which does not have such a nature is referred as a non-crystallizable resin. On the other hand, regardless whether it is crystallizable or not, a resin which is not in a crystallized state or which has not been crystallized is referred as amorphous or non-crystal resin. Herein, the term "amorphous" or "non-crystal" resin is used in a different meaning from a "non-crystallizable" resin that does not take a crystallized state.

Crystallizable resins include, for example, olefin type resins including polyethylene (PE) and polypropylene (PP), and ester type resins including polyethylene terephthalate (PET) and polybutylene terephthalate (PBT). One of the characteristics of such crystallizable resin is that heating or stretching generally causes polymer molecules being oriented and crystallization being progressed. Physical properties of such resins vary according to the extent of crystallization. On the other hand, even in the case of crystallizable resins such as PP and PET, it is possible to suppress crystallization by inhibiting polymer molecules being oriented through application of heat or stretching. Such PP and PET in which crystallization is thus suppressed are respectively referred as non-crystallizable polypropylene and non-crystallizable polyethylene terephthalate, and they are respectively generally referred as non-crystallizable olefin type resin and non-crystallizable ester type resin. In case of PP, for example, it is possible to produce a non-crystallizable PP in which crystallization is suppressed by providing the PP with atactic structure having no stereoscopic regularity. Further, in case of PET, for example, it is possible to produce a non-crystallizable PET by copolymerizing modifier group such as isophthalic acid or 1,4-cyclohexanedimethanol as a polymerizing monomer, or by copolymerizing molecules that inhibit crystallization of PET. In addition, referring to ester type resins which are polycondensates of polycarboxylic acid (dicarboxylic acid) and polyalcohol (diol), crystallizable ester type resins used in the present invention include, for example, polyethylene terephthalate (PET), polybutylene terephtalate (PBT), polytrimethylene terephtalate (PTT), polyethylene naphthalate (PEN) and polybutylene naphthalate (PBN). Each of these crystallizable ester type resins has a property liable to be crystallized when formed as a film, but does not rapidly crystallize when subjected to the preliminary in-air stretching under the temperature maintaining the amorphous state, and that each of them has stretchability, it is possible to be used as a thermoplastic resin substrate. The stretchability of the film naturally decreases if the film is crystallized at the time of forming. To ensure the stretchability of the film, it is preferable to inhibit the crystallization at the time of forming to thereby use the film formed under the amorphous (non-crystallized) state. The crystallizable ester type resins used in the present invention may be combined with plasticizing agent and/or elastomer to enhance the workability and stretchability of the film. The plasticizing agent includes, for example, phthalate compounds and its polycondensates, fatty acid ester such as adipic acid and its poly condensates, polyester type plasticizing agent, epoxy type plasticizing agent, styrene type polymer, acrylic type polymer, terphenyl compounds and its substituted derivative. In addition, the elastomer includes styrene type, olefin type, acrylic type, vinyl chloride type, urethane type, ester type and nylon type.

General description will now be made on optical properties of polarizing film that may be used in a large sized display. The term "optical properties" of a polarizing film is used in short to mean polarizing property represented by polarization rate P and single layer transmittance T. In general, the polarization rate P and the single layer transmittance T of a polarizing film are in trade-off relationship. In a T-P diagram, there are plotted a plurality of values of the two optical factors. In a T-P diagram, it is interpreted that the polarizing property of a polarizing film is superior if the single layer transmittance is higher (to the right of the diagram) and the polarization rate is higher (to the top of the graph) as indicated by the plotted line.

Figure 3:
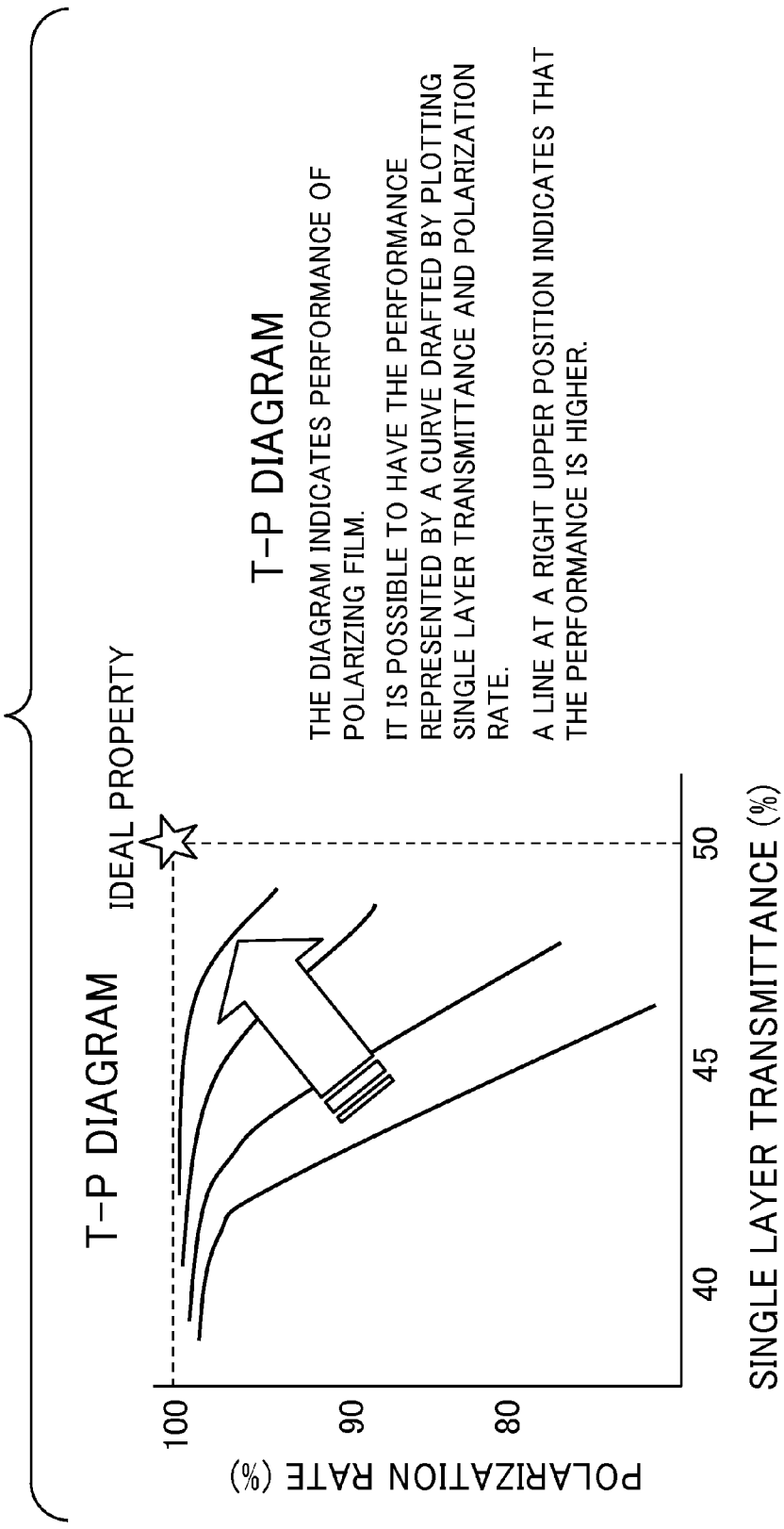
FIG. 3 is a schematic diagram of T-P graphs showing the relationship between the single layer transmittance and the polarization rate.

Reference is now made to the diagram in FIG. 3. It is to be noted that an ideal optical property is a case where T is 50% and P is 100%. Note that it is easier to increase the value of P with a low value of T, and it is difficult to increase the value of P with a high value of T. Thus, in the case of a polarizing film having a thickness of 10 µm or less manufactured by using a thermoplastic resin substrate, there is drawn a solid line along plots to define a range in terms of the single layer transmittance T and the polarization rate P in FIG. 4 which is considered to be, currently or even in future, optical properties required for a polarizing film for a large size display element.

An ideal value of the single layer transmittance T is 50%, but when light transmits through a polarizing film, a part of light is reflected at a boundary between the polarizing film and air. Taking such reflection into consideration, it is noted that the single layer transmittance T is reduced by an extent corresponding to the portion of the reflected light, and the maximum attainable value of the single layer transmittance T may be 45 to 46%.

On the other hand, the polarization rate P may be converted to a contrast ratio (CR) of a polarizing film. For example, the polarization rate P of 99.95% corresponds to the contrast ratio CR of 2000:1 of a polarizing film. When this polarizing film is used in each of the opposite sides of a cell for a liquid-crystal television, the displayed image contrast ratio CR may be 1050:1. Such decrease in the displayed image contrast ratio CR as compared with the polarizing film contrast ratio CR is caused by the fact that depolarization occurs within the cell.

Depolarization is caused by scatter and/or reflection of light which occur at the pigment in color filters, liquid-crystal molecule layer and a thin-film transistor (TFT) when the light is passed through the polarizing film on the backlight side and through the cell, resulting in a change in polarizing state of a part of the light. The contrast ratio CR of a liquid-crystal display television will become better and easier to observe the displayed image with increase in the contrast ratio CR of the polarizing film and that of the display.

By the way, the contrast ratio of a polarizing film is defined as a value of a parallel transmittance (Tp) divided by a cross transmittance (Tc). On the other hand, the contrast ratio of a display can be defined as a value of the maximum intensity of brightness divided by the minimum brightness. The minimum brightness is the one in a black screen, and in the case of a liquid-crystal display television under a general viewing environment, the required value for the minimum brightness is 0.5 cd/m² or lower. With the minimum brightness higher than the value, color reproducibility of the liquid-crystal display may be reduced. The maximum brightness is the one under a display of white screen, and a display with the maximum brightness or luminance in a range of 450 to 550 cd/m² is used for a liquid-crystal display television under a general viewing environment. With the maximum brightness or luminance lower than the value, visibility of the liquid crystal display may be reduced since the display may become dark to an unacceptable level.

Figure 4:
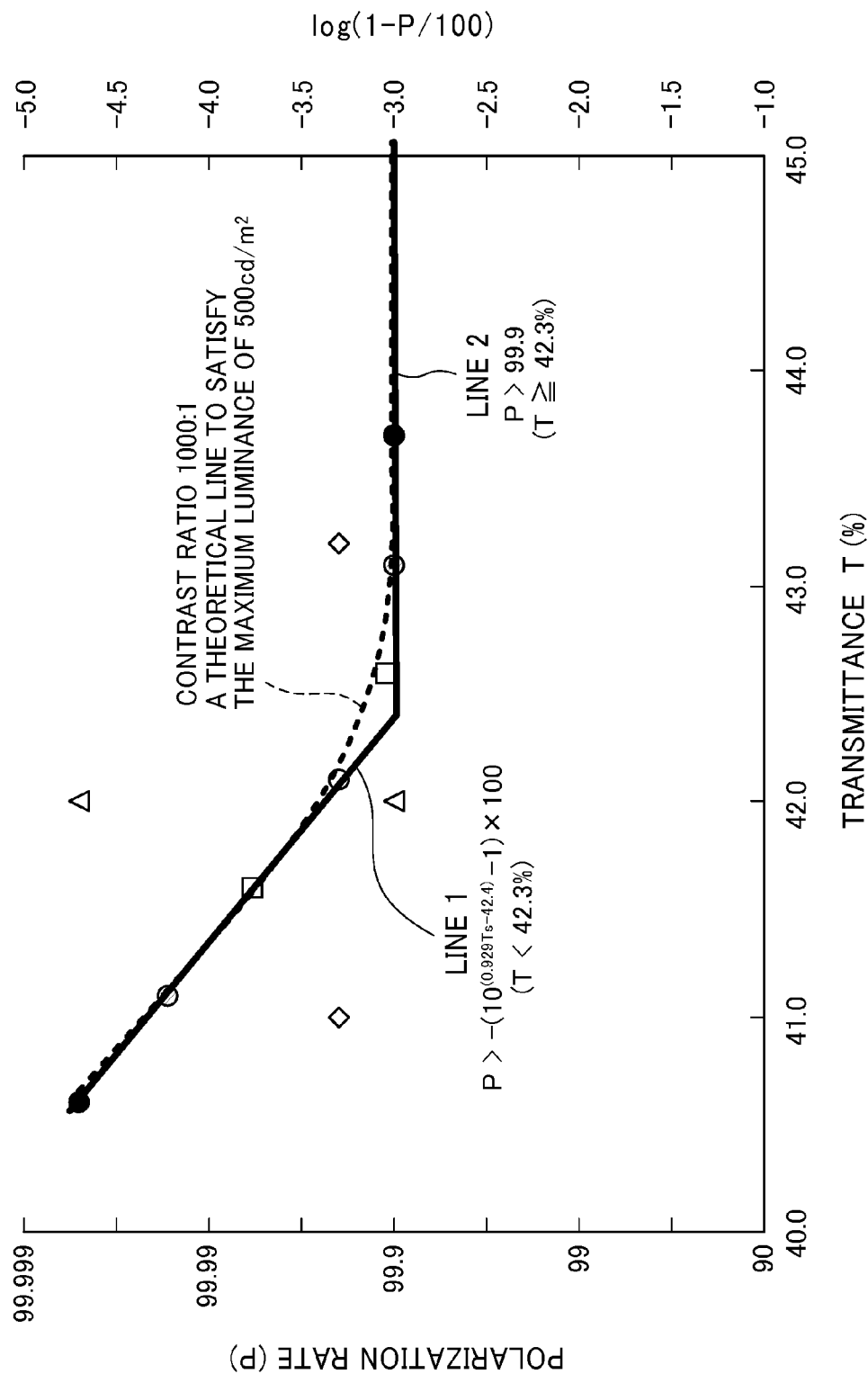
FIG. 4 is a diagram showing a range of required performance of the polarizing film.

Performance required for a display in a liquid-crystal television having a large size display element includes the display contrast ratio of 1000:1 or higher and the maximum brightness or luminance of 500 cd/m² or higher. These factors are referred as required performance. The line 1 (T<42.3%) and the line 2 (T≥42.3%) in FIG. 4 are drafted along points of limit values of polarizing property of a polarizing film necessary to achieve the required performance. These lines have been determined with the following simulations based on combinations of polarizing films on a backlight side and a viewing side shown in FIG. 5.

Contrast ratio and maximum brightness or luminance of a display for a liquid-crystal display television are calculated based on the intensity of light from the illumination light source (the backlight unit), the transmittance of two polarizing films, one on the backlight side and the other on the viewing side, the transmittance of cells, the polarization rate of the two polarizing films, one on the backlight side and the other on the viewing side, and the depolarization ratio of the cells. The lines 1 and 2 in FIG. 4 designate the boarder of the required performance and derived based on basic values including the intensity of the illumination light source (10,000 cd/m²), the transmittance (13%) and the depolarization ratio (0.085%) of the cells used in a conventional liquid-crystal display television, providing several pairs of polarizing films with various polarizing property, and performing calculations to obtain the contrast ratio CR and the maximum brightness for each pair of the polarizing films in the display for a conventional liquid-crystal display television. The followings are the equations used for the calculation.

Equation 1 is the one for determining the contrast ratio CR of a display. Equation 2 is the one for determining the maximum brightness of a display. Equation 3 is for determining the dichroic ratio of a polarizing film.

$$CRD = L\max/L\min \qquad \text{Equation 1}$$

$$L\max = (LB \times Tp - (LB/2 \times k1B \times DP/100)/2 \times (k1F - k2F)) \times T\text{cell}/100 \qquad \text{Equation 2}$$

$$DR = A_{k2}/A_{k1} = \log(k2)/\log(k1) = \log(Ts/100 \times (1-P/100)/T_{PVA})/\log(Ts/100 \times (1+P/100)/T_{PVA}) \qquad \text{Equation 3}$$

Where;
$L\min = (LB \times Tc + (LB/2 \times k1B \times DP/100)/2 \times (k1F - k2F)) \times T\text{cell}/100$
$Tp = (k1B \times k1F + k2B \times k2F)/2 \times T_{PVA}$
$Tc = (k1B \times k2F + k2B \times k1F)/2 \times T_{PVA}$
$k1 = Ts/100 \times (1+P/100)/T_{PVA}$
$k2 = Ts/100 \times (1-P/100)/T_{PVA}$
CRD: contrast ratio of the display
Lmax: maximum brightness or luminance of the display
Lmin: minimum brightness or luminance of the display
DR: dichroic ratio of the polarizing film
Ts: single layer transmittance of the polarizing film
P: polarization rate of the polarizing film
k1: first primary transmittance
k2: second primary transmittance
k1F: k1 of the polarizing film on the viewing side
k2F: k2 of the polarizing film on the viewing side
k1B: k1 of the polarizing film on the backlight side
k2B: k2 of the polarizing film on the backlight side
$A_{k1}$: absorbance rate in the direction of transmission axis of the polarizing film
$A_{k2}$: absorbance rate in the direction of absorption axis of the polarizing film
LB: intensity of illumination light from the illumination light source (10,000 cd/m²)
Tc: cross transmittance of polarizing films (a combination comprising a viewing side polarizing film and a backlight side polarizing film)
Tp: parallel transmittance of polarizing films (a combination comprising a viewing side polarizing film and a backlight side polarizing film)
Tcell: transmittance of cell (13%)
DP: depolarization ratio of cell (0.085%)
$T_{PVA}$: transmittance of a PVA film having no iodine impregnated therein (0.92)

Figure 5:
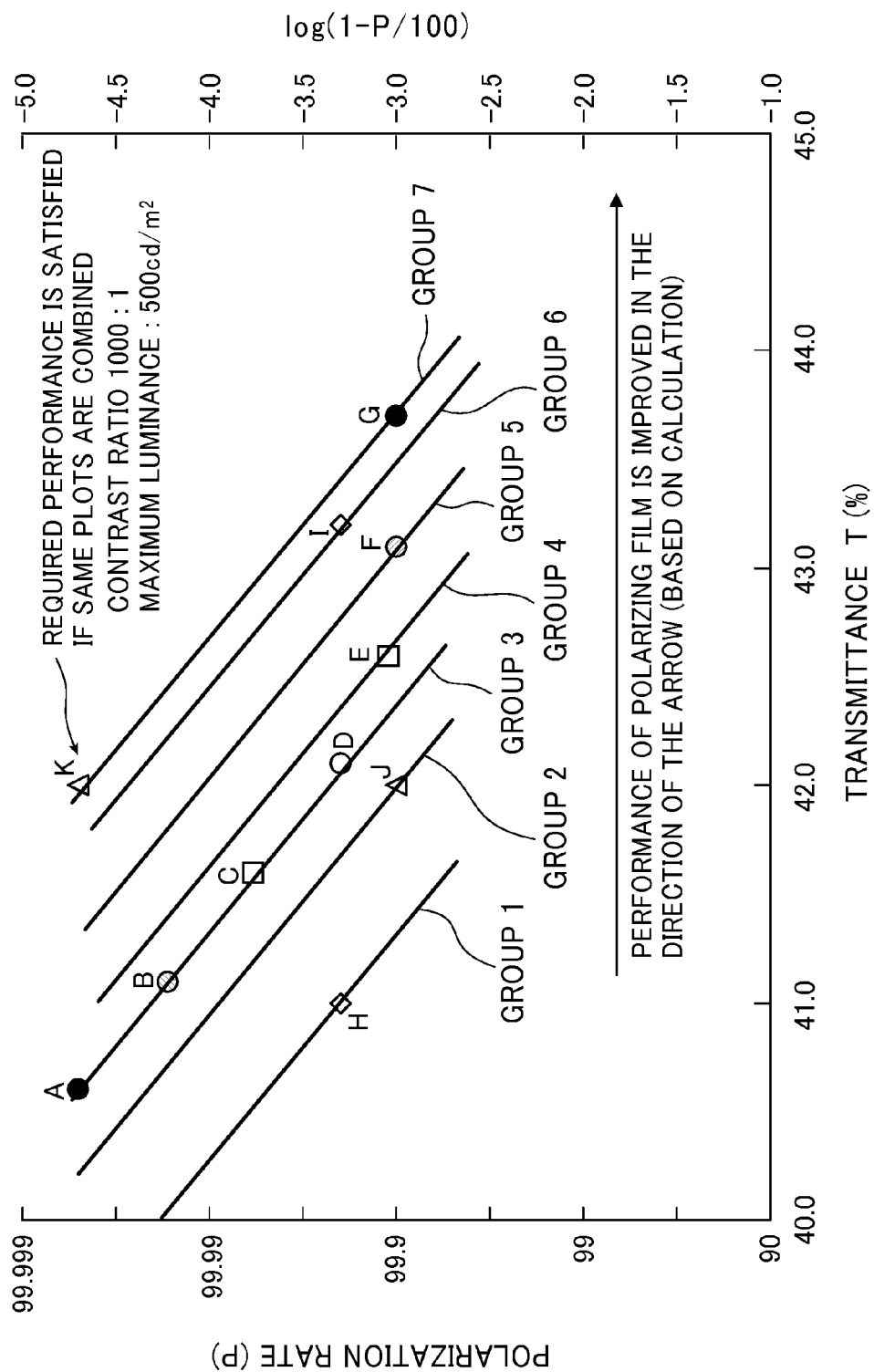
FIG. 5 is a diagram showing theoretical values of polarizing property based on the dichroic ratio of polarizing films 1 to 7.

The line 1 in FIG. 4 (T<42.3%) can be derived based on the polarizing property of polarizing films belonging to group 3 shown in FIG. 5. Referring to the group 3 shown in FIG. 5, it is noted that a polarizing film D designated by a plot D (a white circle) has the polarizing property represented by coordinates (T, P)=(42.1%, 99.95%), and two such polarizing film can be paired for use at respective ones of the backlight side and the viewing side of a display for a liquid-crystal display television to satisfy the required performance.

However, even in the case of those belonging to the same group 3, it is to be noted that the other three polarizing films designated as a polarizing film A (40.6%, 99.998%), a polarizing film B (41.1%, 99.994%) and a polarizing film C (41.6%, 99.98%) have transmittance rate lower than that of the polarizing film D, so that if two of such polarizing films are paired for use in both the backlight side and the viewing side, the required performance cannot be satisfied. When one of the polarizing films A, B and C is used on either one of the backlight side or the viewing side, it is required that the polarizing film on the other side has a higher single layer transmittance T than the group 3 polarizing film and the polarization rate P of 99.9% or higher, such as a polarizing film E in the group 4, a polarizing film F in the group 5 or a polarizing film G in the group 7 in order to attain the required performance.

The properties of the polarizing films belonging to the groups 1 to 7 are calculated in accordance with the Equation 3. Use of the Equation 3 allows for calculating the single layer transmittance ratio T and the polarization rate P based on the dichroic ratio (DR) which can be considered as an index of the polarizing properties of a polarizing film. The dichroic ratio is the absorbance rate in the direction of the absorption axis of a polarizing film divided by the absorbance rate in the direction of the transmission axis thereof. It is to be noted that with higher value of this ratio it is possible to attain better polarizing property. For example, polarizing films in the group 3 are those having polarizing property where the dichroic ratio is about 94.

If a polarizing film, such as a polarizing film H (41.0%, 99.95%) in the group 1 or a polarizing film J (42.0%, 99.9%) in the group 2, having inferior polarizing property than the polarizing films in the group 3, is used as a polarizing film on either one of the backlight side or the viewing side, it is clear from the Equation 1 and the Equation 2 that a polarizing film, such as a polarizing film I (43.2%, 99.95%) in the group 6 or a polarizing film K (42.0%, 99.998%) in the group 7, having superior polarizing property than the polarizing films in the group 3, has to be used on the other side to satisfy the required performance.

The polarizing property of either one of the polarizing films on the backlight side or the viewing side have to be better than that of the polarizing films in the group 3 to satisfy the required performance of a display for a liquid-crystal display television. The line 1 (T<42.3%) in FIG. 4 indicates the lower limit of the polarizing property, and the line 2 (T≥42.3%) indicates the lower limit of the polarization rate P. If a polarizing film with the polarization rate P of 99.9% or lower is used as a polarizing film on either one of the backlight side or the viewing side, the required performance cannot be satisfied even by using a polarizing film with the best possible polarizing property on the other side.

In conclusion, in order to satisfy polarizing property required for a display of a liquid-crystal display television using a large size display element, the polarizing property of the polarizing film on either one of the backlight side or the viewing side should be at least in the range represented by the line 1 (T<42.3%) and the line 2 (T≥42.3%), and more specifically, the polarizing property should be better than that of the polarizing films in the group 3, and the polarization rate should be 99.9% or higher.

Further, descriptions will now be made with respect to the method for manufacturing a polarizing film consisting of a PVA type resin using a thermoplastic resin substrate that a first and a second insolubilization in the third embodiment of the present invention are considered to be parts of the measures for dealing with important technical challenges.

It is to be noted that it would not be an easy task to have iodine impregnated in a PVA type resin layer without having the PVA type resin layer included a stretched intermediate (or, a stretched laminate) being dissolved in a dyeing solution. It is an important technical challenge in the manufacture of a polarizing film to have iodine impregnated in a PVA type resin layer of a decreased thickness. Usually, the amount of iodine impregnated in the PVA type resin layer is controlled by using a plurality of dyeing solutions with different iodine concentration in a range of 0.12 to 0.25 wt % so that the dyeing process is carried out for a constant immersing time. With such usual dyeing process in the manufacture of a polarizing film, the PVA type resin layer can be dissolved to such an extent that dyeing becomes no longer possible. Herein, the term "concentration" means the rate of composition in relation to a total amount of solution. Further, the term "iodine concentration" means the rate of iodine in relation to the total amount of solution, and does not include amount of iodine content added as, for example, potassium iodide. Hereinafter, the terms "concentration" and "iodine concentration" are used in the same meanings as above.

Figure 6:
FIG. 6 is a comparative table showing differences in dissolution of the PVA type resin layer in accordance with differences in iodine concentration in dyeing bath.

The aforementioned technical challenge has been solved by raising the iodine concentration in the dichroic material to 0.3 wt % or higher as is clear from the experimental results shown in FIG. 6. In particular, a stretched laminate comprising a stretched intermediate consisting of a PVA type resin layer is dyed in dyeing solutions with different iodine concentration, and the immersion time is controlled to form a dyed laminate comprising dyed intermediate, and then is stretched in boric acid solution to allow for forming each of polarizing films with various polarizing properties.

Figure 7:
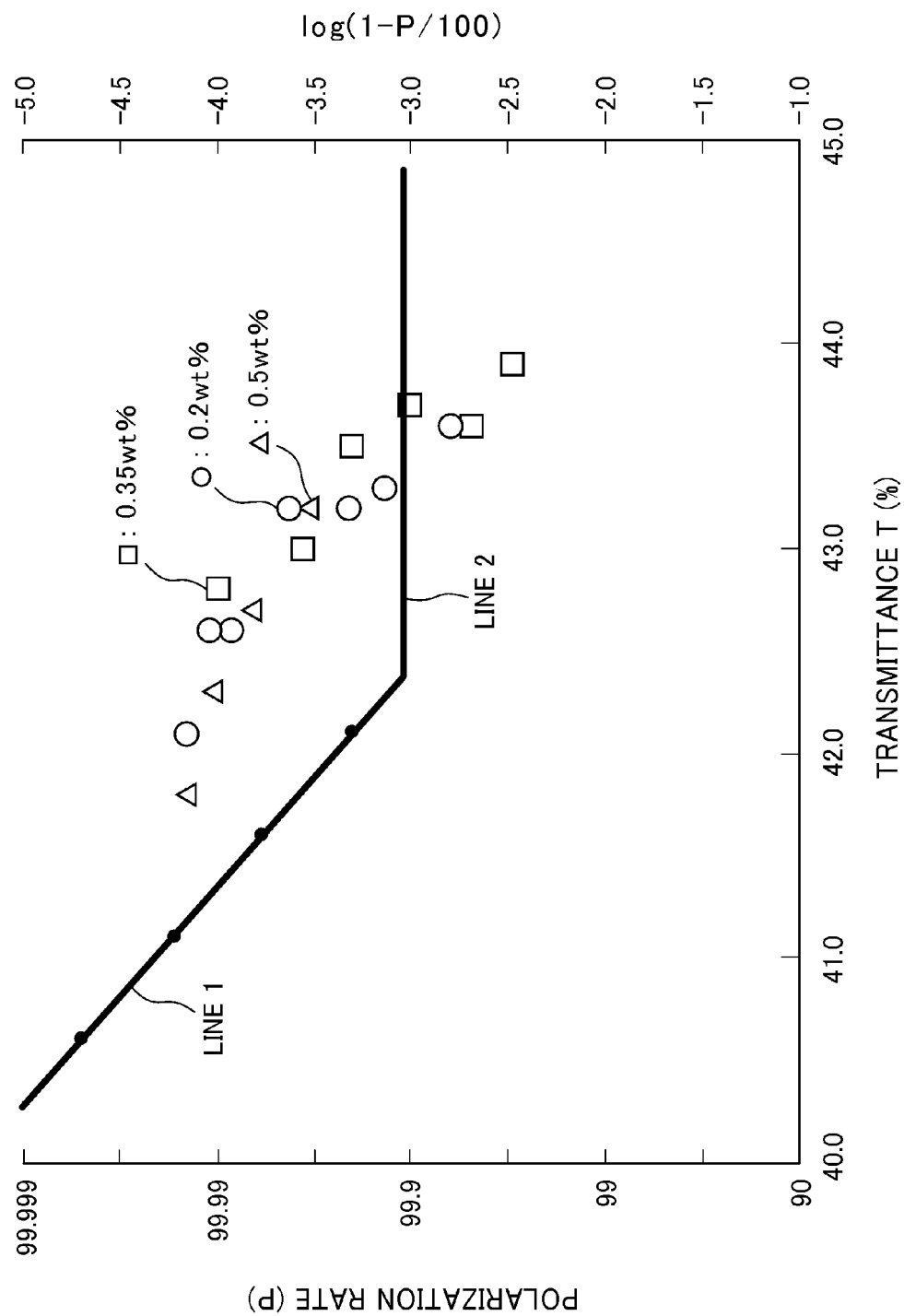
FIG. 7 is a comparative diagram showing changes in the polarizing property of the polarizing film formed with the PVA type resin layer in accordance with changes in iodine concentration in dyeing bath.

Reference is made to the diagram shown in FIG. 7. In FIG. 7, it has been verified that there is no meaningful difference in the polarizing property between polarizing films formed in the solutions of different iodine concentrations of 0.2 wt %, 0.35 wt % and 0.5 wt %. In this regard, in the manufacture of a dyed laminate including a dyed intermediate, it is preferable for accomplishing dyeing of excellent uniformity in a stable manner to use a solution of decreased iodine concentration so as to secure a stable immersion time, rather than to use a solution of increased iodine concentration for carrying out dyeing process within a short immersion time.

Figure 8:
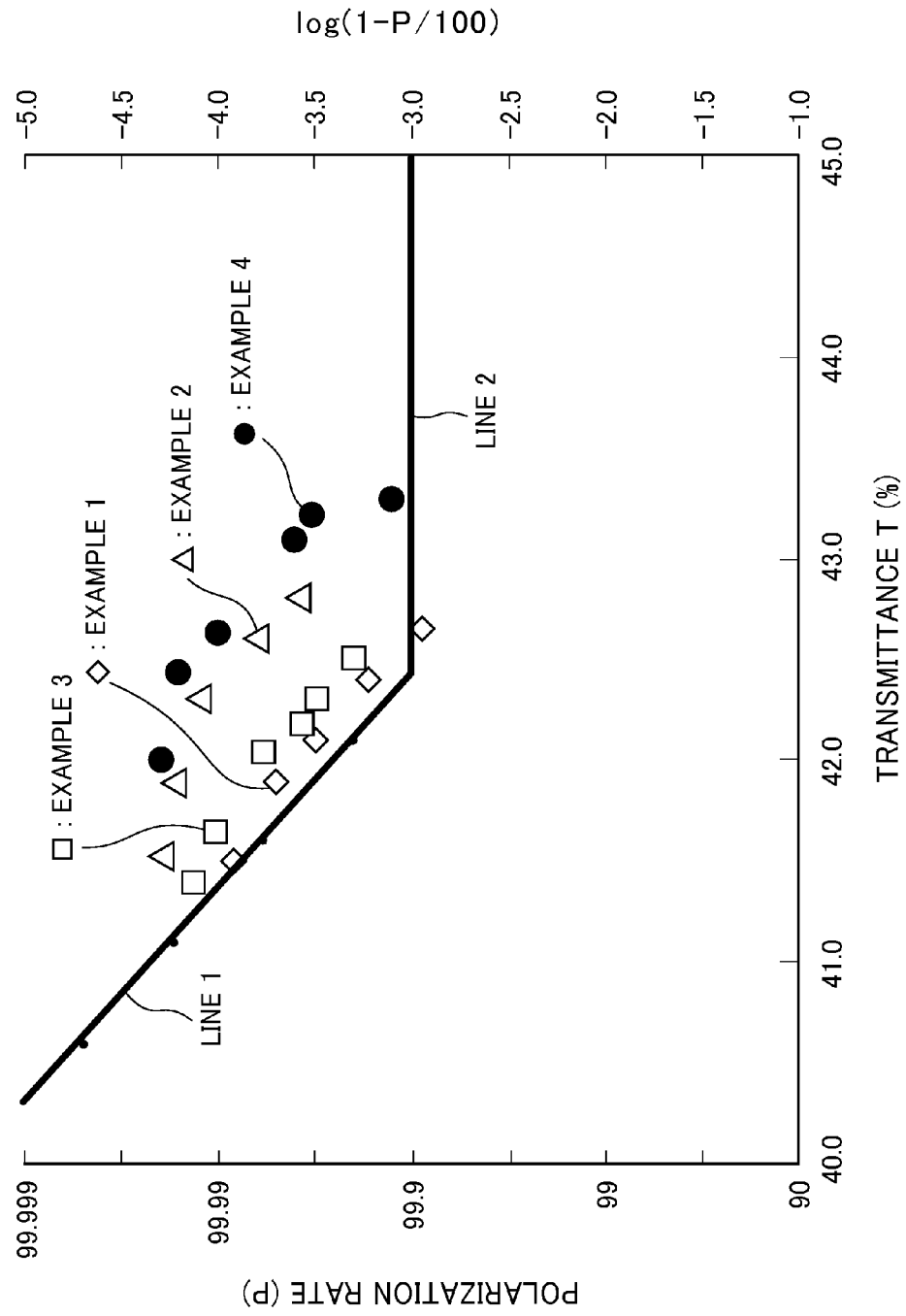
FIG. 8 is a comparative diagram showing the polarizing properties of the polarizing films of examples 1 to 4 depending on with or without insolubilization treatment.

Reference is now made to FIG. 8. It is to be noted that the first and second insolubilization processes in the third embodiment of the present invention (hereinafter referred as "the first and the second insolubilization processes") both have effects on the optical properties of the finally manufactured polarizing films. FIG. 8 is considered as showing results of analysis relating to the effects of the first and the second insolubilization processes on the PVA type resin layer having decreased thickness. FIG. 8 has been drafted by plotting optical properties of each of polarizing films manufactured based on the examples 1 to 4 which satisfy the required performance for a display for a liquid-crystal display television using a large size display element.

The example 1 shows the optical properties of the polarizing film manufactured without adopting the first and the second insolubilization processes, the example 2 shows the optical properties of the polarizing film manufactured without adopting the first insolubilization process but adopting the second insolubilization process, the example 3 shows the optical properties of the polarizing film manufactured with the first insolubilization process but without the second insolubilization process, and the example 4 shows the optical properties of the polarizing film manufactured with both the first and the second insolubilization processes.

In the embodiments of the present invention, a polarizing film that satisfies the required performance may be manufactured without the first and the second insolubilization processes. However, as clearly shown in FIG. 8, the optical properties of the example 1, manufactured without the first and the second insolubilization processes, are inferior to those of the polarizing films in accordance with the examples 2 to 4.

Comparing the optical properties of respective ones of the examples, it will be noted that the optical properties of the example 4 are the best, those of the example 2 are the second best, then followed by the example 3 and then the example 1. In each of the examples 1 and 2, a dyeing solution with the iodine concentration of 0.3 wt % and the potassium iodide concentration of 2.1 wt % is used. In contrast, in the examples 3 and 4, there have been used a plurality of dyeing solutions in which iodine concentrations have been varied in a range of 0.12 to 0.25 wt % and potassium iodide concentration in a range of 0.84 to 1.75 wt %.

A decisive difference between the group of the examples 1 and 3 and the group of the examples 2 and 4 is that the dyed intermediate of the former group has not been insolubilized, but the dyed intermediate of the latter group has been insolubilized. For the example 4, the insolubilization processes have been applied not only to the dyed intermediate before the in-boric-acid-solution stretching but also to the stretched intermediate before dyeing. It is to be noted that through the first and the second insolubilization processes, further improvements in the optical properties of the polarizing films have been accomplished.

It is to be noted that the mechanism for improving optical properties of a polarizing film does not owe to the iodine concentration in the dyeing solution as is clear in FIG. 7. It is understood that it is the result of the first and the second insolubilization processes. These findings may be regarded as a third technical challenge and the solution thereto in the manufacturing process of the present invention.

According to the embodiments of the present invention, the first insolubilization process is adopted to insolubilize the PVA type resin layer of a decreased thickness included in the stretched intermediate (or the stretched laminate). On the other hand, the second insolubilization process included in the cross-linking process is for stabilizing iodine impregnated in the PVA type resin layer in the dyed intermediate (or a dyed laminate) so that the iodine is prevented from being eluted during the in-boric-acid-solution stretching under the solution temperature of 75° C. in a later process, and for insolubilizing the PVA type resin layer of decreased thickness.

It should however be noted that, if the second insolubilization process was omitted, the iodine impregnated in the PVA type resin layer would possibly be eluted during the in-boric-acid-solution stretching under the solution temperature of 75° C., so that the PVA type resin layer would possibly be dissolved. It is required to have a dyed intermediate (or a dyed laminate) stretched while it is immersed in the boric acid solution under the solution temperature lower than 65° C. in order for avoiding the above elution and dissolution.

Such lowered solution temperature may result in a plasticizing function of water being utilized only to an insufficient extent, so that the PVA type resin layer included in the dyed intermediate (or the dyed laminate) may not be softened to a satisfactory level. Thus, there may be a risk that stretchability of the intermediate may be decreased to a level that breakage of the dyed intermediate (or the dyed laminate) may occur during the in-boric acid solution stretching. This will mean as a matter of fact that an intended total stretching ratio of the PVA type resin layer cannot be realized.

(General Description of the Manufacturing Process)

Figure 9:
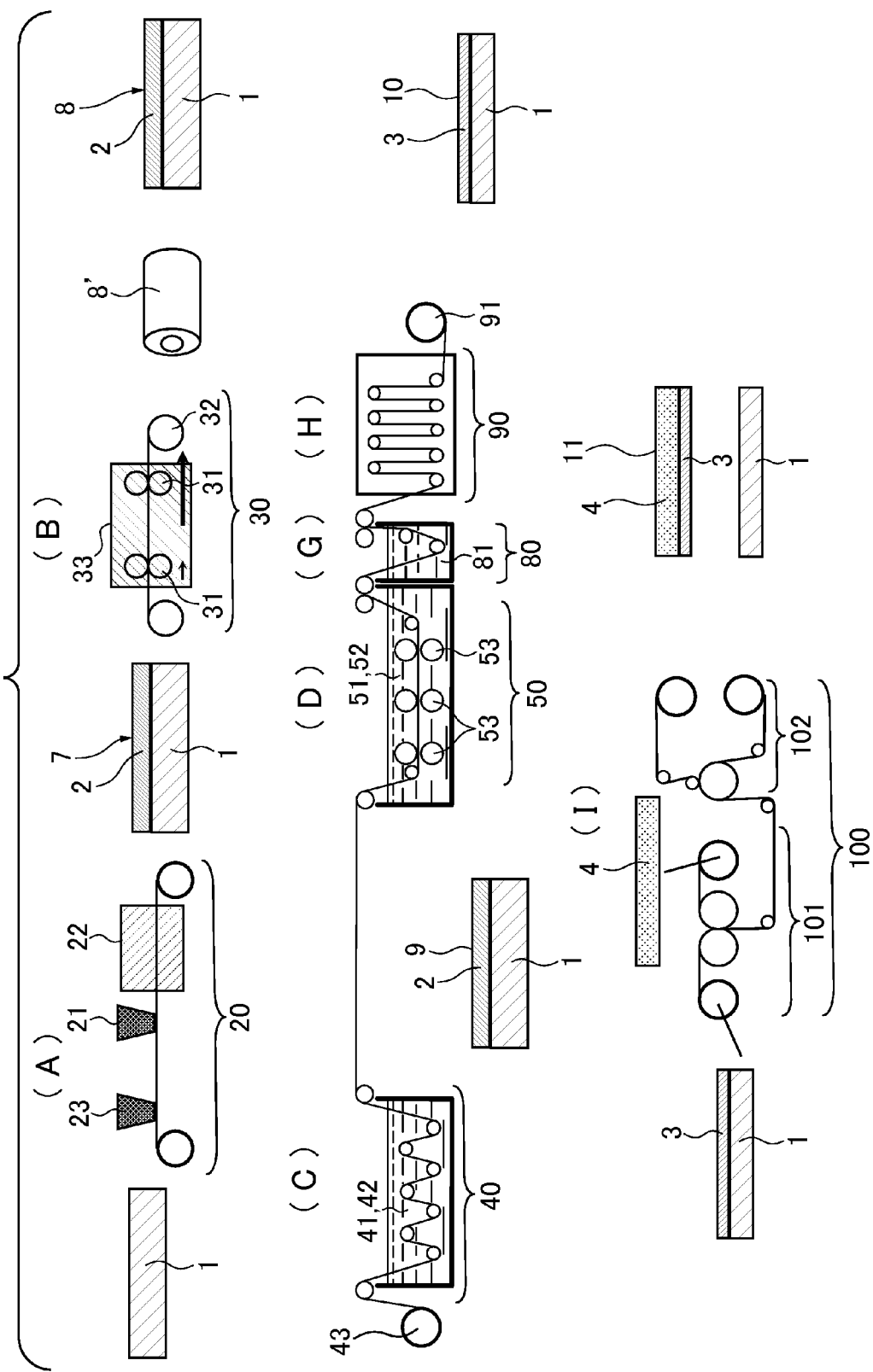
FIG. 9 is a schematic drawing showing a manufacturing process for producing an optical film laminate without insolubilization treatment.

Reference is made to FIG. 9. FIG. 9 is a schematic drawing showing one example of manufacturing process for an optical film laminate 10 comprising a polarizing film 3 in which an insolubilization process is not carried out. Here, description will be made on the method for manufacturing an optical film laminate 10 comprising a polarizing film 3 in accordance with the example 1.

A crystallizable ester type thermoplastic resin substrate has been provided in the form of a continuous web of substrate comprising crystallizable polyethylene terephthalate (hereinafter referred as crystallizable PET). A laminate 7 has been produced from the continuous web of the crystallizable PET substrate 1 having the glass-transition temperature of 80° C., and a PVA layer 2 having the glass-transition temperature of 80° C. in accordance with the following procedures.

(Laminate Manufacturing Process (A))

First, a crystallizable PET substrate 1 having a thickness of 200 μm, and a PVA solution have been prepared. The PVA solution had a PVA concentration of 4 to 5 wt % and made from powders of PVA having a degree of polymerization of 1000 or higher and a degree of saponification of 99% or higher, the powders being dissolved in water to prepare the solution. Then, using a laminate manufacturing apparatus 20 comprising a coating unit 21, a drying unit 22 and a surface modifying apparatus 23, the PVA solution is coated on the crystallizable PET substrate 1 having a thickness of 200 μm, and dried at a temperature of 50 to 60° C., to form a 7 μm-thick PVA layer 2 on the crystallizable PET substrate 1. Hereinafter, is the product formed as above is referred as "a laminate 7 comprising a 7 μm-thick PVA layer formed on a crystallizable PET substrate," or "a laminate 7 comprising a 7 μm-thick PVA layer," or simply as "a laminate 7."

The laminate 7 comprising a PVA layer is used to finally manufacture a 3 μm-thick polarizing film 3 through following processes including a 2-stage stretching including a preliminary in-air stretching and an in-boric-acid-solution stretching.

(Preliminary In-Air Stretching Process (B))

In a first stage or preliminary in-air stretching process (B), the laminate 7 comprising the 7 μm-thick PVA layer 2 is integrally stretched with the crystallizable PET substrate 1 to form "a stretched laminate 8" including a 5 μm-thick PVA layer 2. Particularly, using a preliminary in-air stretching apparatus 30 comprising a stretching unit 31 located in an oven 33, the laminate 7 including the 7 μm-thick PVA layer 2 is subjected to an end-free uniaxial stretching by the stretching unit 31 in the oven 33 at a stretching temperature of 110° C. to a stretching ratio of 1.8, to form the stretched laminate 8. At this stage, the stretched laminate 8 may be wound into a roll 8' with a winding apparatus 32 provided in relation to the oven 33.

End-free stretching and end-fixed stretching will now be outlined. When a continuous film is stretched in the feeding direction, the film shrinks in the direction orthogonal to the stretching direction, i.e. in width-wise direction. The end-free stretching is a stretching process in which no restriction incurred against the shrinkage. A longitudinal uniaxial stretching is a method of stretching wherein a stretching force is applied only in the longitudinal direction. The end-free uniaxial stretching is generally compared with a end-fixed uniaxial stretching in which shrinkage occurring in the direction orthogonal to the stretching direction is restricted. Through the end-free uniaxial stretching, the 7 μm-thick PVA layer 2 included in the laminate 7 is stretched into a 5 μm-thick PVA layer 2 having PVA molecules oriented therein.

(Dying Process (C))

A dyeing process (C) is then carried out to produce a dyed laminate 9 having a dichroic material comprised of iodine impregnated in the 5 μm-thick PVA layer 2 which includes PVA molecules oriented therein. More specifically, there has been produced a dyed laminate 9 in which the molecularly oriented PVA layer 2' of the stretched laminate 8 includes iodine impregnated therein, using a dyeing apparatus 40 comprising a dye pool 42 of a dyeing solution 41 containing iodine and potassium iodide, to have the stretched laminate 8 unrolled from a feeding apparatus 43 provided in relation to the dyeing apparatus 40 and immersed for an appropriate time in the dyeing solution at a solution temperature of 30° C., so that a resultant polarizing film 3 provided by the PVA layer has a single layer transmittance (T) of 40 to 44%.

In the above process, the dyeing solution 41 contains water as a solvent and iodine with a concentration of 0.30 wt % in order that the PVA layer 2 included in the stretched laminate 8 will not be dissolved. In addition, the dyeing solution 41 contains potassium iodide of 2.1 wt % for making it possible to dissolve iodine in water. The ratio of concentration of iodine to that of potassium iodide is 1:7. Describing in more detail, the laminate 8 is immersed for 60 seconds in the dyeing solution 41 with iodine concentration of 0.30 wt % and potassium iodide concentration of 2.1 wt % to form the dyed laminate 9 having iodine impregnated in the 5 μm-thick PVA layer 2' in which PVA molecules are oriented therein. In the example 1, immersion time of the stretched laminate 8 in the dyeing solution 41 with iodine concentration of 0.30 wt % and potassium iodide concentration of 2.1 wt % is varied for controlling the impregnated amount of iodine so that dyed laminates 9 having several different values of the single layer transmittance T and those of the polarization rate P are produced within the range of the single layer transmittance T of 40 to 44%.

(In-Boric-Acid-Solution Stretching Process (D))

In a second stage or in-boric-acid-solution stretching process (D), the dyed laminate 9 including the PVA layer 2 having iodine impregnated therein in a molecularly oriented state is further stretched to form an optical film laminate 10 including the PVA layer having iodine impregnated therein in a molecularly oriented state which provides a 3 µm-thick polarizing film 3. Particularly, using an in-boric-acid-solution stretching apparatus 50 comprising a boric acid solution pool 52 of boric acid solution 51 and a stretching unit 53, the dyed laminate 9 continuously delivered from the dyeing apparatus 40 is immersed in the boric acid solution 51 containing boric acid and potassium iodide at a solution temperature of 65° C., then is fed to the stretching unit 53 arranged in the in-boric-acid-solution stretching apparatus 50 for an end-free uniaxial stretching, to a stretching ratio of 3.3, to form the optical film laminate 10.

Describing in more detail, the boric acid solution 51 has been provided in a form containing 4 parts in weight of boric acid with respect to 100 parts in weight of water, and 5 parts in weight of potassium iodide with respect to 100 parts in weight of water. In the process, the dyed laminate 9 included amount of iodine impregnated therein is firstly immersed for 5 to 10 seconds in the boric acid solution 51. The dyed laminate 9 is then passed as it is through a plurality of pairs of rolls driven with different peripheral speeds so as to constitute the stretching unit of the in-boric-acid-solution stretching apparatus 50 for carrying out the end-free uniaxial stretching to a stretching ratio of 3.3 in 30 to 90 seconds. This stretching process has been effective to change the PVA layer in the dyed laminate 9 to a 3 µm-thick PVA layer having the iodine impregnated therein in a high-order molecularly oriented state in one direction in the form of a polyiodide ion complex. The PVA layer provides the polarizing film 3 in the optical film laminate 10.

As described above, in the example 1, there has been produced an optical film laminate 10 comprising a 3 µm-thick PVA layer integrally stretched with a crystallizable PET substrate, starting with a laminate 7 comprising a 7 µm-thick PVA layer 2 formed on the crystallizable PET substrate 1, by subjecting it to a preliminarily in-air stretching at a stretching temperature of 110° C. to form a stretched laminate 8, then subjecting the stretched laminate 8 to a dyeing process to thereby form a dyed laminate 9, the dyed laminate 9 being then stretched in boric acid solution at a temperature of 65° C., so that the total stretching ratio becomes 5.94. Such 2-stage stretching allows for high-order orientation of the PVA molecules in the PVA layer 2 formed on the crystallizable PET substrate 1 to form an optical film laminate comprising a 3 µm-thick PVA layer providing a polarizing film 3 having iodine impregnated therein during dyeing process with a high-order orientation in the form of a polyiodide ion complex. Preferably, the formed optical film laminate 10 is subjected to subsequent cleaning, drying and transferring processes to obtain a finished product. The details of processes for the cleaning (G), drying (H) and transferring (I) will be described in association with a manufacturing process incorporating insolubilization process in the example 4.

(General Description of Other Manufacturing Processes)

Figure 10:
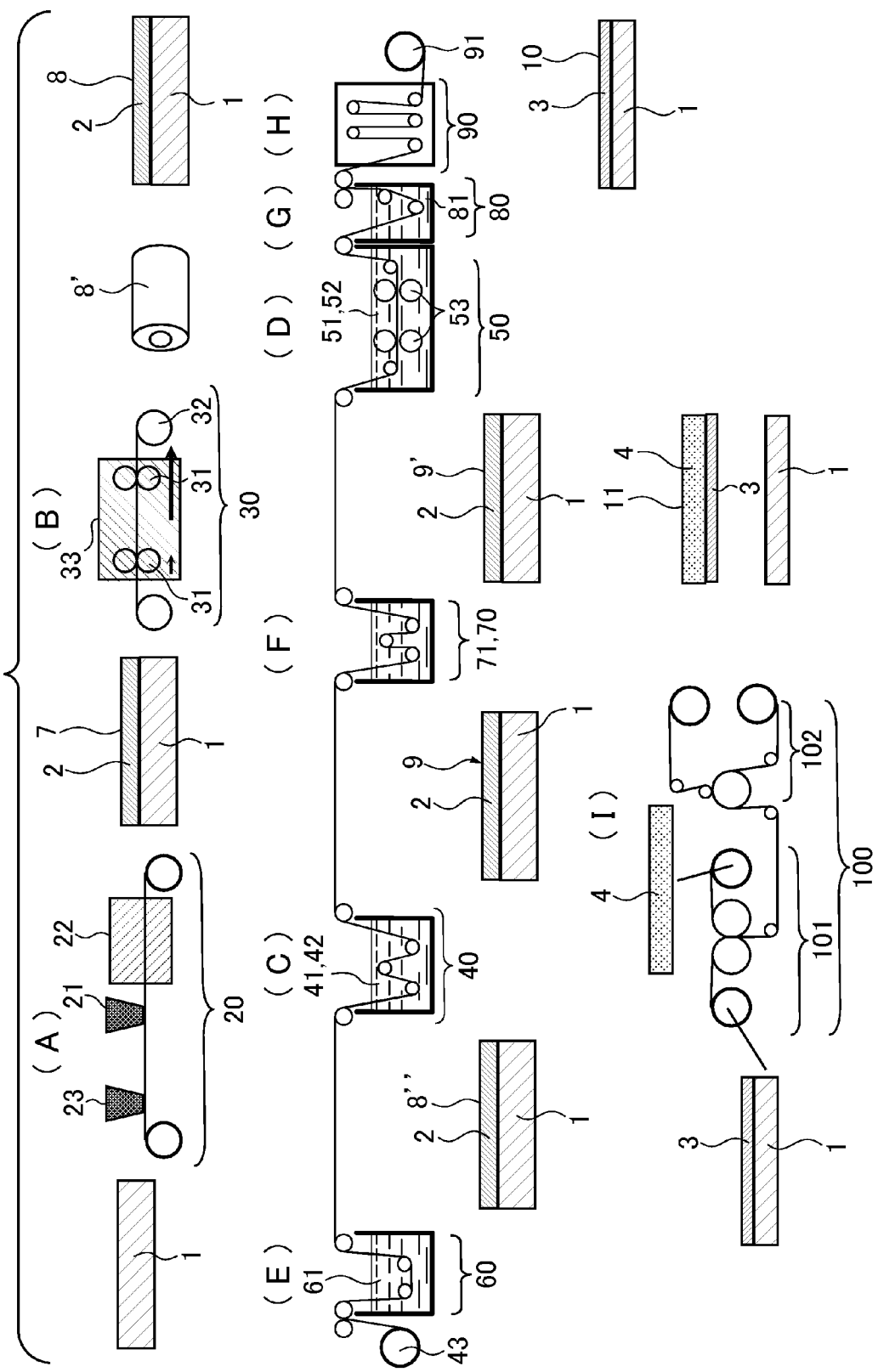
FIG. 10 is a schematic drawing showing a manufacturing process for producing an optical film laminate with insolubilization treatment.

Reference should now be made to FIG. 10. FIG. 10 is a schematic illustration of a method for manufacturing the optical film laminate 10 including the polarizing film 3 adopting an insolubilization process. Here, descriptions will be made with respect to a manufacturing process of the optical film laminate 10 including the polarizing film 3 in accordance with the example 4. As apparent in FIG. 10, the manufacturing process for the example 4 may be understood as being the one corresponding to the process for the example 1, but the first insolubilization is additionally incorporated before the dyeing process and the cross-linking process including the second insolubilization process before the in-boric-acid-solution stretching. In the present method, it can be interpreted that the laminate manufacturing process (A), the preliminary in-air stretching process (B), the dyeing process (C) and the in-boric-acid-solution stretching process (D) are identical to those in the manufacturing process of the example 1. Thus, descriptions on these processes are only briefly be made, and the first insolubilization process before dying process and the cross-linking process including the second insolubilization process before in-boric-acid-solution stretching will be primarily described.

(First Insolubilization process (E))

The first insolubilization process is an insolubilization process (E) carried out prior to the dyeing process (C). As in the manufacturing process in accordance with the example 1, the laminate 7 comprising the 7 µm-thick PVA layer 2 formed on the crystallizable PET substrate is produced in the laminate manufacturing process (A), then the laminate 7 including the 7 µm-thick PVA layer 2 is subjected to an in-air stretching process as shown by the preliminary in-air stretching process (B) to form the stretched laminate 8 including the 5 µm-thick PVA layer 2. Subsequently, the stretched laminate 8 is insolubilized to form the insolubilized stretched laminate 8. As a matter of fact, the insolubilized stretched laminate 8 includes an insolubilized PVA layer 2, is the laminate 8 being hereinafter referred as "an insolubilized stretched laminate 8'''".

More specifically, use is made of an insolubilizing apparatus 60 containing a boric acid insolubilizing solution 61, and the stretched laminate 8 is immersed for 30 seconds in the boric acid solution 61 under a solution temperature of 30° C. The boric acid insolubilizing solution 61 used in this process contains 3 parts in weight of boric acid with respect to 100 parts in weight of water. This process aims at insolubilizing the 5 µm-thick PVA layer included in the stretched laminate 8 so that the PVA layer is prevented from being dissolved at least during the immediately following dyeing process (C).

After insolubilizing the stretched laminate 8, different dyeing solutions has been prepared with iodine concentration varying in a range of 0.12 to 0.25 wt %, in contrast to the case of the example 1, and various dyed laminates 9 having different values of the single transmittance and those of the polarization rate have been produced, using these dyeing solutions and maintaining the immersion time of the insolubilized stretched laminate 8" in the dyeing solution constant for controlling the amount of the impregnated iodine so that the single transmittance of the finally formed polarizing film becomes 40 to 44%. Even after such immersing in the dyeing solutions with iodine concentration of 0.12 to 0.25 wt %, the PVA layers in the insolubilized stretched laminates 8" have not been dissolved.

(Cross-Linking Process Including Second Insolubilization (F))

Cross-linking process can be interpreted as including a function of the second insolubilization in view of the objects described in the followings. The cross-linking process aims at, firstly making the PVA layer in the dyed laminate 9 insoluble during the following in-boric-acid-solution stretching process (D), secondly stabilizing the dye impregnated in the PVA layer so that iodine in the PVA layer will not be eluted, and thirdly forming junction points by cross-linking molecules in the PVA layer. The second insolubilization accomplishes the first and the second aims among the above aims.

Cross-linking (F) is a process performed prior to the in-boric-acid-solution stretching process (D). The dyed laminate 9 formed in the dyeing process (C) is cross-linked to form a cross-linked dyed laminate 9' that includes a cross-linked PVA layer 2. Specifically, use is made of a cross-linking apparatus 70 containing a solution 71 which includes boric acid and potassium iodide (hereinafter referred as "boric acid cross-linking solution"), and the dyed laminate 9 is immersed for 60 seconds in the boric acid cross-linking solution 71 under a solution temperature of 40° C. to have the PVA molecules cross-linked in the PVA layer having iodine impregnated therein, to yield the cross-linked dyed laminate 9'. The boric acid cross-linking solution 71 in this process contains 3 parts in weight of boric acid with respect to 100 parts in weight of water and 3 parts in weight of potassium iodide with respect to 100 parts in weight of water.

In the in-boric acid solution stretching process (D), the cross-linked dyed laminate 9' is immersed in the boric acid solution under a solution temperature of 75° C. and subjected to an end-free uniaxial stretching process, to a stretching ratio of 3.3, to form the optical film laminate 10. Through the stretching process, the PVA layer 2 included in the dyed laminate 9' and having iodine impregnated therein has been converted to the 3 μm-thick PVA layer 2 which includes the impregnated iodine in the form of a polyiodide ion complex molecularly oriented in one direction with a high order orientation rate. This PVA layer provides the polarizing film 3 in the optical film laminate 10.

The example 4 has been prepared by firstly providing a laminate 7 comprising a 7 μm-thick PVA layer 2 formed on a crystallizable PET substrate 1, then subjecting the laminate 7 to an end-free uniaxial stretching to carry out the preliminary in-air stretching at a stretching temperature of 110° C. to the stretching ratio of 1.8 to form a stretched laminate 8. Then, the formed stretched laminate 8 is immersed in the boric acid solution under a solution temperature of 30° C. to insolubilize the PVA layer included in the stretched laminate to form an insolubilized stretched laminate 8".

The insolubilized stretched laminate 8" is immersed in dyeing solution containing iodine and potassium iodide under a solution temperature of 30° C. to form a dyed laminate 9 having iodine impregnated in the insolubilized PVA layer. Then, the dyed laminate 9 comprising the PVA layer having iodine impregnated therein is immersed for 60 seconds in the boric acid solution under a solution temperature of 40° C. to have PVA molecules in the PVA layer having iodine therein cross-linked to form the cross-linked dyed laminate 9'. Subsequently, the cross-linked dyed laminate 9' is immersed for 5 to 10 seconds in a boric acid cross-linking solution containing boric acid and potassium iodide for carrying out an in-boric-acid-solution stretching at a solution temperature of 75° C., and is subjected to an end-free uniaxial stretching in the solution for the in-boric-acid-solution stretching, to a stretching ratio of 3.3, to form the optical film laminate 10.

As described above, the process for the example 4 includes the 2-stage stretching consisting of the preliminary in-air stretching and the in-boric-acid-solution stretching, and the pre-processing consisting of the insolubilization before immersion in the dyeing pool and the cross-linking before the in-boric-acid-solution stretching, so that it is possible to manufacture the optical film laminate 10 in a stable manner, the laminate 10 including the 3 μm-thick PVA layer which provides the polarizing film in which the PVA molecules in the PVA layer 2 formed on the crystallizable PET substrate 1 are oriented with a high-order orientation rate and iodine molecules securely impregnated among the PVA molecules through the dyeing process are oriented therein with a high-order orientation rate in one direction in the form of an polyiodide ion complex.

(Cleaning Process (G))

The dyed laminate 9 or the cross-linked dyed laminate 9' in accordance with the example 1 or the example 4 is stretched in the in-boric-acid-solution stretching process (D), and then taken out of the boric acid solution 51. The taken out optical film 10 including the polarizing film 3 is preferably conveyed to a cleaning process (G) as it is. The cleaning process (G) aims at washing out unnecessary residuals depositing on a surface of the polarizing film 3. The cleaning process (G) may be omitted and the optical film 10 including the polarizing film 3 may be directly conveyed to a drying process (H). It should however be noted that, if the optical film laminate 10 is not sufficiently cleaned, boric acid may precipitate on the polarizing film 3 after drying process. Thus, the optical film laminate 10 is conveyed to a cleaning apparatus 80 and immersed for 1 to 10 seconds in a cleaning solution 81 containing potassium iodide under a solution temperature of 30° C. such that the PVA in the polarizing film 3 does not dissolve. Potassium iodide concentration in the cleaning solution 81 may be about 0.5 to 10 wt %.

(Drying Process (H))

The cleaned optical film laminate 10 is conveyed to a drying process (H) to be dried. Then, the dried optical film laminate 10 which is in the form of a continuous web is taken up by a winding apparatus 91 provided in relation to the drying apparatus 90 to provide a roll of the optical film laminate 10 including the polarizing film 3. Any appropriate process, such as natural drying, blow drying and thermal drying, may be adopted for the drying process (H). In both the examples 1 and 4, the drying process has been performed with warm air at a temperature of 60° C. for 240 seconds in the drying apparatus 90 provided in the oven.

(Laminating and Transferring Process (I))

The optical film laminate 10 comprising the 3 μm-thick polarizing film 3 formed on the crystallizable PET substrate is wound as a roll of the optical film laminate 10, and then is subjected to laminating and transferring steps which are carried out simultaneously in a laminating/transferring process (I) such as a process described in the followings. The manufactured polarizing film 3 is of a decreased thickness by being stretched and may be as thin as only 2 to 5 μm, such reduced thickness making it difficult to handle the polarizing film 3 as a single layer. Thus, the polarizing film 3 needs to be handled in the form of an optical film laminate 10 after it has been formed on the crystallizable PET substrate, or, as an optically functional film laminate 11 which is provided by laminating and transferring the polarizing film to another optically functional film 4 through a bonding agent.

In the laminating/transferring process (I) shown in FIG. 9 or FIG. 10, the optically functional film 4 is laminated to the optical film laminate 10 at a side of the polarizing film 3 through a bonding agent, and the crystallizable PET substrate is peeled from the polarizing film 3. Thus, the polarizing film 3 is transferred to the optically functional film 4, to form the optically functional film 11 which is then taken up into a roll. Specifically, the optical film laminate 10 is fed out by a feeding/laminating apparatus 101 included in a laminating/transferring apparatus 100, and laminated to the optical film laminate 10 at a side of the polarizing film 3 through a bonding agent, the polarizing film 3 being then peeled from the optical film laminate 10 to have the polarizing film 3 transferred to the optically functional film 4 by means of a winding/transferring apparatus 102, to thereby form the optically functional film laminate 11.

The optical film laminate 10 taken up into a roll by the winding apparatus 91 in the drying process (H) or the optically functional film laminate 11 formed in laminating/transferring process (I) can take wide varieties of structures.

Figure 11:
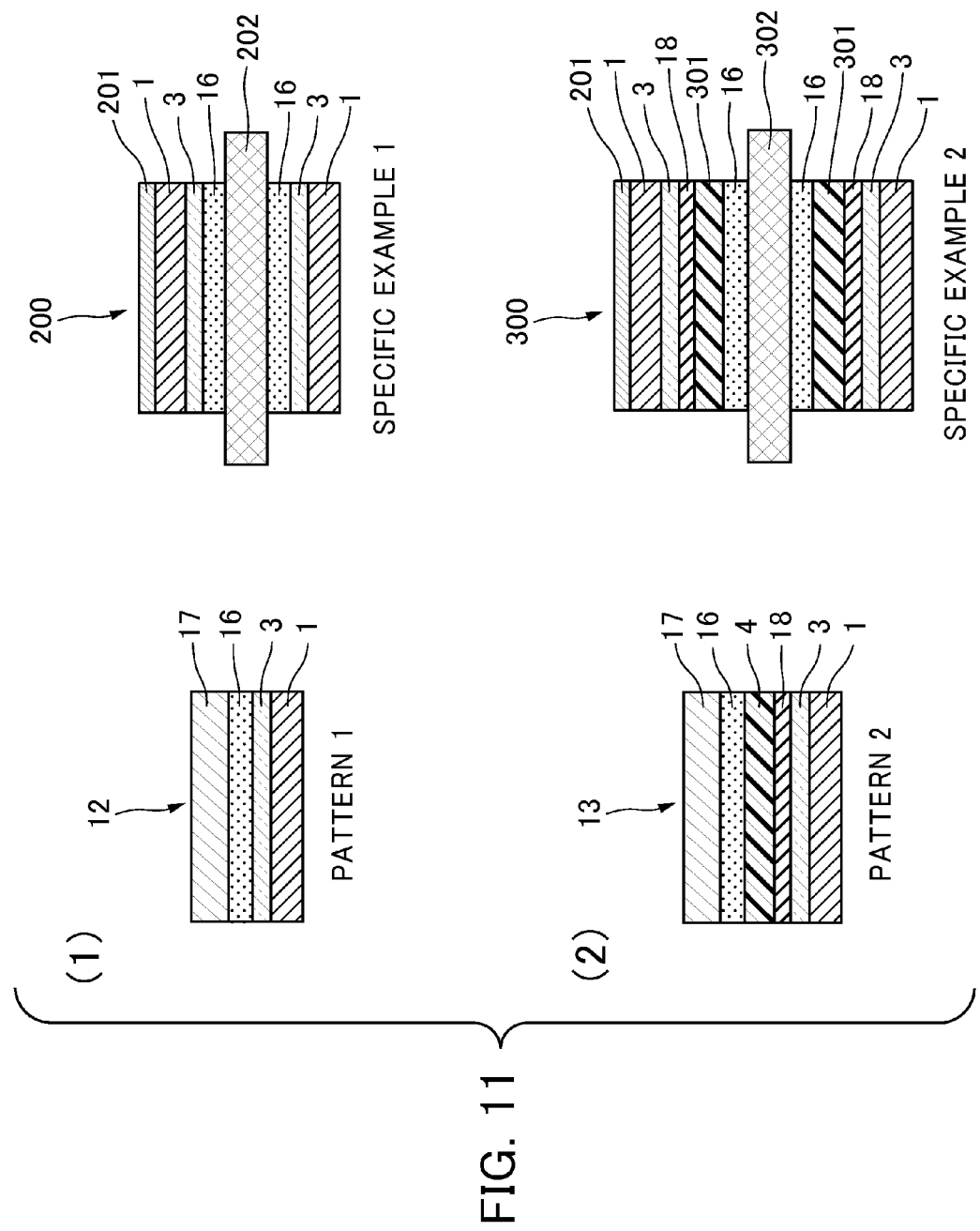
FIG. 11 shows examples of optical film laminate wherein the polarizing film is laminated/transferred.

FIG. 11 and FIG. 12 show varieties of structures of the optical film laminate 10 or the optically functional film 11 as typical patterns 1 to 4. In FIGS. 11(1) and (2) illustrating the patterns 1 and 2, there are shown in schematic sections laminated structures of an optical film laminate 12 and an optical film laminate 13 having sectional configurations which are different from that in the optical film laminate 10 shown in FIG. 9 or 10.

The optical film laminate 12 is includes a separator 17 which is laminated on the polarizing film 3 of the optical film laminate 10 through an adhesive agent layer 16. As shown in the specific example 1 in FIG. 11 (1), in the case where the crystallizable PET substrate 1 constitutes a protection film, the laminate 12 may be used as an optical film laminate on either a backlight side or a viewing side of, for example, a display panel 200 for an IPS-type liquid-crystal display television. In this case, two of the optical film laminates may be attached to both sides of the IPS liquid-crystal cell 202 respectively through the adhesive agent layers 16. In this configuration, a surface treatment layer 201 may generally be formed on the viewing side surface of the crystallizable PET substrate 1.

The optical film laminate 13 is constructed to include an optically functional film 4 which is attached to the polarizing film 3 of the optical film laminate 10 with a bonding agent layer 18, a separator 17 being attached to the optically functional film 4 with an adhesive agent layer 16. As shown in the specific example 2 in FIG. 11 (2), in the case where the optically functional film 4 is a biaxial phase difference film 301 with refraction indices nx, ny and nz along three orthogonal axes have relation of nx>ny>nz, the optical film laminate 13 may be used as an optically functional film laminate for use either on a backlight side or a viewing side of, for example, a display panel 300 for a VA-type liquid-crystal display television. In this case, the optical film laminates are attached to both sides of the VA type liquid-crystal cell 302 respectively with the adhesive agent layers 16. In this configuration, a surface treatment layer 201 may generally be formed on the viewing side surface of the crystallizable PET substrate 1. Both the optical film laminate 12 and the optical film laminate 13 are characterized in that the crystallizable PET substrate 1 is not peeled off the polarizing film 3 but is used as, for example, a protection film of the polarizing film 3.

In the patterns 3 and 4, there are shown in schematic sections structures of an optically functional film laminate 14 and an optically functional film laminate 15 which have sectional configurations different from that of the optically functional film laminate 11 shown in FIG. 9 or 10. The optically functional film laminate 14 includes a polarizing film 3 which has in advance been transferred to the optically functional film 4 by having the crystallizable PET substrate 1 peeled therefrom and attached to the optically functional film 4 with a bonding layer 18. The optically functional film laminate 14 further includes a separator 17 which is attached through an adhesive agent layer 16 to the surface of the polarizing film 3 opposite to the surface from which the crystallizable PET substrate 1 has been peeled. As shown in the specific example 3 in FIG. 12 (1), in the case where the optically functional film 4 is comprised of a protection film made of a TAC film 401, the laminate 14 may be used as an optically functional film laminate for use either on a backlight side or a viewing side of, for example, a display panel 400 for an IPS-type liquid-crystal display television. In this case, the optically functional film laminates attached to both sides of the IPS liquid-crystal cell 402 respectively with the adhesive agent layers 16. In this configuration, a surface treatment layer 201 may generally be formed on the viewing side surface of the TAC film 401.

The optically functional film laminate 15 includes a second optically functional film 5 which is attached through a second bonding agent 18 to the surface of the polarizing film 3 opposite to the surface from which the crystallizable PET substrate 1 has been peeled in transferring the polarizing film 3 to the optically functional film 4 using a first bonding agent 18 to form a laminate, a separator 17 being attached to thus formed laminate with the adhesive agent 16. As shown in the specific example 4 in FIG. 12 (2), in the case where the optically functional film 4 is comprised of a TAC film 401 and the second optically functional film 5 is a biaxial phase difference film 501 having refraction indices nx, ny and nx along three orthogonal axes with a relation of nx>nz>ny, the optically functional film laminate 15 may be used as an optically functional film laminate for use on a backlight side of, for example, a display panel 500 for an IPS-type liquid-crystal display television. In this case, such optically functional film laminate is attached to the backlight side of the IPS liquid-crystal cell 502 with the adhesive agent layer 16. Both the optically functional film laminate 14 and the optically functional film laminate 15 are characterized in that the laminate used in the laminate is the one from which the crystallizable PET substrate 1 has been peeled off at the same time when the polarizing film 3 is transferred to the optically functional film 4.

The optically functional film laminate 15 may further be used as an anti-reflection film (a circular polarizing plate) for preventing surface reflection in a display apparatus or interface reflection at an interface of members in the display apparatus, by forming the second optically functional film as a λ/4 phase difference film 602. Particularly, in the case where the optically functional film 4 is in the form of an acrylic resin film 601, where the second optically functional film 5 constitutes a λ/4 phase difference film 602, or where the polarizing film 3 and the λ/4 phase difference film are laminated with a lamination angle between the absorption axis of the polarizing film 3 and the slow axis of the λ/4 phase difference film being set to 45±1 degrees, then the laminate 15 may be used as an anti-reflection film of, for example, an organic electroluminescence (EL) display 600 as shown in the specific example 5 in FIG. 12. In this case, such optically functional film laminate may be attached to the viewing side of the organic EL panel 603 with the adhesive agent layer 16. In this configuration, a surface treatment layer 201 may generally be formed on the viewing side of the acrylic resin film 601. Both the optically functional film laminate 14 and the optically functional film laminate 15 are characterized in that the laminate used in the laminate is the one from which the crystallizable PET substrate 1 has been peeled off at the same time when the polarizing film 3 is transferred to the optically functional film 4.

It should further be noted that the optically functional film 4 in each of the layers constituting respective ones of the optically functional film laminates 11, 14 and 15, and the optical film laminate 13 is not limited to those described above. The optically functional film may be a polarizing film protection film comprised of a TAC film or an acrylic resin, a phase difference film such as a biaxial phase difference film (for example, a film having refraction indices nx, ny and nz with a relation of nx>ny>nz, or nx>nz>ny) or a uniaxial phase difference film (for example, a film having refraction indices nx, ny and nz with a relation of nx=ny>nz, nx=nz>ny), a brightness enhancement film, or a diffusion film. In addition, the adhesive agent layer 16 or the bonding agent layer 18 may be of any appropriate adhesive agent or bonding agent. Representatively, the adhesive agent layer may be of an acrylic adhesive agent and the bonding agent layer may be of a vinyl alcohol type bonding agent.

(Optical Properties of Polarizing Film Manufactured Under Various Conditions)

(1) Improvement in the Optical Properties of the Polarizing Film with Insolubilization (Examples 1 to 4)

It has been clarified in the descriptions with reference to FIG. 8 that, each of the polarizing films manufactured based on the examples 1 to 4 has been effective to overcome the technical objects of the present invention, and that the optical properties of each of the polarizing films satisfy the required performance for a display of liquid-crystal display television using a large size display element. Further, as is clear from FIG. 8, the optical properties of the polarizing film of the example 1 without insolubilization are inferior to any of optical properties of the polarizing films of the examples 2 to 4 with the first and/or the second insolubilization.

The optical properties of the examples have the following relation in terms of superiority: The example 4 with the first and the second insolubilization>the example 2 with only the second insolubilization>the example 3 with only the first insolubilization>the example 1. It is to be further noted that improvements can be accomplished in the optical properties of the polarizing film or those of the optical film laminate including the polarizing film, by applying the first and/or the second insolubilization process in addition to the manufacturing process of the optical film laminate 10.

(2) Influence of the Thickness of the PVA Type Resin Layer on the Optical Properties of the Polarizing Film (Examples 4 and 5)

In the example 4, the 7 μm-thick PVA layer has been stretched[[d]] to finally obtain the 3 μm-thick PVA layer in the optical film laminate, whereas in the example 5, the 12 μm-thick PVA layer has been stretched to finally obtain the 5 μm-thick PVA layer in the optical film laminate. This polarizing film in the example 5 has been manufactured under the same conditions as in the example 4 except the thickness.

Figure 13:
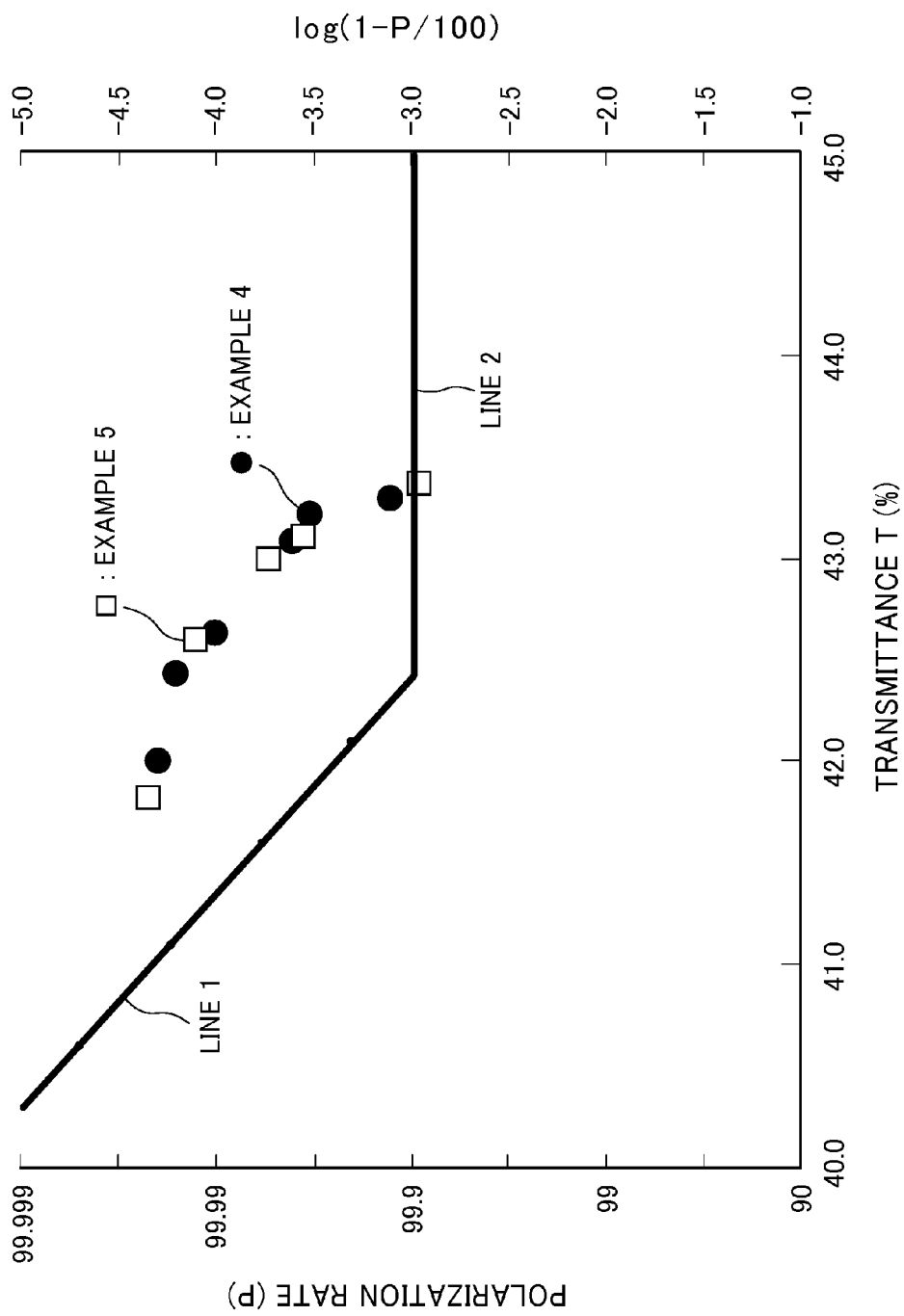
FIG. 13 is a comparative diagram showing the polarizing property of the polarizing films (in accordance with differences in PVA layer thickness formed on the crystallizable PET substrate) of the examples 4 and 5.

Reference is now made to the diagram in FIG. 13. It is noted that there is no significant difference among the optical properties of the polarizing films manufactured in accordance with the examples 4 and 5. It is understood from the results that the thickness of the PVA type resin layer does not affect the optical properties.

(4) Improvement in the Optical Properties of the Polarizing Film Provided by the Preliminary in-Air Stretching Ratio (Examples 4, 6 and 7)

In the example 4, the stretching ratio of the first stage preliminary in-air stretching has been 1.8 and that of the second stage in-boric-acid-solution stretching has been 3.3, whereas in the example 6, the stretching ratios of the first stage preliminary in-air stretching and the second stage in-boric-acid solution stretching have respectively been 1.5 and 4.0, and in the example 7, the ratios have respectively been 2.5 and 2.4. The polarizing films of the examples 4, 6 and 7 have been manufactured under the same conditions including the stretching temperature of 110° C. and the boric acid solution temperature of 75° C. as in the example 4 except the stretching ratios. The total stretching ratio in each one of the examples 6 and 7 has been 6.0, which is not noticeably different from the total stretching ratio of 5.94 in the example 4.

Figure 14:
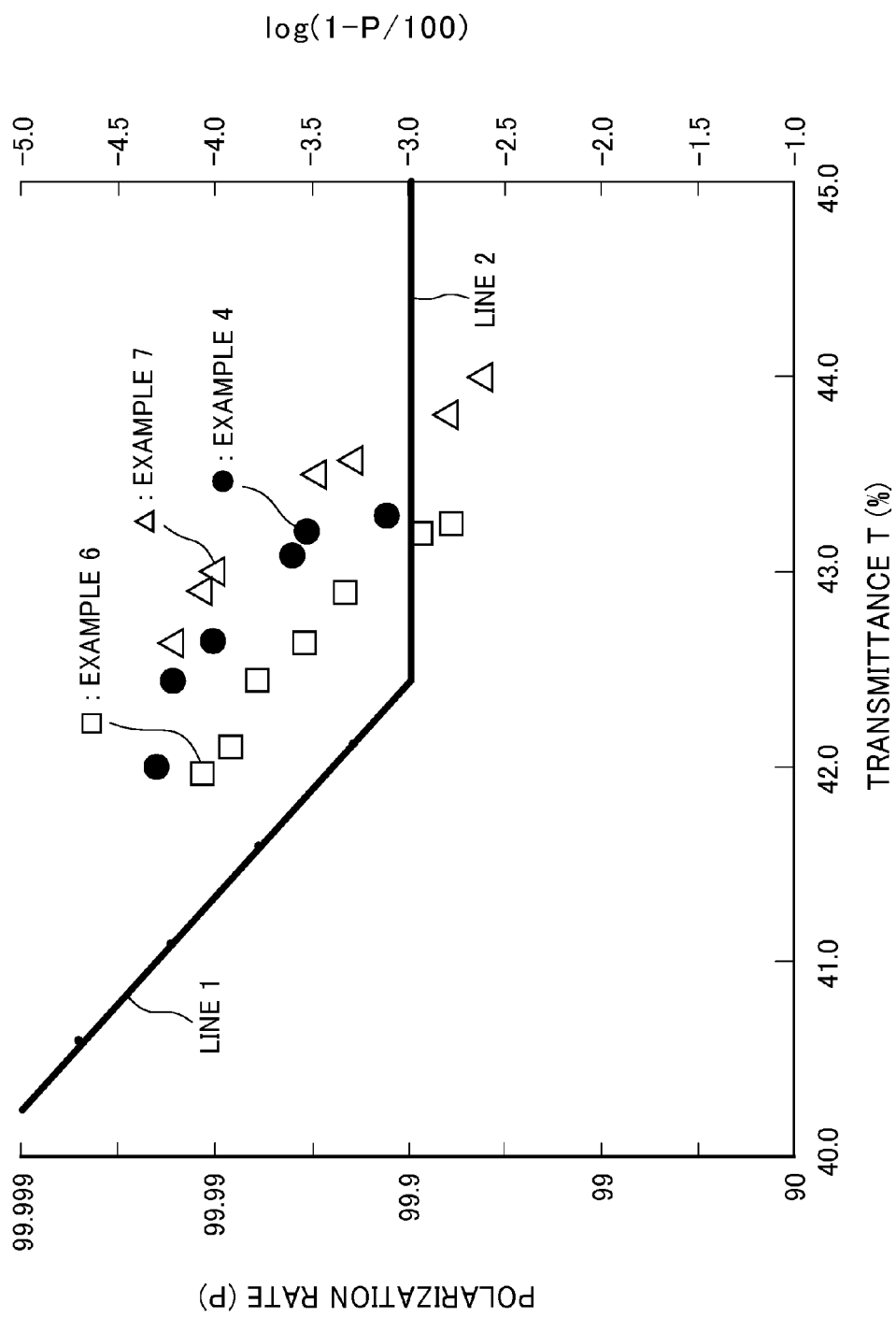
FIG. 14 is a comparative diagram showing the polarizing property of the polarizing films (in accordance with differences in stretching ratio of preliminary in-air stretching) of the examples 4, 6 and 7.

Reference is now made to FIG. 14. It is noted that each of the polarizing films of the examples 6 and 7, as well as the example 4, has overcome the technical objects of the present invention, and has optical properties satisfying the required performance that the present invention aims at. The optical property of the example 7 has the best properties among the examples, followed by the example 4, and the example 6. It shows that when the stretching ratio of the first stage preliminary in-air stretching is in a range of 1.5 to 2.5, even if the total stretching ratio after the second stage in-boric-acid-solution stretching is similar, the optical properties of the polarizing film are improved with an increase in the stretching ratio of the first stage preliminary in-air stretching.

Thus, by increasing the stretching ratio of the first stage preliminary in-air stretching in the manufacturing process of the optical film laminate 10 including the polarizing film 3, the optical properties of the optical film laminate including the manufactured polarizing film can further be improved.

(5) Improvement of the Optical Properties of the Polarizing Film Provided by the Preliminary in-Air Stretching Temperature (Examples 4, 8 and 9)

In the example 4, the preliminary in-air stretching temperature has been controlled at 110° C., whereas in the examples 8 and 9, the stretching temperature have respectively been controlled at 95° C. and 105° C., which are higher than the glass transition temperature (Tg), 80° C. of PVA. These polarizing films have been manufactured under the same conditions including, for example, the preliminary in-air stretching ratio of 1.8 and the in-boric-acid-solution stretching ratio of 3.3 as in the example 4 except the stretching temperature. The stretching temperature of example 4 under the in-boric-acid-solution stretching is 110° C. These polarizing films have been manufactured under the same conditions as in the example 4 except the differences in stretching temperature of 95° C. or 105° C.

Figure 15:
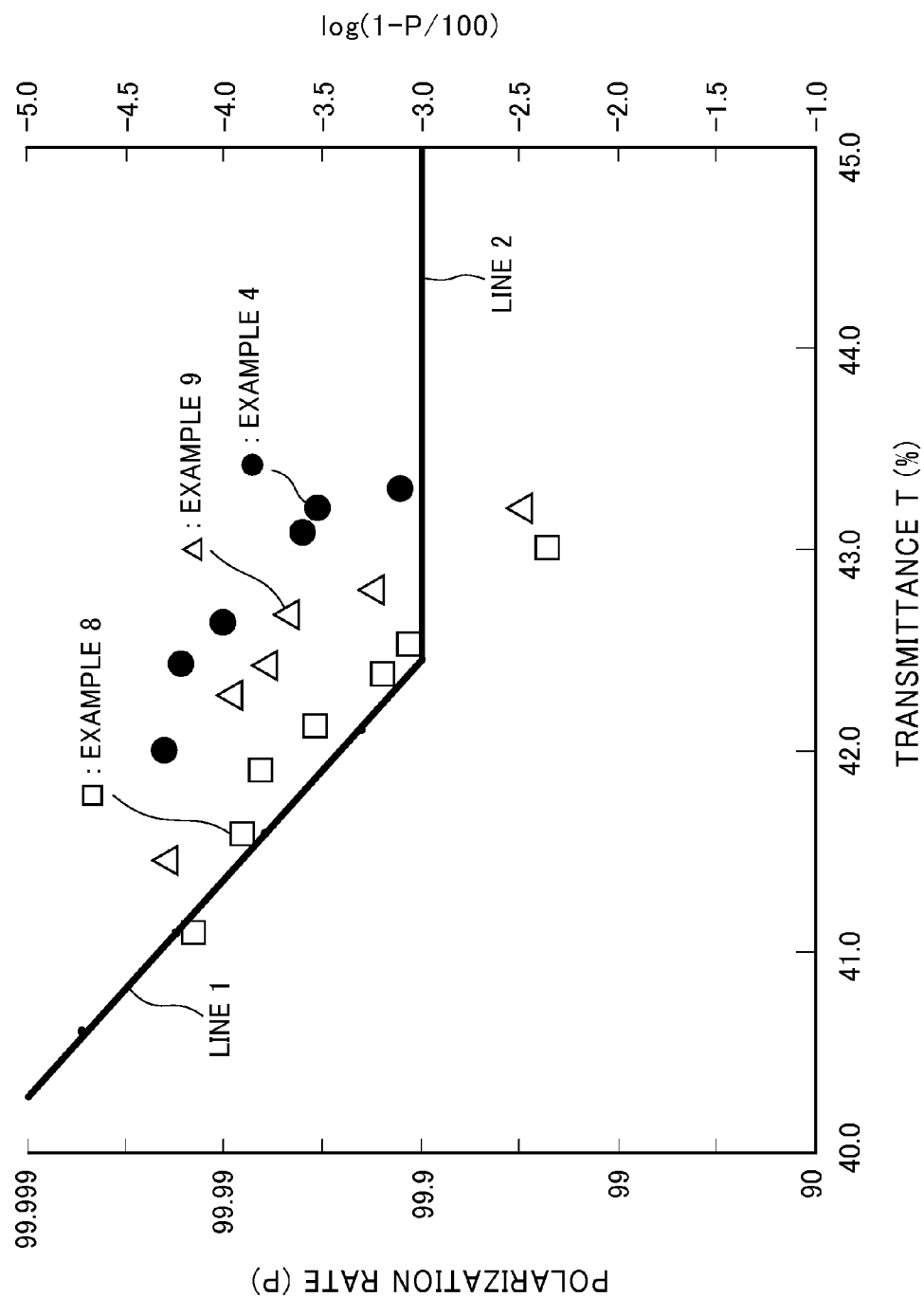
FIG. 15 is a comparative diagram of polarizing property of polarizing films (in accordance with differences in stretching temperature of preliminary in-air stretching) of examples 4, 8 and 9.

Reference is now to be made to FIG. 15. It is noted that each of the polarizing films of the examples 8 and 9 has overcome the technical problems of the present invention, and has optical properties satisfying the required performance that the present invention aims at. The optical properties of the example 4 are the most superior among the examples, followed by the example 9, and the example 8. It shows that when the stretching temperature of the first stage preliminary in-air stretching is controlled to be higher than the glass transition temperature 80° C. and then sequentially increased from 95° C. to 110° C., even if the total stretching ratio after the second stage in-boric acid solution stretching is similar, the optical properties of the polarizing film can be improved with increase of the stretching temperature of the first stage preliminary in-air stretching.

Thus, it is to be understood that by raising the stretching temperature of the first stage preliminary in-air stretching in the manufacturing process of the optical film laminate including a polarizing film 3, the optical properties of the manufactured polarizing film can further be improved.

(6) Improvement of the Optical Property of the Polarizing Film Provided by the Total Stretching Ratio (Examples 4, 10 to 12)

In the example 4, the stretching ratio of the first stage preliminary in-air stretching has been 1.8 and the second stage in-boric acid solution stretching ratio has been 3.3, whereas in the examples 10 to 12, only the in-boric acid solution stretching ratio has been changed to 2.8, 3.1 and 3.6, respectively This indicates that the process is controlled to provide the total stretching ratio for each of the examples 10 to 12 of 5.04 (about 5.0), 5.58 (about 5.5) and 6.48 (about 6.5), respectively. The total stretching ratio of example 4 is 5.94 (about 6.0). These polarizing films have been manufactured under the same conditions as in the example 4 except the differences in total stretching ratio of 5.0, 5.5, 6.0 and 6.5.

Figure 16:
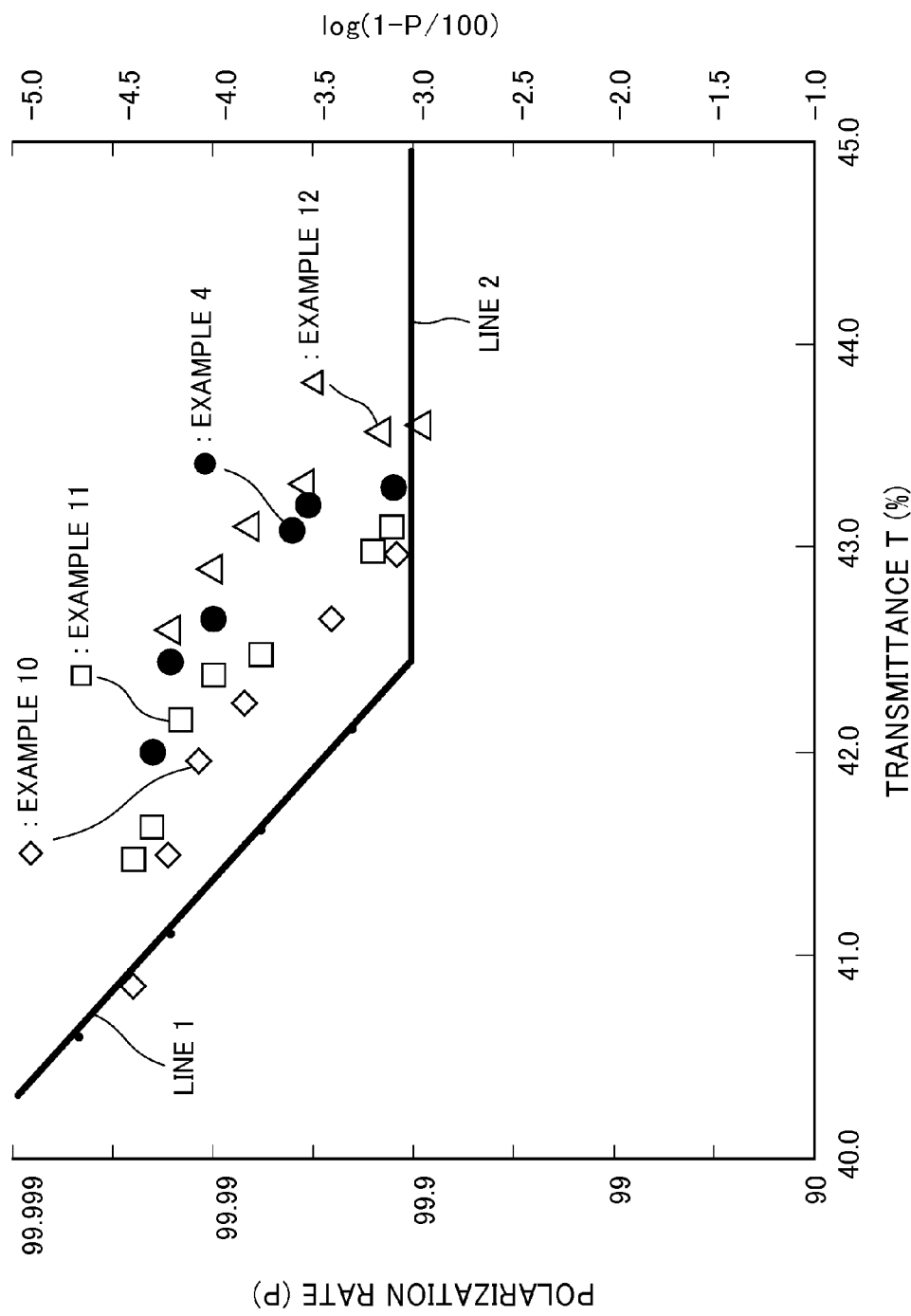
FIG. 16 is a comparative diagram of polarizing property of polarizing films (in accordance with differences in total stretching ratio) of examples 4, 10 to 12.

Reference is made herein to FIG. 16. It is noted that each of the polarizing films of the examples 4, 10 to 12 has overcome the technical problems which the present invention is aimed to overcome, and has optical properties satisfying the required performance that the present invention aims at. The optical properties of the example 12 are the most superior among the examples, followed by the example 4, followed by the example 11, and the example 10. It shows that when the stretching ratio of the first stage preliminary in-air stretching is controlled to be 1.8 and only the in-boric-acid solution stretching ratio is varied in the range from 2.8 to 3.6 to provide the sequentially increasing total stretching ratio of 5.0, 5.5, 6.0 and 6.5, the optical properties of the polarizing film can be improved with increase of the total stretching ratio.

Thus, by raising the total stretching ratio accomplished by the preliminary in-air stretching and the in-boric-acid-solution stretching in the manufacturing process of the optical film laminate 10 including the polarizing film 3, the optical property of the optical film laminate 10 including the manufactured polarizing film may further be improved.

(7) Improvement of the Optical Properties of the Polarizing Film in Accordance with a Control of the Total Stretching Ratio in the End-Fixed Uniaxial Preliminary in-Air Stretching (Examples 13 to 15)

In the examples 13 to 15, optical film laminates have been manufactured under the same conditions as in the example 4 except the stretching process in the preliminary in-air stretching. In the example 4, the preliminary in-air stretching has adopted an end-free uniaxial stretching, whereas in each of the examples 13 to 15, an end-fixed uniaxial stretching has been adopted for the preliminary in-air stretching.

In the examples 13 to 15, the stretching ratio has been accomplished in each case by the preliminary in-air stretching controlled at 1.8 and only that of the in-boric-acid-solution stretching has been varied in the respective cases to the values 3.3, 3.9 and 4.4, respectively, to provide the total stretching ratio of 5.94 (about 6.0) in the example 13, 7.02 (about 7.0) in the example 14, and 7.92 (about 8.0) in the example 15. Other manufacturing conditions for the examples 13 to 15 have been the same as in the example 4.

Figure 17:
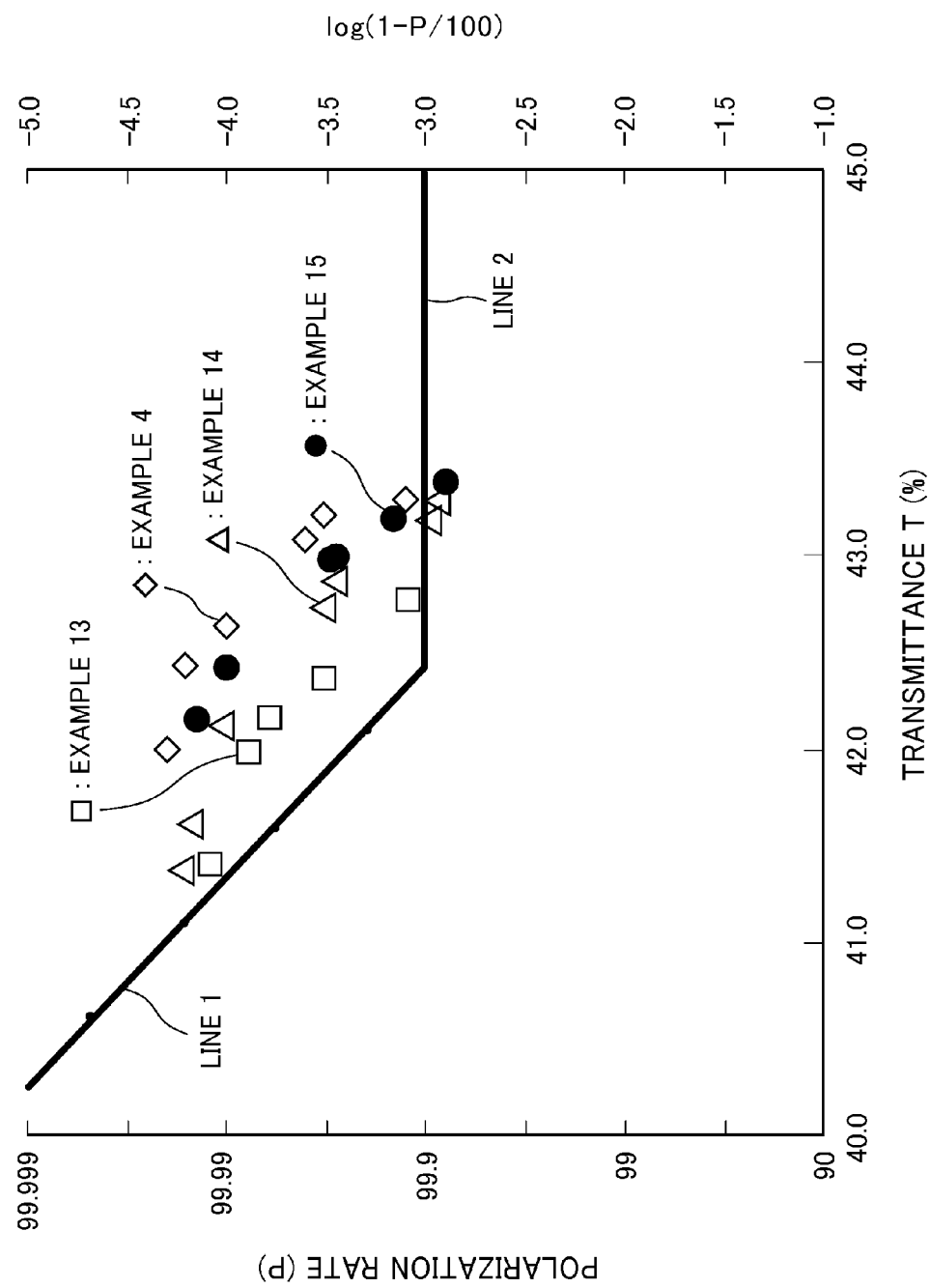
FIG. 17 is a comparative diagram showing the polarizing property of the polarizing films (in accordance with differences in total stretching ratio of end-fixed preliminary in-air stretching) of examples 13 to 15.
Figure 18:
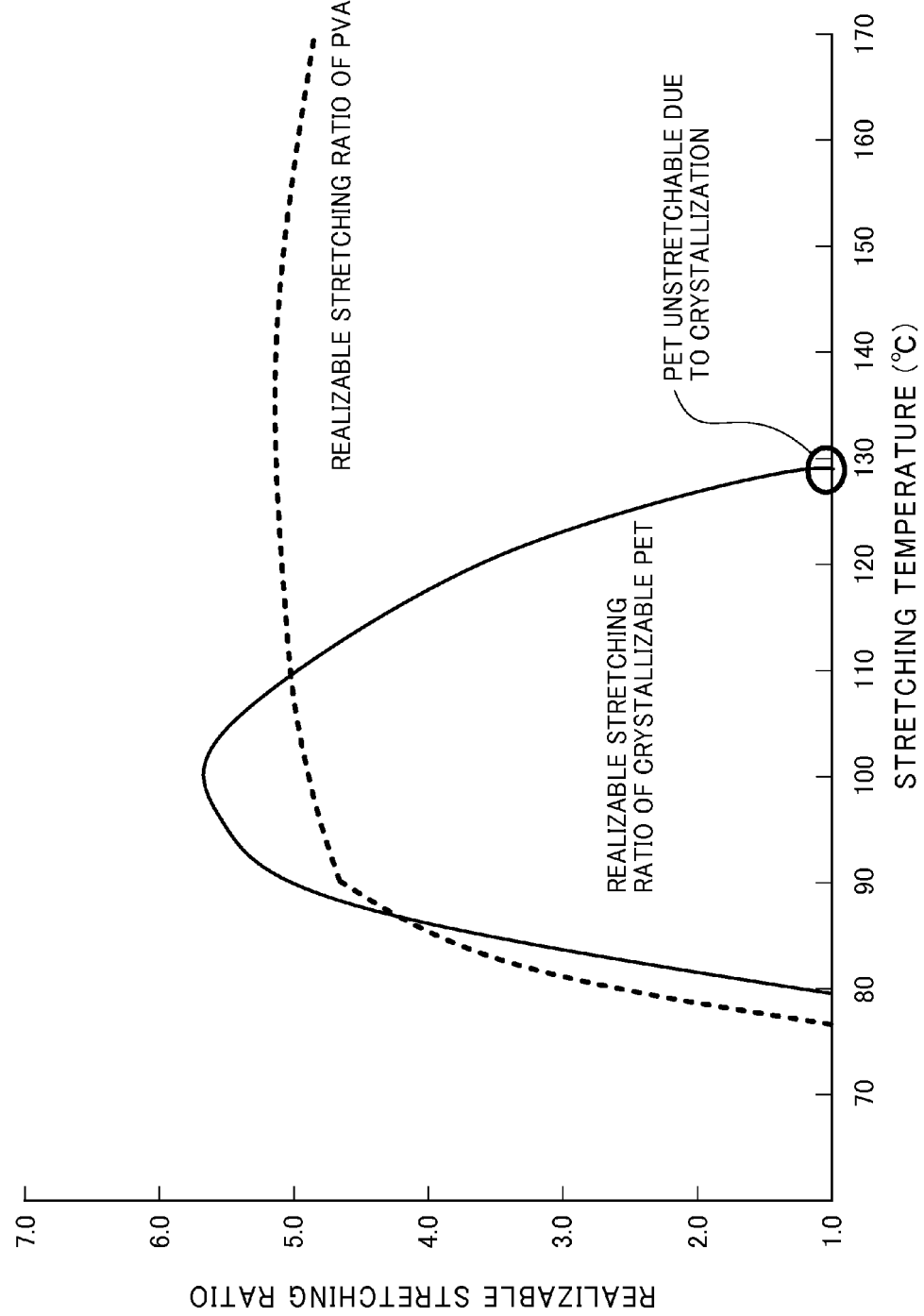
FIG. 18 is a schematic diagram showing the relationship between the stretching temperature and the realizable stretching ratio under in-air stretching of each of the crystallizable PET and the PVA type resin.
Figure 19:
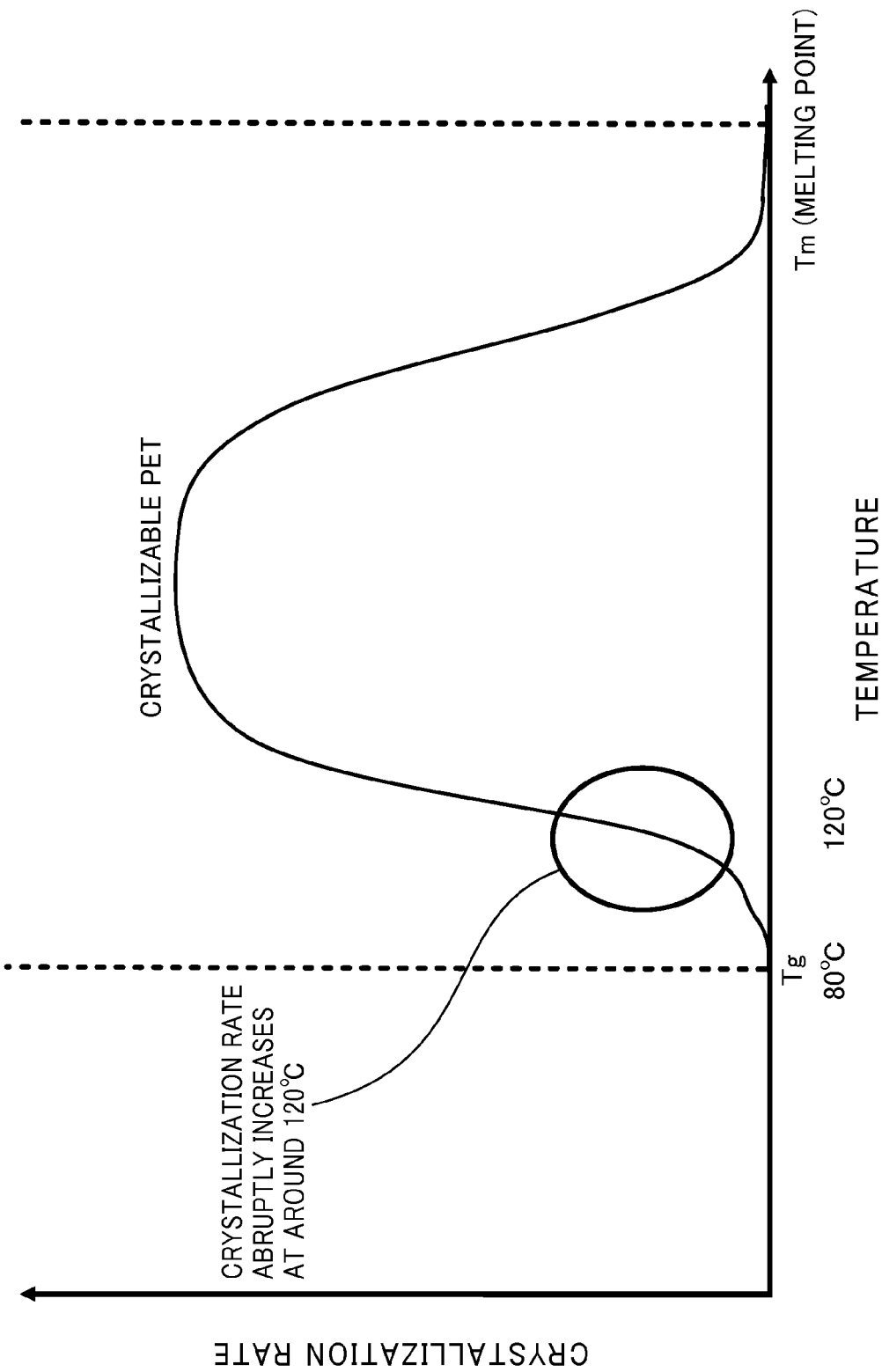
FIG. 19 is a schematic diagram showing changes in crystallization rate in accordance with temperature changes between glass transition temperature (Tg) and melting point temperature (Tm) of the crystallizable PET.
Figure 20:
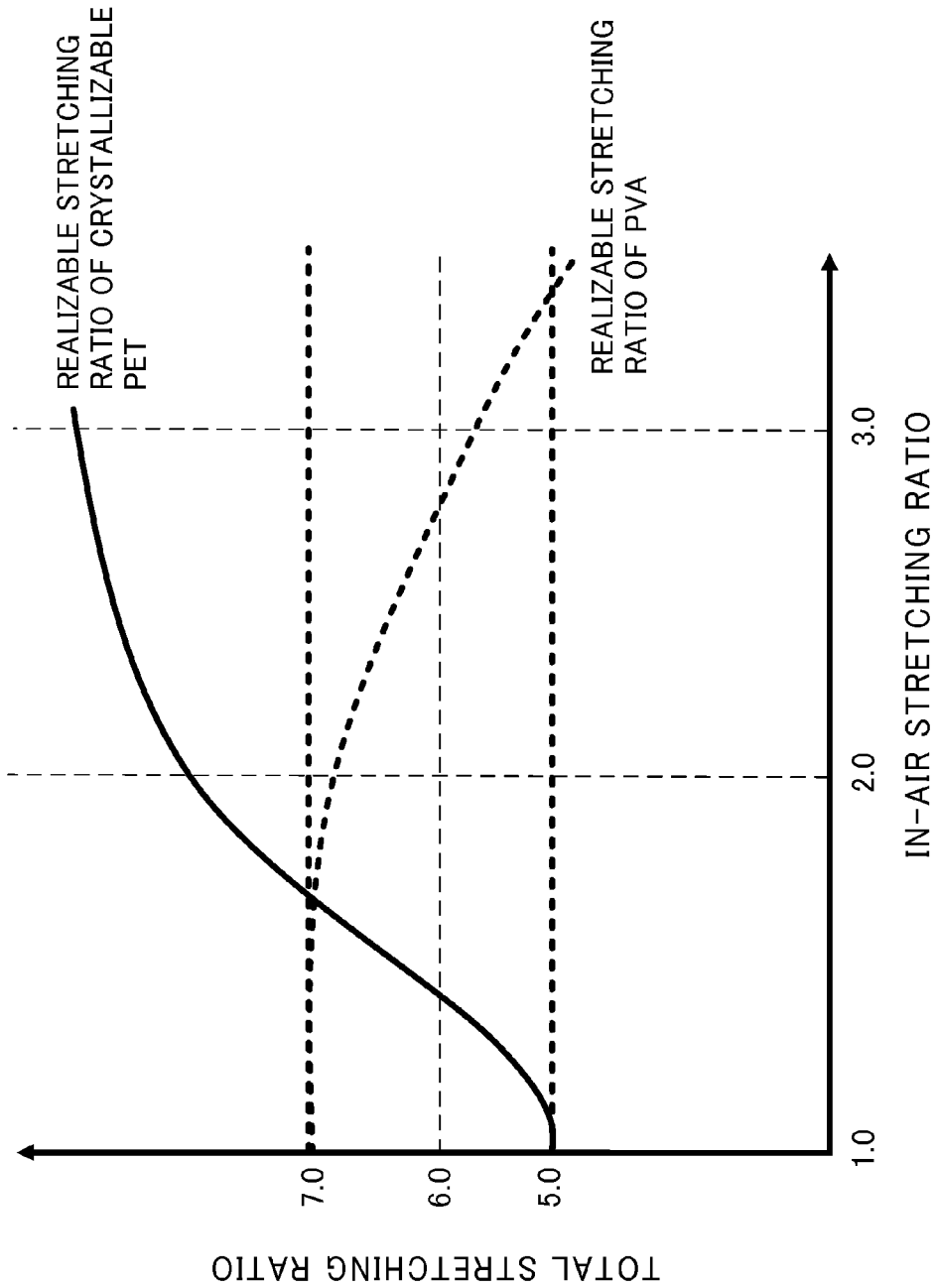
FIG. 20 is a schematic diagram showing the relationship between the stretching ratio under the preliminary in-air stretching and the total stretching ratio based on the combination of the preliminary in-air stretching and in-boric acid stretching of each of the crystallizable PET and the PVA type resin.
Figure 21:
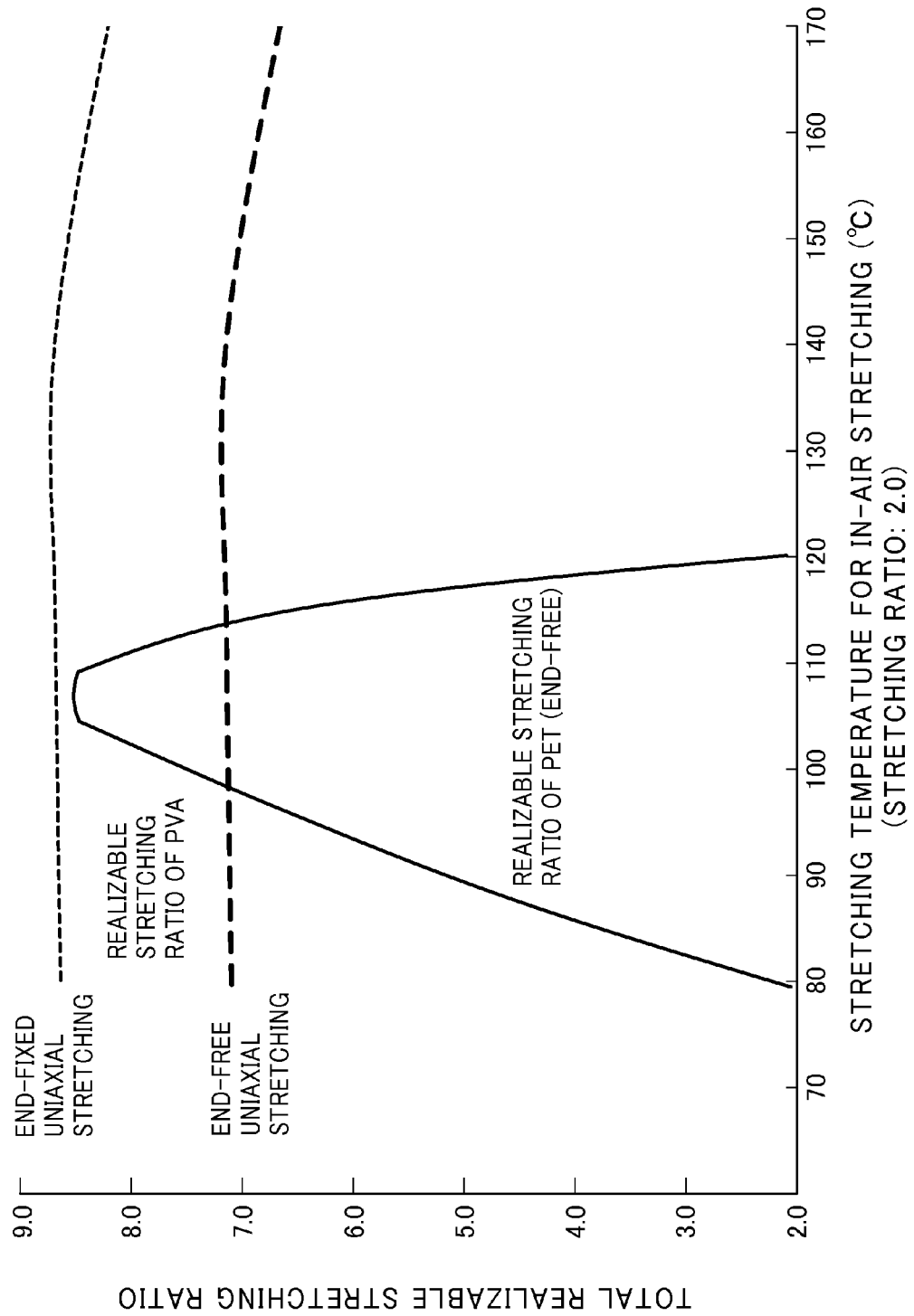
FIG. 21 is a schematic diagram showing the relationship between the stretching temperature under the preliminary in-air stretching and the total realizable stretching ratio when the crystallizable PET and the PVA type resin are subjected to the preliminary in-air stretching to attain a stretching ratio of 2.0.
Figure 22:
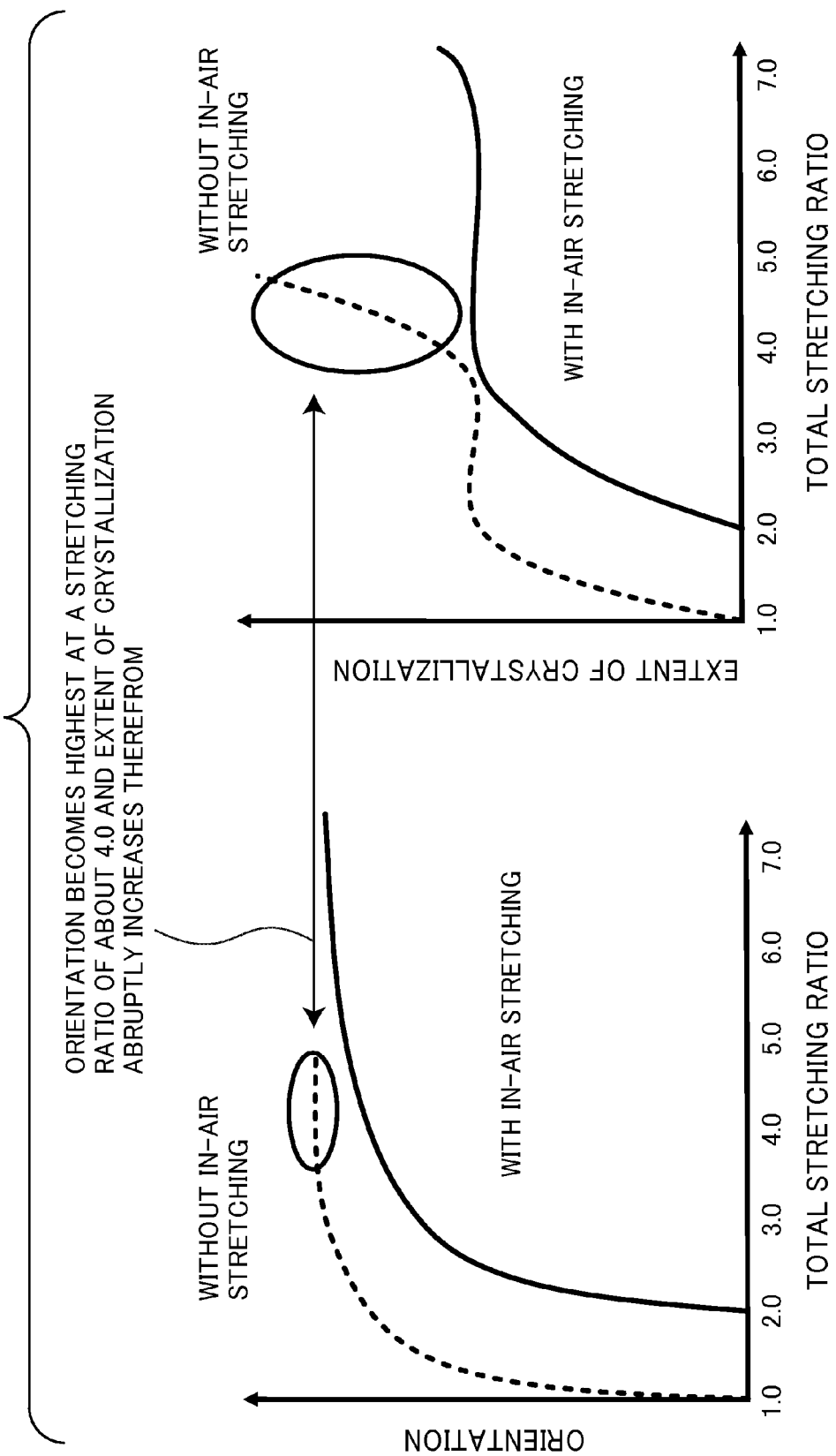
FIG. 22 is a schematic diagram showing the relationships between the total stretching ratio and the molecular orientation, and the extent of crystallization of the crystallizable PET used as the thermoplastic resin substrate.
Figure 23:
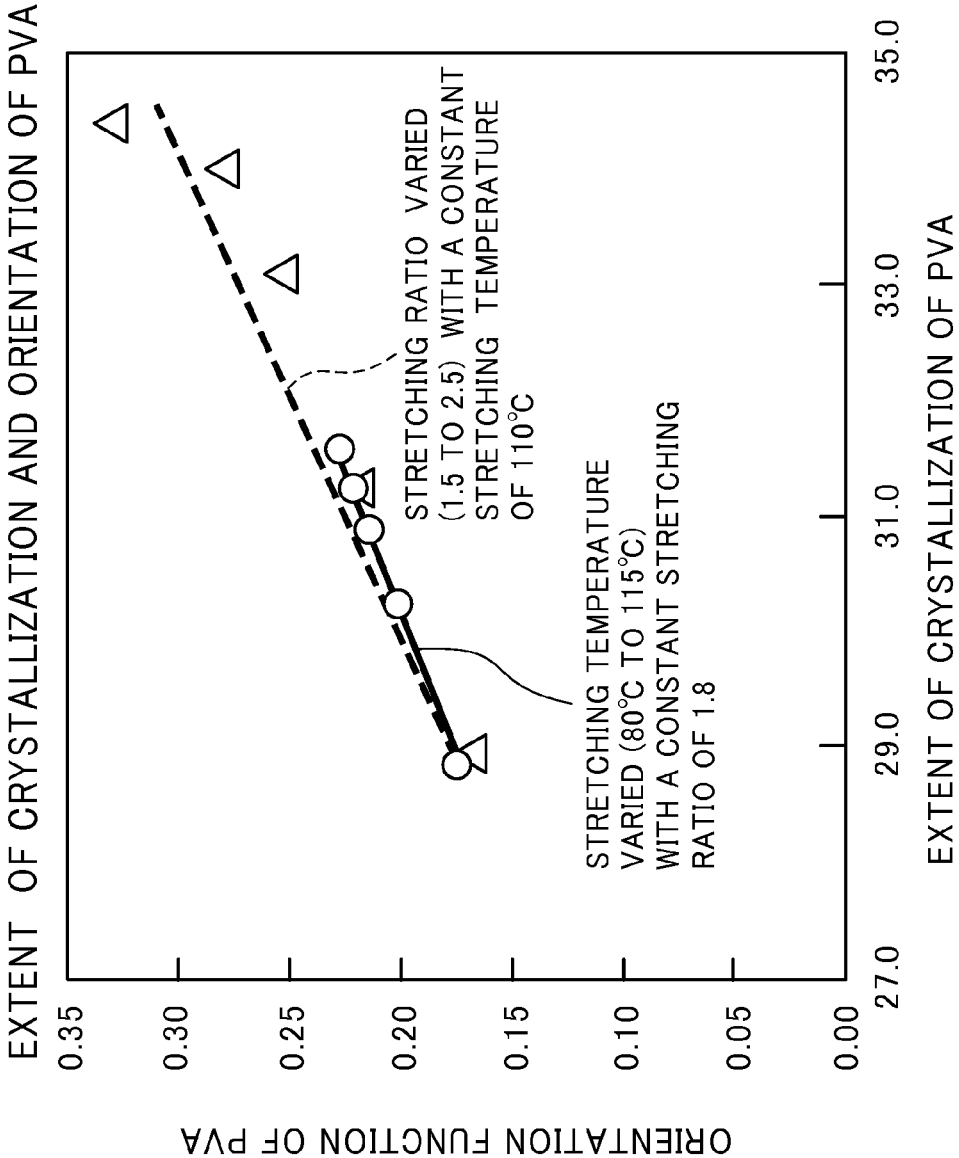
FIG. 23 is a diagram showing the relationship between the extent of crystallization and the orientation function of PVA type resin.
Figure 24:
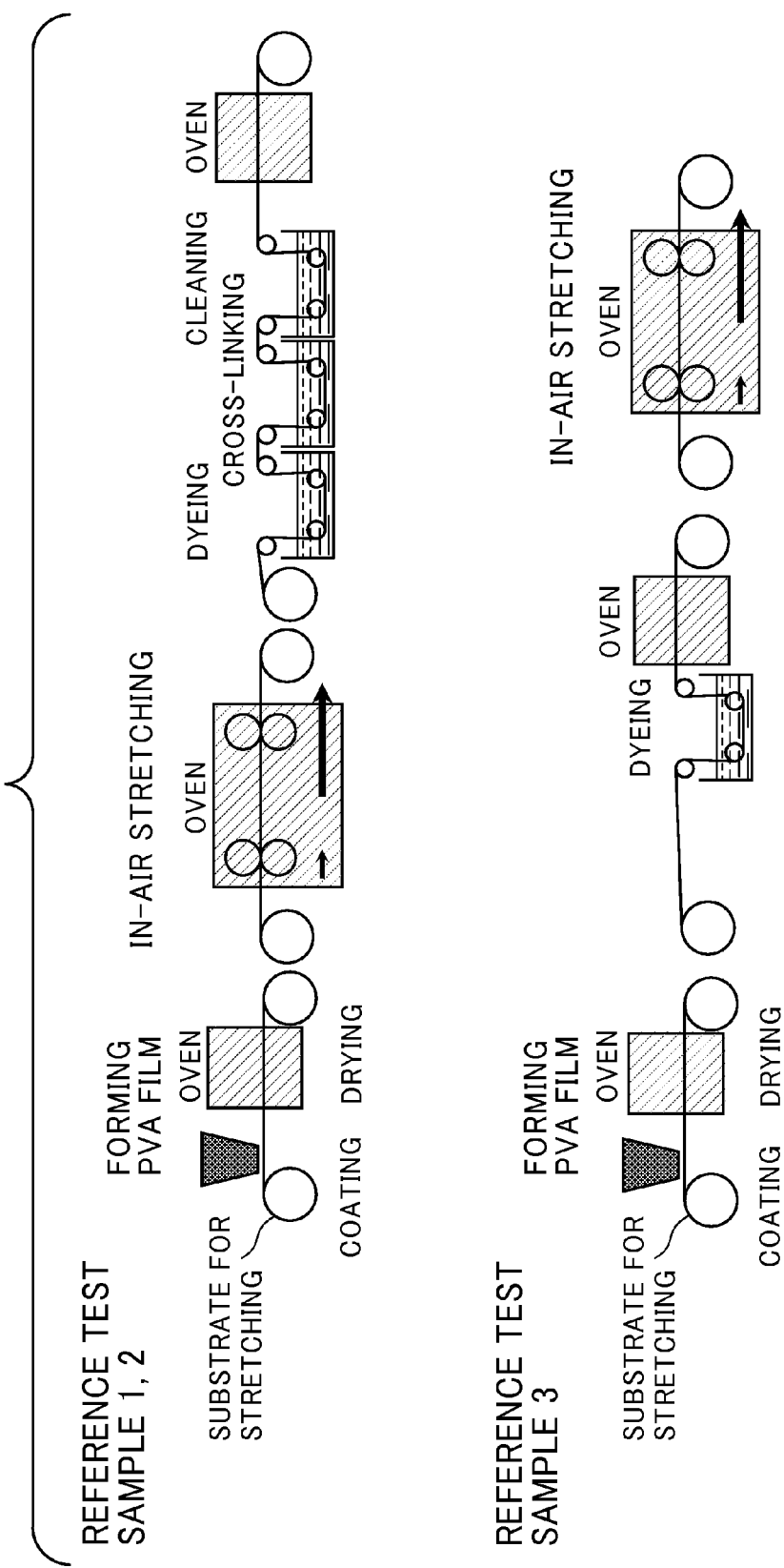
FIG. 24 is a schematic drawing showing examples of manufacturing process of polarizing film using the thermoplastic resin substrate.
Figure 25:
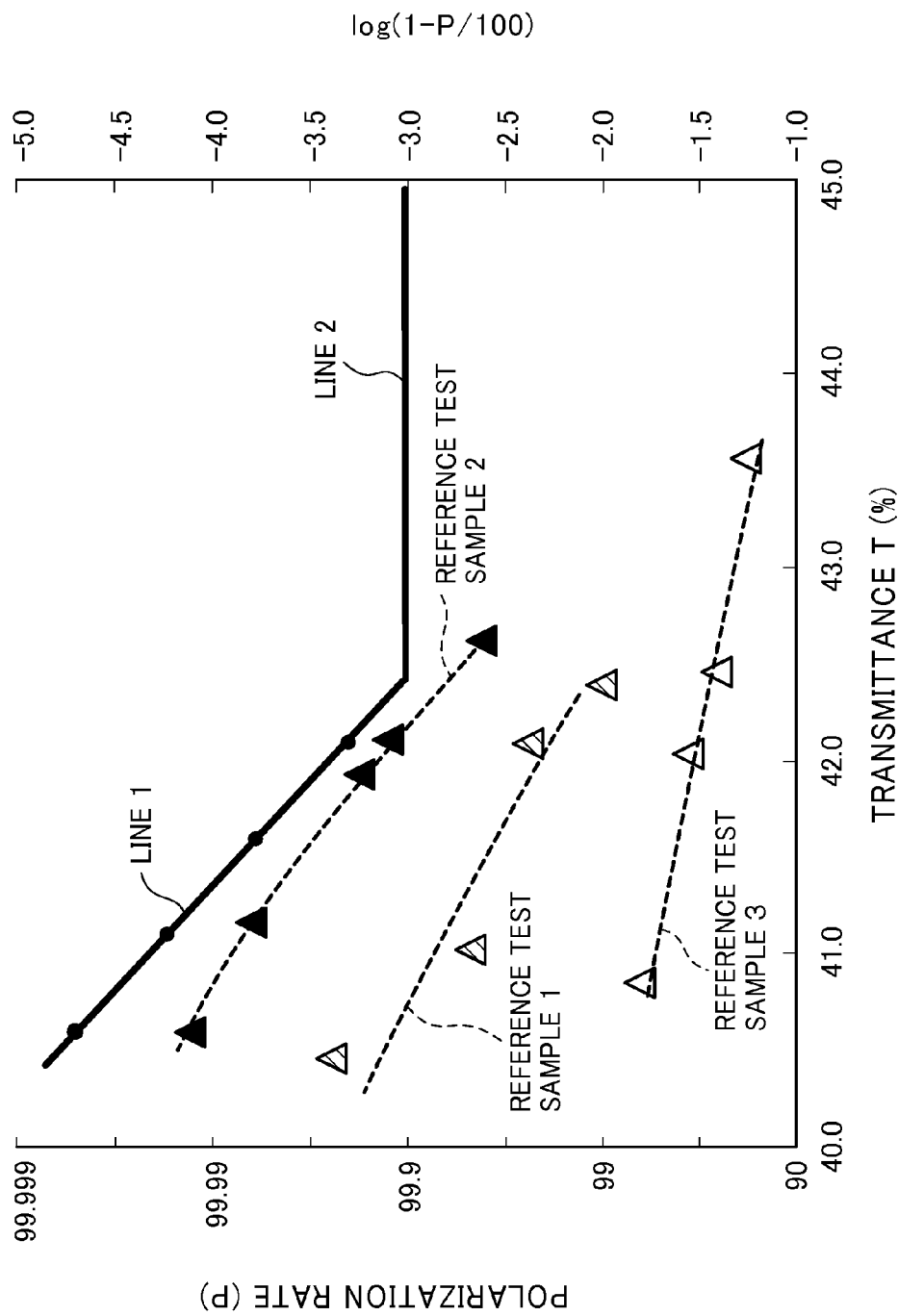
FIG. 25 is a diagram showing the polarizing property of the polarizing films in accordance with the reference test samples 1 to 3.

Reference is now to be made to FIG. 17. It is noted that each of the polarizing films of the examples 13 to 15 has overcome the technical problems which the present invention is aimed to overcome, and has optical properties satisfying the required performance that the present invention aims at. The optical properties of the example 15 are the most superior among the examples, followed by the example 14, and the example 13. It shows that when the stretching ratio of the in-air stretching is controlled to be 1.8 and only the in-boric acid solution stretching ratio is varied to 3.3, 3.9 and 4.4 to provide the total stretching ratio to increase as 6.0, 7.0 and 8.0, the optical properties of the polarizing film can be improved with increase of the total stretching ratio.

Thus, by raising the total stretching ratio obtained by the end-fixed uniaxial preliminary in-air stretching and the in-boric-acid-solution stretching in the manufacturing process of the optical film laminate 10 including the polarizing film 3, the optical properties of the optical film laminate 10 including the manufactured polarizing film can further be improved. Further, it has been confirmed that the total stretching ratio can be increased by adopting an end-fixed uniaxial preliminary in-air stretching for the first stage in-air preliminary stretching, as compared with a process wherein an end-free uniaxial stretching is adopted for the first stage preliminary in-air stretching.

EXAMPLES

FIG. 26 shows a list of manufacturing conditions of the polarizing films or the optical film laminates including the polarizing films in accordance with the examples 1 to 15.

Example 1

A continuous web of substrate produced from a crystallizable ester type thermoplastic resin comprising amorphous polyethylene terephthalate film (A-PET) (NOVACLEAR from Mitsubishi Plastics, Inc, having the glass-transition temperature of 80° C.) (hereinafter referred as "crystallizable PET") has been used to form a laminate comprising a crystallizable PET substrate and polyvinyl alcohol (hereinafter referred as "PVA") layer in accordance with the following procedures. It should be noted that the glass transition temperature of PVA is 80° C.

First, a crystallizable PET substrate 1 having a thickness of 200 μm has been prepared together with a PVA solution having a PVA concentration of 4 to 5 wt % which has been prepared by dissolving powders of PVA of a degree of polymerization of 1000 or higher and a degree of saponification of 99% or higher in water. Then, the PVA solution has been applied to the 200 μm-thick crystallizable PET substrate in the form of a thin coating layer, and dried at a temperature of 50 to 60° C., to form a 7 μm-thick PVA layer on the crystallizable PET substrate. Hereinafter, is the product formed as above is referred as "a laminate including a 7 μm-thick PVA layer formed on a crystallizable PET substrate," or "a laminate including a 7 μm-thick PVA layer," or simply as "a laminate."

The laminate including the 7 μm-thick PVA layer has been subjected to the following process including a 2-stage stretching comprised of a preliminary in-air stretching and an in-boric-acid-solution stretching to produce a 3 μm-thick polarizing film. Through the first stage preliminary in-air stretching, the laminate including the 7 μm-thick PVA layer has been stretched together with the crystallizable PET substrate to form a stretched laminate including a 5 μm-thick PVA layer, which will hereinafter be referred as "a stretched laminate." Describing in more detail, the stretched laminate has been produced from the laminate including the 7 μm-thick PVA layer by subjecting it to an end-free uniaxial stretching by means of the stretching apparatus arranged in the oven maintained at a stretching temperature of 110° C. to attain a stretching ratio of 1.8. Through this stretching process, the PVA layer included in the stretched laminate has been converted into a 5 μm-thick PVA layer having PVA molecules oriented therein.

Next, the stretched laminate has been subjected to a dyeing process whereby iodine has been impregnated in the 5 μm-thick PVA layer which has PVA molecules in an oriented state to produce a laminate having a dyed PVA layer, which hereinafter will be referred as "a dyed laminate." Describing in more detail, the dyed laminate contains iodine impregnated in the PVA layer of the stretched laminate, and is formed by immersing the stretched laminate for an appropriate time in a dyeing solution at a solution temperature of 30° C. containing iodine and potassium iodide, to thereby convert the PVA layer into a polarizing film having a single layer transmittance (T) of 40 to 44%. In the process, use has been made of a dyeing solution containing water as a solvent and iodine at a concentration in a range of 0.12 to 0.30 wt %, and potassium iodide of 0.7 to 2.1 wt %, the ratio of concentration of iodine to that of potassium iodide being 1:7.

It is to be noted that potassium iodide is required in order to have iodine dissolved in water. More in detail, the stretched laminate was immersed for 60 seconds in the dyeing solution having iodine concentration of 0.30 wt % and potassium iodide concentration of 2.1 wt % to form a dyed laminate having iodine impregnated in the 5 μm-thick PVA layer which includes PVA molecules in an oriented state. In the example 1, immersion time of the stretched laminate in the dyeing solution having iodine concentration of 0.30 wt % and potassium iodide concentration of 2.1 wt % has been varied for controlling the amount of iodine impregnated in the PVA layer, so that the polarizing film constituted by the PVA layer possesses a single layer transmittance of 40 to 44%, and that variously different dyed laminates with different single layer transmittance values and different polarization rates are obtained.

In the second stage of the in-boric-acid-solution stretching, the dyed laminate has further been stretched together with the crystallizable PET substrate to form an optical film laminate including the PVA layer providing a 3 μm-thick polarizing film. Hereinafter, the laminate thus formed will be referred as "an optical film laminate." Describing in more detail, the optical film laminate has been formed from the dyed laminate by transporting the dyed laminate through a stretching apparatus arranged in a processing apparatus having a bath of boric acid solution containing boric acid and potassium iodide at a solution temperature of 65° C. to 85° C., was and subjecting it to an end-free uniaxial stretching to attain a stretching ratio of 3.3. More in detail, the boric acid solution temperature has been controlled to 65° C. The boric acid solution contained 4 parts in weight of boric acid with respect to 100 parts in weight of water, and 5 parts in weight of potassium iodide with respect to 100 parts in weight of water.

In the process, the dyed laminate having the controlled amount of impregnated iodine has first been immersed in the boric acid solution for 5 to 10 seconds. The dyed laminate has then been transported in the state it is immersed in the solution through a plurality of pairs of rolls driven at different peripheral speeds to provide the stretching apparatus in the processing apparatus for carrying out the end-free uniaxial stretching to attain a stretching ratio of 3.3 in 30 to 90 seconds. Through this stretching, the PVA layer included in the dyed laminate is converted into a 3 μm-thick PVA layer having iodine impregnated therein with a high-order orientation in one direction in the form of a polyiodide ion complex. The PVA layer provides the polarizing film in the optical film laminate.

As described above, in the example 1, the laminate including the 7 μm-thick PVA layer formed on the crystallizable PET substrate has first been subjected to a preliminarily in-air stretching at a stretching temperature of 110° C. to form the stretched laminate, then the stretched laminate has been dyed to form the dyed laminate, the dyed laminate having been subjected to an in-boric-acid-solution stretching at a stretching temperature of 65° C., to attain the total stretching ratio of 5.94, to thereby form the optical film laminate including the 3 μm-thick PVA layer which has been stretched together with the crystallizable PET substrate. Through such 2-stage stretching, it has become possible to attain a high-order orientation of the PVA molecules in the PVA layer formed on the crystallizable PET substrate to form the optical film laminate including the 3 μm-thick PVA layer which finally constitutes the polarizing film having iodine impregnated therein through the dyeing process with a high-order orientation in the form of a polyiodide ion complex.

Although not an essential process for manufacturing an optical film laminate, the optical film has been taken out of the boric acid solution, and then cleaned with potassium iodide solution to remove any boric acid deposited on the surface of the 3 μm-thick PVA layer formed on the crystallizable PET substrate. Subsequently, the cleaned optical film laminate has been dried with warm air at a temperature of 60° C. in a drying process. The cleaning process aims at improving appearance by washing out boric acid deposition.

Although similarly not an essential process for manufacturing an optical film laminate, in laminating/transferring process, bonding agent was applied on the surface of the 3 μm-thick PVA layer formed on the crystallizable PET substrate and an 80 μm-thick triacetylcellulose film has been attached thereto through the bonding agent, and thereafter the crystallizable PET substrate has been peeled to have the 3 μm-thick PVA layer transferred to the 80 μm-thick triacetylcellulose film.

Example 2

In the example 2, as in the example 1, a laminate has at first provided by forming a 7 μm-thick PVA layer on a crystallizable PET substrate, then the laminate including the 7 μm-thick PVA layer has been subjected to a preliminary in-air stretching, to a stretching ratio of 1.8 to thereby form a stretched laminate, and thereafter the stretched laminate has been immersed in a dyeing solution containing iodine and potassium iodide at a solution temperature of 30° C. to form a dyed laminate including a PVA layer having iodine impregnated therein.

In the example 2, in contrast to the example 1, a cross-linking process has additionally been carried out by immersing the dyed laminate for 60 seconds in the boric acid cross-linking solution at a solution temperature of 40° C. for the purpose of cross-linking PVA molecules in the PVA layer having iodine impregnated therein. The boric acid cross-linking solution in this process has contained 3 parts in weight of boric acid with respect to 100 parts in weight of water and 3 parts in weight of potassium iodide with respect to 100 parts in weight of water.

The cross-linking process in the example 2 is considered to provide at least 3 technical effects. The first is an insolubilization for preventing the reduced thickness PVA layer in the dyed laminate from being dissolved during the following in-boric-acid-solution stretching. The second is the dye stabilization for preventing the iodine impregnated in the PVA layer from being eluted. The third is the function of forming junction points by cross-linking the molecules in the PVA layer.

The method in the example 2 has further included a process in which the cross-linked dyed laminate has then been immersed in the stretching pool containing an in-boric acid solution at a solution temperature of 75° C., which is higher than the stretching temperature of 65° C. in the example 1, to stretch the laminate to a stretching ratio of 3.3 as in the example 1, to thereby form an optical film laminate. It should further be noted that, each of cleaning, drying and laminating/transferring process in the example 2 had been the same as that in the example 1.

To clarify the technical meritorious effect attained by the cross-linking process which has been conducted prior to the in-boric-acid-solution stretching, the non-cross-linked dyed laminate in the example 1 has been immersed in the in-boric-acid-solution stretching pool at a solution temperature of 65 to 75° C., to find that the PVA layer included in the dyed laminate dissolved in the solution in the stretching pool so that the stretching process has not been able to be carried out.

Example 3

In the example 3, as in the example 1, a laminate has first been prepared by forming a 7 μm-thick PVA layer on a crystallizable PET substrate, then the laminate including the 7 μm-thick PVA layer has been subjected to a preliminary in-air stretching to attain a stretching ratio of 1.8, to thereby form a stretched laminate.

In the example 3, in contrast to the example 1, an insolubilizing process has been additionally incorporated, for insolubilizing the PVA layer in the stretched laminate and having PVA molecules oriented, the insolubilizing process being carried out by immersing the stretched laminate for 30 seconds in boric acid solution at a solution temperature of 30° C. The boric acid insolubilizing solution in this process has contained 3 parts in weight of boric acid with respect to 100 parts n weight of water. The technical effect obtained by the insolubilization process in the example 3 is that the PVA layer in the stretched laminate is insolubilized so that it will not be eluted at least during the following dyeing process.

In the example 3, the insolubilized and stretched laminate has then been immersed, as in the example 1, in a dyeing solution containing iodine and potassium iodide at a solution temperature of 30° C. to form a dyed laminate including a PVA layer having iodine impregnated therein. Subsequently, the dyed laminate has been immersed in the in-boric acid solution stretching pool at a solution temperature of 65° C. which is the same as that in the example 1, to stretch the laminate to a stretching ratio of 3.3 as in the example 1, to thereby form an optical film laminate. It is further to be noted that each of the cleaning, drying and laminating/transferring processes in the example 3 has been the same as that in the example 1.

To clarify the technical meritorious effect attained by the insolubilizing process which is carried out prior to the dyeing process, the non-insolubilized stretched laminate in the example 1 has been dyed to form a dyed laminate, then the dyed laminate has been immersed in the in-boric-acid-solution stretching pool at a solution temperature of 65 to 75° C., to find that the PVA layer in the dyed laminate dissolved in the solution of the stretching pool so that the laminate has not been stretchable.

When the non-insolubilized stretched laminate in the example 1 has been immersed in a dyeing solution containing water as solvent and iodine concentration being changed in a range of 0.12 to 0.25 wt %, but other conditions being unchanged, the PVA layer included in the stretched laminate has dissolved in the dyeing pool so that the laminate cannot be dyed. However, when the insolubilized stretched laminate in the example 3 has been used, the PVA layer has not been dissolved even at the iodine concentration in the range of 0.12 to 0.25 wt % so that the dyeing process has been carried out.

In the example 3 wherein the PVA layer can be dyed successfully even with iodine concentration of 0.12 to 0.25 wt % in the dyeing solution, variety of different dyed laminates have been produced with a constant immersion time of the stretched laminate in the dyeing solution and with different iodine concentrations and different potassium iodide concentrations in the dyeing solution in the range described with respect to the example 1, by controlling the amount of the impregnated iodine so that the polarizing films provided by the PVA layers in the final products have different values of single transmittance and different polarization rates, with the values of the single layer transmittance in the range of 40 to 44%.

Example 4

In the example 4, an optical film laminate has been produced through a manufacturing process where insolubilizing process in the example 3 and cross-linking process in the example 2 have additionally incorporated in the manufacturing process in the example 1. Firstly, a laminate has been provided by forming a 7 μm-thick PVA layer on a crystallizable PET substrate, then, the laminate including the 7 μm-thick PVA layer has been subjected to an end-free uniaxial in-air stretching to attain a stretching ratio of 1.8, to thereby form a stretched laminate.

In the example 4, as in the example 3, the formed stretched laminate has been immersed in a boric acid solution at a solution temperature of 30° C. for 30 seconds to have the PVA layer in the stretched laminate insolubilized with PVA molecules in an oriented state. In the example 4, the stretched laminate comprising the insolubilized PVA layer has further been immersed, as in the example 3, in a dyeing solution containing iodine and potassium iodide at a solution temperature of 30° C. to form a dyed laminate including a PVA layer having iodine impregnated therein.

In the example 4, as in the example 2, the dyed laminate thus formed has been immersed in a boric acid solution at a solution temperature of 40° C. for 60 seconds to have the PVA molecules cross-linked in the PVA layer in which iodine is impregnated. In the example 4, the dyed laminate including the cross-linked PVA layer has further been immersed in an in-boric acid solution stretching pool at a solution temperature of 75° C., which is higher than the stretching temperature of 65° C. in the example 1, to stretch the laminate to attain a stretching ratio of 3.3 as in the example 2, to thereby form an optical film laminate. Each of the cleaning, drying and laminating/transferring processes in the example 4 has been the same as that in the examples 1 to 3.

In the example 4, as in the example 3, the PVA layer has not been dissolved even at the iodine concentration in the range of 0.12 to 0.25 wt %. In the example 4, various dyed laminates have been produced with a constant immersion time of the stretched laminate in the dyeing solution and with various iodine concentrations and potassium iodide concentrations in the dyeing solution in the range described with respect to the example 1, by controlling the amount of the impregnated iodine so that the polarizing films provided by the PVA layers have respectively different values of single layer transmittance and different polarization rates with the range of single layer being in the range of 40 to 44%.

As above, in the example 4, a laminate has first been produced by forming a 7 μm-thick PVA layer on a crystallizable PET substrate, then, subjecting the laminate including the 7 μm-thick PVA layer to an end-free uniaxial stretching in a preliminary in-air stretching process, to attain a stretching ratio of 1.8, to thereby form a stretched laminate. The stretched laminate thus formed has been immersed in a boric acid solution at a solution temperature of 30° C. for 30 seconds to have the PVA layer included in the stretched laminate insolubilized with PVA molecules in an oriented state. The stretched laminate including the insolubilized PVA layer has further been immersed in a dyeing solution containing iodine and potassium iodide at a solution temperature of 30° C. to form a dyed laminate including a PVA layer having iodine impregnated therein. The dyed laminate has been immersed in boric acid solution at a solution temperature of 40° C. for 60 seconds to have PVA molecules cross-linked in the PVA layer having iodine impregnated therein. The dyed laminate including the cross-linked PVA layer has further been immersed for 5 to 10 seconds in an in-boric acid solution stretching pool containing iodine and potassium iodide at a solution temperature of 75° C., then has been processed in an end-free uniaxial stretching to attain a stretching ratio of 3.3, to thereby form an optical film laminate.

In the example 4, because of the 2-stage stretching process consisting of a preliminary in-air stretching and an in-boric-acid-solution stretching together with the pre-processing consisting of an insolubilizing process prior to immersion in dyeing pool and a cross-linking process prior to the in-boric-acid-solution stretching, it has become possible to manufacture in a stable manner an optical film laminate including a 3 μm-thick PVA layer having iodine impregnated therein through a dyeing process and providing a polarizing film having PVA molecules oriented with a high-order orientation in one direction in the form of a polyiodide ion complex in the PVA layer formed on the crystallizable PET substrate.

Example 5

In the example 5, an optical film laminate has been manufactured under the same conditions as in the example 4 except the thickness of the PVA layer formed on the crystallizable PET substrate. In the example 4, the thickness of the PVA layer has been 7 μm before stretching, and that of the PVA layer in the finally manufactured optical film laminate has been 3 μm, whereas in the example 5, the thickness of the PVA layer before stretching has been 12 μm, and that of the PVA layer in the finally manufactured optical film laminate has been 5 μm.

Example 6

In the example 6, an optical film laminate has been manufactured under the same conditions as in the example 4 except that the stretching ratio for each of the preliminary in-air stretching and the in-boric-acid-solution stretching has been varied so that the total stretching ratio became 6.0 or a value close to 6.0. In the example 4, the stretching ratios for the preliminary in-air stretching and the in-boric acid solution stretching have respectively been 1.8 and 3.3, whereas in the example 7, the respective ones of the ratios have been 1.5 and 4.0.

Example 7

In the example 7, an optical film laminate has been manufactured under the same conditions as in the example 4 except that the stretching ratio for each of the preliminary in-air stretching and the in-boric acid solution stretching was varied so that the total stretching ratio has become 6.0. In the example 7, the stretching ratios for the preliminary in-air stretching and the in-boric-acid-solution stretching have been 2.5 and 2.4, respectively.

Example 8

In the example 8, an optical film laminate has been manufactured under the same conditions as in the example 4 except a difference in the stretching temperature. In the example 8, the stretching temperature for the preliminary in-air stretching has been 95° C., whereas in the example 4, the corresponding temperature has been 110° C.

Example 9

In the example 9, an optical film laminate has been manufactured under the same conditions as in the example 4 except a difference in the stretching temperature. In the example 9, the stretching temperature for the preliminary in-air stretching has been 105° C., whereas in the example 4, the corresponding temperature has been 110° C.

Example 10

In the example 10, an optical film laminate has been manufactured under the same conditions as in the example 4 except that a different value has been adopted as the stretching ratio for the in-boric acid solution stretching. In the example 4, the stretching ratio for the preliminary in-air stretching and that for the in-boric-acid-solution stretching have respectively been 1.8 and 3.3, but in the example 10, only the stretching ratio for the in-boric-acid-solution stretching has been changed to 2.8. In the example 10, the total stretching ratio has therefore become about 5.0 (5.04 to be accurate), whereas in the example 4, the corresponding ratio has been about 6.0 (5.94 to be accurate).

Example 11

In the example 11, an optical film laminate has been manufactured under the same conditions as in the example 4 except that a different value has been adopted as the stretching ratio for the in-boric-acid-solution stretching. In the example 4, the stretching ratio for the preliminary in-air stretching and that for the in-boric acid solution stretching have respectively been 1.8 and 3.3, but in the example 11, only the stretching ratio for the in-boric-acid-solution stretching has been changed to 3.1. In the example 11, the total stretching ratio has therefore become about 5.5 (5.58 to be accurate), whereas in the example 4, it has been about 6.0 (5.94 to be accurate).

Example 12

In the example 12, an optical film laminate has been manufactured under the same conditions as in the example 4 except that a different value has been adopted as the stretching ratio for the in-boric-acid-solution stretching. In the example 4, the stretching ratio for the preliminary in-air stretching and that for the in-boric acid solution stretching have respectively been 1.8 and 3.3, but in the example 12, only the stretching ratio for the in-boric-acid-solution stretching has been changed to 3.6. In the example 12, the total stretching ratio has therefore become about 6.5 (6.48 to be accurate), whereas in the example 4, the corresponding value has been about 6.0 (5.94 to be accurate).

Example 13

In the example 13, an optical film laminate has been manufactured under the same conditions as in the example 4 except the stretching process for the preliminary in-air stretching. In the example 13, the laminate has been subjected to an end-fixed uniaxial stretching in the preliminary in-air stretching to attain the stretching ratio of 1.8, whereas in the example 4, an end-free uniaxial stretching has been adopted in the preliminary in-air stretching to attain the stretching ratio of 1.8.

Example 14

In the example 14, an optical film laminate has been manufactured under the same conditions as in the example 13 except that a different value has been adopted as the stretching ratio for the in-boric-acid-solution stretching. In the example 13, the stretching ratio for the preliminary in-air stretching and that for the in-boric acid solution stretching have respectively been 1.8 and 3.3, but in the example 14, only the stretching ratio for the in-boric acid solution stretching has been changed to 3.9. In the example 14, the total stretching ratio has therefore become about 7.0 (7.02 to be accurate), whereas in the example 13, the corresponding value has been about 6.0 (5.94 to be accurate).

Example 15

In the example 15, an optical film laminate has been manufactured under the same conditions as in the example 13 except that a different value has been adopted as the stretching ratio for the in-boric-acid-solution stretching. In the example 13, the stretching ratio for the preliminary in-air stretching and that for the in-boric acid solution stretching have respectively been 1.8 and 3.3, but in the example 15, only the stretching ratio for the in-boric-acid-solution stretching has been changed to 4.4. In the example 14, the total stretching ratio has therefore become about 8.0 (7.92 to be accurate), whereas in the example 13, the corresponding value has been about 6.0 (5.94 to be accurate).

(Comparative Test Sample)

In the comparative test sample, a laminate has been produced by forming a 7 μm-thick PVA layer on a PET substrate by applying PVA solution on a 200 μm-thick PET substrate and drying the same. Then, the laminate comprising the 7 μm-thick PVA layer has been immersed in a dyeing solution containing iodine and potassium iodide at a solution temperature of 30° C. to form a dyed laminate including a PVA layer having iodine impregnated therein. Describing in more detail, the dyed laminate has been formed by immersing the laminate in a dyeing solution containing 0.30 wt % of iodine and 2.1 wt % of potassium iodide at a solution temperature of 30° C. for an appropriate time so that a polarizing film provided by the PVA layer possesses a single layer transmission of 40 to 44%. Then, the dyed laminate including the PVA layer having iodine impregnated therein has been subjected to an end-free uniaxial stretching in a boric acid solution at a stretching temperature of 60° C. to attain a stretching ratio of 5.0. Thus, there have been produced through different immersion time periods various optical laminates each including such 3 μm-thick PVA layer integrally stretched with the PET resin substrate.

(Reference Test Sample 1)

In the reference test sample 1, a laminate has been produced by forming a 7 μm-thick PVA layer on a crystallizable PET substrate by using a continuous web of amorphous polyethylene terephthalate film (hereinafter referred as crystallizable PET) as resin substrate and by applying PVA solution on a 200 μm-thick crystallizable PET substrate and drying the same. Glass transition temperature of the crystallizable PET is 80° C. Then, the formed laminate has been subjected to an end-free uniaxial stretching in an in-air stretching process at a stretching temperature of 110° C. to attain a stretching ratio of 4.0 to thereby form a stretched laminate. Through the stretching, the PVA layer in the stretched laminate has been converted into a 3 μm-thick PVA layer having PVA molecules oriented therein. In the reference test sample 1, it has not been possible to stretch the laminate to a stretching ratio beyond 4.0 in the in-air stretching at a stretching temperature of 110° C.

It is to be noted that the phrase "the in-air stretching at a stretching temperature of 110° C." in this reference test sample 1 is a single stretching, but not the preliminary in-air stretching for the 2-stage stretching. This is also applied to the cases for reference test samples 2 and 3.

The stretched laminate has then been dyed to form a dyed laminate which includes iodine impregnated in the 3.5 μm-thick PVA layer which has PVA molecules in an oriented state. Describing more specifically, the dyed laminate has been formed by immersing the stretched laminate in a dyeing solution containing iodine and potassium iodide at a solution temperature of 30° C. for an appropriate time to have iodine impregnated therein so that the polarizing film provided by the PVA layer possesses a single layer transmission of 40 to 44%. The amount of impregnated iodine has been changed to produce variously different dyed laminates having different values of single layer transmission and those of polarization rate.

Then, the dyed laminated has been subjected to a cross-linking process, particularly, by immersing the dyed laminate in a boric acid solution containing 3 parts in weight of boric acid with respect to 100 parts in weight of water and 3 parts in weight of potassium iodide with respect to 100 parts in weight of water at a solution temperature of 40° C. for 60 seconds. The cross-linked dyed laminate in the reference test sample 1 corresponds to the optical film laminate in accordance with the example 4. Thus, the cleaning, drying and laminating and/or transferring processes in the reference test sample 1 have been to the same as those in the example 4.

(Reference Test Sample 2)

In the reference test sample 2, a laminate has been produced by forming a 7 μm-thick PVA layer on a 200 μm-thick crystallizable PET substrate as in the reference test sample 1. Then, the formed laminate has been subjected to an end-free uniaxial stretching through an in-air stretching process at a stretching temperature set at 100° C. to attain a stretching ratio of 4.5 to thereby form a stretched laminate. Through the stretching process, the PVA layer has been converted in the stretched laminate into a 3.3 μm-thick PVA layer having PVA molecules oriented therein. In the reference test sample 2, it has not been possible to stretch the laminate beyond the stretching ratio of 4.5 in the in-air stretching under a stretching temperature of 100° C.

Then, a dyed laminate has been formed by immersing the stretched laminate in a dyeing solution containing iodine and potassium iodide at a solution temperature of 30° C. for an appropriate time to have iodine impregnated therein so that the polarizing film provided by the PVA layer possesses a single layer transmission of 40 to 44%. In the reference test sample 2, the amount of iodine impregnated in the PVA layer has been controlled as in the reference test sample 1 to form various different dyed laminates having different values of the single layer transmission and those of polarization rate.

Then, the dyed laminated has been subjected to a cross-linking process, particularly, by immersing the dyed laminate in a boric acid solution containing 3 parts in weight of boric acid with respect to 100 parts in weight of water and 3 parts in weight of potassium iodide with respect to 100 parts in weight of water at a solution temperature of 40° C. for 60 seconds. The cross-linked dyed laminate in the reference test sample 1 corresponds to the optical film laminate in accordance with the example 4. Thus, the cleaning, drying and laminating and/or transferring processes in the reference test sample 2 have been similar to those in the example 4.

(Reference Test Sample 3)

In the reference test sample 3, as in the reference test samples 1 and 2, a laminate has been produced by forming a 7 μm-thick PVA layer on a crystallizable PET substrate by applying PVA solution on a 200 μm-thick crystallizable PET substrate. Then, the formed laminate has been immersed in a dyeing solution containing iodine and potassium iodide at a solution temperature of 30° C. for an appropriate time to have iodine impregnated therein so that the polarizing film provided by the PVA layer possesses a single layer transmission of 40 to 44% and various different dyed laminates have been produced with different immersion time.

Subsequently, thus formed dyed laminates have been subjected to an end-free uniaxial stretching through an in-air stretching process at a stretching temperature set at 90° C. to a stretching ratio of 4.5 to thereby form a stretched laminate including the PVA layer having iodine impregnated therein in such an amount that the PVA layer provides a polarizing film. Through the stretching procedure, the PVA layer having iodine impregnated therein has been converted in the stretched laminate formed from the dyed laminate, to a 3.3 μm-thick PVA layer having PVA molecules impregnated therein. In the reference test sample 3, it has not been possible to stretch the laminate beyond the stretching ratio of 4.5 in the in-air stretching at a stretching temperature of 90° C.

(Measurement Process)
(Thickness Measurement)

Thickness of each of the crystallizable PET substrate and the PVA layer has been measured using a digital micrometer (KC-351C from Anritsu Electric Co., Ltd.).

(Measurement of Transmittance and Polarization Rate)

Each of the single layer transmittance T, the parallel transmittance Tp and the cross transmittance Tc of the polarizing film has been measured using a UV-visible spectrophotometer (V7100 from JASCO Corporation). The values of T, Tp and Tc are presented in terms of Y values measured according to JIS Z8701 (visual field of 2 degrees, C light source) and corrected for spectral luminous efficacy.

The polarization rate P has been calculated in accordance with the following equation using the above value of transmittance.

polarization rate $P = \{(Tp-Tc)/(Tp+Tc)\}^{1/2} \times 100$ (Evaluation of Orientation Function of PVA)

A Fourier Transform Infrared Spectrometer (FT-IR) (SPECTRUM 2000 from PerkinElmer, Inc.) has been used as the measurement device. Attenuated total reflection (ATR) of polarizing light was measured to evaluate the surface of a vinyl alcohol resin layer. Orientation function has been calculated according to the following procedures. Measurements have been made on the polarizing light in the directions of 0° and 90° with respect to the stretching direction. Absorption intensity of the obtained spectral at 2941 cm$^{-1}$ has been used to calculate the orientation function according to the Equation 4 (non-patent document 1) shown below. For the intensity I indicated below, with a value at 3330 cm$^{-1}$ taken as a reference peak, a value of 2941 cm$^{-1}$/3330 cm$^{-1}$ has been used. The condition of f=1 indicates a complete or perfect orientation, whereas the condition f=0 indicates a random orientation. The peak observed at 2941 cm-1 is considered as indicating the absorption induced by vibration of the main chain of PVA (—CH2-).

$$f = (3\langle\cos^2\theta\rangle - 1)/2 \quad \text{(Equation 4)}$$
$$= [(R-1)(R_0+2)]/[(R+2)(R_0-1)]$$
$$= (1-D)/[c(2D+1)]$$
$$= [-2 \times (1-D)]/(2D+1)$$

where,
$c = (3\cos^2\beta - 1)/2$,
$\beta = 90°$
$\theta$: angle of a molecular chain with respect to the stretching direction, $\beta$: angle of a transition dipole moment with respect to a molecular chain
$R_0 = 2\cot^2\beta$
$1/R = D = (I\perp)/(I//)$ (the more the PVA is molecularly oriented, the greater the value of D),
$I\perp$ = absorption intensity measured when polarizing light incidents perpendicular to stretching direction,
$I//$ = absorption intensity measured when polarizing light incidents parallel to stretching direction.

(Evaluation of Extent of Crystallization of PVA)

A Fourier Transform Infrared Spectrometer (FT-IR) (SPECTRUM 2000 from PerkinElmer, Inc.) has been used as the measurement device. Attenuated total reflection (ATR) of polarizing light has been measured to evaluate the surface of the vinyl alcohol resin layer. Extent of crystallization has been calculated according to the following procedures. Measurements have been made on the polarizing light in the directions of 0° and 90° with respect to the stretching direction. Intensities of the obtained spectral at 1141 cm$^{-1}$ and at 1440 cm$^{-1}$ have been used to calculate the extent of crystallization. Calculations have been made using the intensity at 1141 cm$^{-1}$ as relative to the amount of crystallized part, and the value at 1440 cm$^{-1}$ as a reference peak to determine a crystallization index with the following equation (Equation 6). Further, a sample of PVA with a known extent of crystallization has been used in advance to create crystallization index and a calibration curve, and the calibration curve has been used to calculate the extent of crystallization from the crystallization index (Equation 5).

Extent of crystallization = 63.8 × (crystallization index) − 44.8 (Equation 5)

Crystallization index = $((I(1141\ \text{cm}-1)0° + 2 \times I(1141\ \text{cm}-1)90°)90°)/3)/((I(1440\ \text{cm}^{-1})0° + 2 \times I(1440\ \text{cm}^{-1})90°)/3)$ (Equation 6)

where,
$I(1141\ \text{cm}^{-1})\ 0°$ = intensity at 1141 cm$^{-1}$ when polarizing light incidents parallel to stretching direction,
$I(1141\ \text{cm}^{-1})\ 90°$ = intensity at 1141 cm$^{-1}$ when polarizing light incidents perpendicular to stretching direction,
$I(1440\ \text{cm}^{-1})\ 0°$ = intensity at 1440 cm$^{-1}$ when polarizing light incidents parallel to stretching direction,
$I(1440\ \text{cm}^{-1})\ 90°$ = intensity at 1440 cm$^{-1}$ when polarizing light incidents perpendicular to stretching direction.

EXPLANATION OF NUMERICAL SYMBOLS

1: crystallizable PET substrate
2: PVA type resin layer
3: Polarizing film
4: Optically functional film
5: Second optically functional film
7: Laminate comprising PVA type resin layer
8: Stretched laminate
8': Roll of stretched laminate
8": Insolubilized stretched laminate
9: Dyed laminate
9': Cross-linked dyed laminate
10: Optical film laminate
11: Optically functional film laminate
12: Optical film laminate (pattern 1)
13: Optical film laminate (pattern 2)
14: Optically functional film laminate (pattern 3)
15: Optically functional film laminate (pattern 4)
16: Adhesive agent (Adhesive agent layer)
17: Separator
18: Bonding agent (Bonding agent layer)

20: Laminate manufacturing apparatus
21: Coating unit
22: Drying unit
23: Surface modifying apparatus
30: Preliminary in-air stretching apparatus
31: Stretching unit
32: Winding apparatus
33: Oven
40: Dying apparatus
41: Dying solution
42: Dying pool
43: Feeding apparatus
50: In-boric-acid-solution stretching apparatus in a boric acid solution
51: Boric acid solution
52: Boric acid solution pool
53: Stretching unit
60: Insolubilizing apparatus
61: Boric acid insolubilizing solution
70: Cross-linking apparatus
71: Boric acid cross-linking solution
80: Cleaning apparatus
81: Cleaning solution
90: Drying apparatus
91: Winding apparatus
100: Laminating/transferring apparatus
101: Feeding/laminating apparatus
102: Winding/transferring apparatus
200: Display panel for IPS-type liquid-crystal television
201: Surface treatment layer
202: IPS liquid crystal cell
300: Display panel for VA-type liquid-crystal television
301: Biaxial phase difference film (nx>ny>nz)
302: VA liquid-crystal cell
400: Display panel for IPS-type liquid-crystal television
401: Triacetylcellulose (TAC) film
402: IPS liquid-crystal cell
500: Display panel for IPS-type liquid-crystal television
501: Biaxial phase difference film (nx>nz>ny)
502: IPS liquid-crystal cell
600: Organic electroluminescence display panel
601: Acrylic resin film
602: λ/4 phase difference film
603: Organic electroluminescence panel
(A): Laminate manufacturing process
(B): Preliminary in-air stretching process
(C): Dying process
(D): In-boric acid solution stretching process
(E): First insolubilization process
(F): Cross-linking process including second insolubilization
(G): Cleaning process
(H): Drying process
(I): Laminating and transferring process

The invention claimed is:

1. A method for manufacturing an optical film laminate in which a polarizing film made of a polyvinyl alcohol type resin having a dichroic material impregnated therein in a molecularly oriented state is formed on a substrate made of a crystallizable ester type thermoplastic resin in the form of a continuous web, comprising steps of:
forming a stretched laminate comprising a stretched intermediate made of a molecularly oriented polyvinyl alcohol type resin by subjecting a laminate comprising a substrate made of a crystallizable ester type thermoplastic resin in an amorphous state and a polyvinyl alcohol type resin layer formed on the substrate to a preliminary in-air stretching under a temperature in which the amorphous state of the substrate can be maintained;
forming a dyed laminate including a dyed intermediate comprising the polyvinyl alcohol type resin layer having a dichroic material impregnated therein in a molecularly oriented state by impregnating the dichroic material in the stretched laminate; and
forming the optical film laminate including a polarizing film which is made of the polyvinyl alcohol type resin having the dichroic material impregnated therein in a molecularly oriented state and has a thickness of 10 μm or less, by stretching the dyed laminate in a boric acid solution, wherein the polarizing film having optical properties which satisfy conditions represented by the formulae:

$P > -(10^{0.929T-42.4}-1) \times 100$ (where $T < 42.3$); and $P \geq 99.9$ (where $T \geq 42.3$), where T represents a single layer transmittance, and P represents a polarization rate.

2. The method as defined in claim 1, wherein a stretching ratio of the preliminary in-air stretching is 3.5 or less.

3. The method as defined in claim 1, wherein the preliminary in-air stretching is performed at a temperature greater than a glass transition temperature of the polyvinyl alcohol type resin.

4. The method as defined in claim 1, wherein the stretching temperature of the preliminary in-air stretching is in a range of 80° C. to 120° C.

5. The method as defined in claim 1, wherein the dyed laminate is formed by immersing the stretched laminate in a dyeing solution comprised of the dichroic material.

6. The method as defined in claim 5, wherein the dyeing solution contains water as a solvent and iodine with a concentration in a range of 0.12 to 0.30 weight %.

7. The method as defined in claim 1, which further comprises a first insolubilization step of applying insolubilization to the stretched intermediate included in the stretched laminate before immersing the stretched laminate in the dyeing solution comprised of the dichroic material.

8. The method as defined in claim 7, wherein the first insolubilization step includes immersing the stretched laminate in a boric acid solution having a solution temperature of no more than 40° C.

9. The method as defined in claim 1, wherein the dyed laminate is stretched in the boric acid solution to allow the polarizing film to have a thickness of 10 μm or less.

10. The method as defined in claim 1, which further comprises an insolubilization step of applying insolubilization to the dyed laminate before stretching the dyed laminate in the boric acid solution.

11. The method as defined in claim 1, wherein the dyed laminate is subjected to the preliminary in-air stretching and the in-boric-acid-solution stretching to attain a total stretching ratio of 5.0 or more.

12. The method as defined in claim 1, wherein a solution temperature of the boric acid solution for the in-boric-acid-solution stretching is 60° C. or more.

13. The method as defined in claim 1, wherein, when the preliminary in-air stretching is performed in an end-free uniaxial stretching, a total stretching ratio for the dyed laminate is in a range of 5.0 to 7.5.

14. The method as defined in claim 1, wherein, when the preliminary in-air stretching is performed in an end-fixed uniaxial stretching, a total stretching ratio for the dyed laminate is in a range of 5.0 to 8.5.

15. The method as defined in claim 1, which further comprises a step of cleaning the optical film laminate including the polarizing film which is made of the polyvinyl alcohol type resin having the dichroic material impregnated therein in the molecularly oriented state and has a thickness of 10 μm or less, by a solution containing iodide salt having a solution temperature of no more than 40° C.

16. The method as defined in claim 1, which further comprises a step of attaching a separator film through an adhesive agent to a surface of the polarizing film opposite to the surface which is attached to the substrate included in the optical film laminate.

17. The method as defined in claim 1, which further comprises a step of attaching an optically functional film through a bonding agent to a surface of the polarizing film opposite to the surface which is attached to the substrate included in the optical film laminate.

18. The method as defined in claim 17, which further comprises a step of attaching a separator film through an adhesive agent to a surface of the optically functional film opposite to the surface which is attached to the polarizing film.

19. A method for manufacturing an optical film laminate in which a polarizing film made of a polyvinyl alcohol type resin having a dichroic material impregnated therein in a molecularly oriented state is formed on a substrate made of a crystallizable ester type thermoplastic resin in the form of a continuous web, comprising steps of:
  forming a stretched laminate comprising a stretched intermediate made of a molecularly oriented polyvinyl alcohol type resin by subjecting a laminate comprising a substrate made of a crystallizable ester type thermoplastic resin in an amorphous state and a polyvinyl alcohol type resin layer formed on the substrate to a preliminary in-air stretching under a temperature in which the amorphous state of the substrate can be maintained;
  forming a dyed laminate including a dyed intermediate comprising the polyvinyl alcohol type resin layer having a dichroic material impregnated therein in a molecularly oriented state by impregnating the dichroic material in the stretched laminate;
  forming the optical film laminate including a polarizing film which is made of the polyvinyl alcohol type resin having the dichroic material impregnated therein in a molecularly oriented state and has a thickness of 10 μm or less, by stretching the dyed laminate in a boric acid solution; and
  a first insolubilization step of applying insolubilization to the stretched intermediate included in the stretched laminate before immersing the stretched laminate in the dyeing solution comprised of the dichroic material.

20. The method as defined in claim 19, wherein the polarizing film having optical properties which satisfy conditions represented by the formulae:

$P > -(10^{0.929T-42.4}-1) \times 100$ (where $T < 42.3$); and $P \geq 99.9$ (where $T \geq 42.3$), where T represents a single layer transmittance, and P represents a polarization rate.

21. The method as defined in claim 19, wherein a stretching ratio of the preliminary in-air stretching is 3.5 or less.

22. The method as defined in claim 19, wherein the dyed laminate is formed by immersing the stretched laminate in a dyeing solution comprised of the dichroic material, the dyeing solution contains water as a solvent and iodine with a concentration in a range of 0.12 to 0.30 weight %.

23. The method as defined in claim 19, wherein the first insolubilization step includes immersing the stretched laminate in a boric acid solution having a solution temperature of no more than 40° C.

24. The method as defined in claim 19, wherein the dyed laminate is stretched in the boric acid solution to allow the polarizing film to have a thickness of 10 μm or less.

25. The method as defined in claim 19, which further comprises a second insolubilization step of applying insolubilization to the dyed laminate before stretching the dyed laminate in the boric acid solution.

26. The method as defined in claim 19, wherein the dyed laminate is subjected to the preliminary in-air stretching and the in-boric-acid-solution stretching to attain a total stretching ratio of 5.0 or more.

27. The method as defined in claim 19, wherein, when the preliminary in-air stretching is performed in an end-fixed uniaxial stretching, a total stretching ratio for the dyed laminate is in a range of 5.0 to 8.5.

28. The method as defined in claim 19, which further comprises a step of cleaning the optical film laminate including the polarizing film which is made of the polyvinyl alcohol type resin having the dichroic material impregnated therein in the molecularly oriented state and has a thickness of 10 μm or less, by a solution containing iodide salt having a solution temperature of no more than 40° C.

29. The method as defined in claim 19, which further comprises a step of attaching an optically functional film through a bonding agent to a surface of the polarizing film opposite to the surface which is attached to the substrate included in the optical film laminate.

* * * * *